US012782414B2

(12) United States Patent
Chen et al.

(10) Patent No.: US 12,782,414 B2
(45) Date of Patent: Nov. 3, 2026

(54) RESISTIVE-NETWORK CELL REGION, BUILT-IN SELF-TESTER INCLUDING SAME, SEMICONDUCTOR DEVICE INCLUDING SAME, METHOD OF OPERATING SAME AND METHOD OF MANUFACTURING SAME

(71) Applicants: TAIWAN SEMICONDUCTOR MANUFACTURING COMPANY, LTD, Hsinchu (TW); TSMC CHINA COMPANY, LIMITED, Shanghai (CN)

(72) Inventors: Huan-Neng Chen, Hsinchu (TW); Bo-Ting Chen, Hisnchu (TW); Shao-Yu Li, Hsinchu (TW); Chung-Lun Hong, Hsinchu (TW); Cun Cun Chen, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 432 days.

(21) Appl. No.: 18/358,239

(22) Filed: Jul. 25, 2023

(65) Prior Publication Data

US 2025/0012844 A1 Jan. 9, 2025

(30) Foreign Application Priority Data

Jul. 7, 2023 (CN) ........................ 202321785790.X

(51) Int. Cl.
*G01R 31/26* (2020.01)
*H03K 17/687* (2006.01)

(52) U.S. Cl.
CPC ..... *G01R 31/2621* (2013.01); *H03K 17/6871* (2013.01)

(58) Field of Classification Search
CPC .......... G01R 31/31724; G01R 31/2621; H03K 17/6871
See application file for complete search history.

(56) References Cited

U.S. PATENT DOCUMENTS 10,823,781 B1 11/2020 Schat
2004/0249608 A1 12/2004 Chung
(Continued)

FOREIGN PATENT DOCUMENTS

CN 103424686 12/2013
TW 202223426 6/2022

*Primary Examiner* — Christopher E Mahoney
(74) *Attorney, Agent, or Firm* — Hauptman Ham, LLP

(57) ABSTRACT

A built-in self-tester (BIST) of a semiconductor device including: an input/output (I/O) circuit including an output buffer and an input buffer, an output of the output buffer being coupled at an I/O terminal to an input of the input buffer, the I/O terminal being configured to receive or provide an external I/O signal; one or more resistive-network cell regions arranged to affect a reference current received at the I/O terminal; and a switching arrangement configured to selectively couple the one or more resistive-network cell regions alternatively to a first reference voltage during a first phase or a second reference voltage during a second phase, the switching arrangement being further configured to determine electrostatic discharge (ESD) damage to metal-oxide-semiconductor (MOS) transistors included in the semiconductor device based on (1) phase and (2) an output signal of the input buffer.

20 Claims, 36 Drawing Sheets

(56) References Cited

U.S. PATENT DOCUMENTS

| | | | | |
|---|---|---|---|---|
| 2021/0156911 | A1* | 5/2021 | Motika .......... | G01R 31/318385 |
| 2023/0038377 | A1 | 2/2023 | Chung et al. | |

* cited by examiner

| PMOS soft-failures? | | |
| --- | --- | --- |
| I_PLk ≤ I_ref | CSI = 0 | No |
| I_ref < I_PLk | CSI = 1 | Yes |

RESISTIVE-NETWORK CELL REGION, BUILT-IN SELF-TESTER INCLUDING SAME, SEMICONDUCTOR DEVICE INCLUDING SAME, METHOD OF OPERATING SAME AND METHOD OF MANUFACTURING SAME

BACKGROUND

An integrated circuit (IC) is tested for proper functionality at various times in the life cycle of the IC. Often, such testing is based on providing an input test pattern of logical ones and logical zeros to the IC and then comparing an actual output test pattern against an expected/ideal output test pattern.

During fabrication, before a wafer containing ICs is subjected to die separation, a device referred to as a wafer prober is used to test each IC on the wafer for functional defects. To exchange test patterns, the wafer prober extends a set of microscopic probes into contact with an IC on the wafer, i.e., the wafer prober communicates by wire with the IC (as contrasted with wireless communication).

A built-in self-tester (BIST) is a device by which an IC tests itself. Examples include a first type of BIST for a memory circuit, a second type of BIST for a logic circuit that leverages internal scan chains of an IC, or the like.

ICs are vulnerable to electrostatic discharge (ESD) damage. Typical ESD damages to metal-oxide-semiconductor field-effect transistors (MOSFETs) include junction damage, gate oxide damage and metallization burnout (instances of an open circuit condition), or the like. Junction damage typically manifests as either a hard failure or a soft failure. A hard failure corresponds to a substantial increase in leakage current such that the MOSFET is no longer functional. A soft failure corresponds to a slight increase in leakage current such that the MOSFET remains functional. Often, metallization burnout is a secondary (and sometimes latent) consequence of junction damage and/or gate oxide damage. As semiconductor process technology nodes advance, components of the resulting ICs become progressively smaller, ICs become increasingly more vulnerable to ESD damage.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1A:
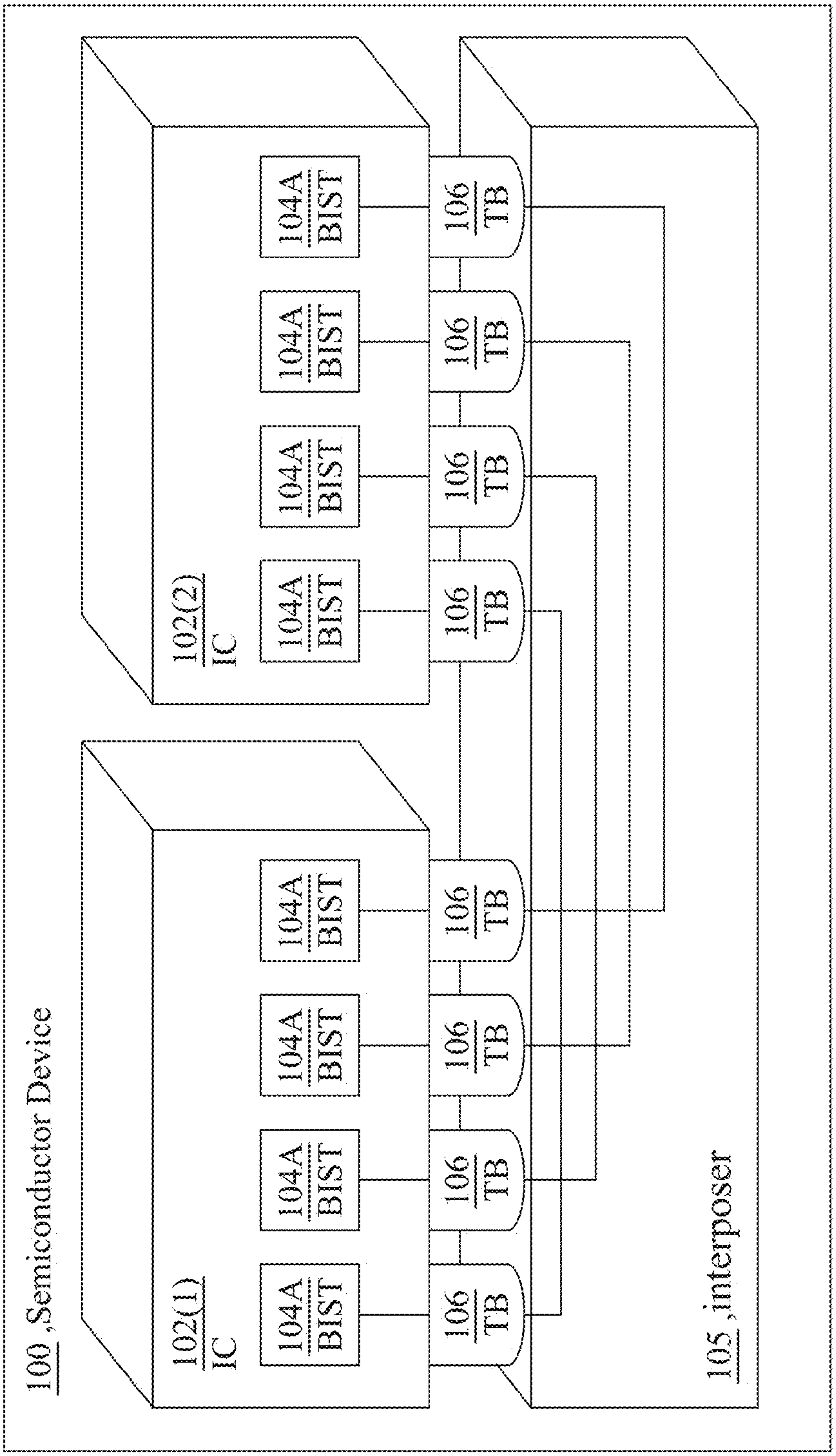
FIG. 1A is a block diagram of a semiconductor device, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, are used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a built-in self-tester (BIST) of a semiconductor device includes: an input/output (I/O) circuit, one or more resistive-network cell regions and a switching arrangement. The I/O circuit includes an output buffer and an input buffer, an output of the output buffer being coupled at an I/O terminal to an input of the input buffer. The I/O terminal is configured to receive or provide an external I/O signal; The one or more resistive-network cell regions are arranged to affect a reference current received at the I/O terminal. The one or more resistive-network cell regions are coupled together to represent a resistor having first and second terminals. The switching arrangement is configured to selectively couple the one or more resistive-network cell regions alternatively to a first reference voltage (e.g., VDD) during a first phase or a second reference voltage (e.g., VSS) during a second phase, the switching arrangement being further configured to determine electrostatic discharge (ESD) damage to metal-oxide-semiconductor (MOS) transistors included in the semiconductor device based on (1) phase and (2) an output signal of the input buffer.

In some embodiments, the first terminal of the resistor is coupled to the I/O terminal, and the second terminal of the resistor is coupled to first terminals of each of first and second switches. A second terminal of the first switch is coupled to VDD. A second terminal of the second switch is coupled to VSS. The switching arrangement is further configured to (A) selectively open the first switch and close the second switch or (B) selectively open the second switch and close the first switch. In response to the reference current received at the I/O terminal from the one or more resistive-network cell regions being smaller than a leakage current received at the I/O terminal from negative-channel (N-type) metal-oxide-semiconductor (NMOS) transistors included in one or more of the output buffer or the input buffer, the input buffer is configured to generate a signal that is indicative of damage to the NMOS transistors included in the one or more of the output buffer or the input buffer. In response to the reference current received at the I/O terminal from the one or more resistive-network cell regions being larger than a leakage current received at the I/O terminal from positive-channel (P-type) metal-oxide-semiconductor (PMOS) transistors included in one or more of the output buffer or the input buffer, the input buffer is configured to generate a signal that is indicative of damage to the PMOS transistors included in the one or more of the output buffer or the input buffer.

In some embodiments, each resistive-network cell region includes one or more resistive-sub-networks, each resistive-sub-network having a ladder-hook shape in plan view. In some embodiments, one or more of the resistive-sub-networks includes portions of corresponding MD structures (MD-based ladder-hooks). In some embodiments, one or more of the resistive-sub-networks includes portions of corresponding gate structures (gate-based ladder-hooks).

According to another approach, a type of BIST for a logic circuit of an integrated circuit (IC) is used to detect damage cause by electrostatic discharge (ESD). As part of insight which led the present inventors to develop at least some embodiments, the inventors recognized at least the following: ESD damage that manifests as hard failures is associated with leakage currents on the order of milliamperes (mA), which is sufficient to render MOSFETs no longer functional; ESD damage that manifests as soft failures is associated with leakage currents on the order of nanoamperes (nA) to microamperes (uA), which is not sufficient to render MOSFETs no longer functional, and which is six orders of magnitude (six powers of ten) to three orders of magnitude (three powers of ten) smaller than the leakage currents associated with ESD-induced hard failures; the ESD-detection type of BIST according to the other approach can detect damage caused by ESD albeit only substantial ESD damage that manifests as hard failures; the ESD-detection type of BIST according to the other approach cannot detect insubstantial ESD damage that manifests as soft failures; ESD-induced soft failures worsen over time, eventually leading to latent defective performance of the IC, which reduces long term reliability of the particular instance of the IC and, more generally, of a large population of instances of the IC; and semiconductor process technology nodes have advanced to a level that the external metal contact terminals of an ICs and the spacing/pitch therebetween are too small to be tested via a wafer prober, e.g., for ESD-induced hard failures, much less for ESD-induced soft failures. At least some embodiments are directed to BISTs that detect leakage currents on the order of nanoamperes (nA) to microamperes (uA) and thereby detect ESD-induced soft failures; such embodiments facilitate identifying ICs that are more susceptible to ESD-induced latent defective performance. By facilitating the elimination of ICs that are more susceptible to ESD-induced latent defective performance from a larger population of ICs, such embodiments facilitate improving long term reliability of the large population.

FIG. 1A is a block diagram of a semiconductor device 100, in accordance with some embodiments.

Semiconductor device 100 includes ICs 102(1) and 102 (2), bumps 106 and an interposer structure 105. ICs 102(1) and 102(2) communicate externally, e.g., with each other, through external metal contact terminals 106 and interposer structure 105. The semiconductor process technology node corresponding to semiconductor device 100 is sufficiently advanced that metal contact terminals 106 and the spacing therebetween are too small to be tested via a wafer prober. In some embodiments, metal contact terminals 106 are referred to as bumps. In some embodiments, metal contact terminals 106 are referred to as tiny bumps (TB); in FIG. 1A, each instance of metal contact terminal 106 is labeled TB.

In FIG. 1A, each of ICs 102(1) and 102(2) includes an instance of BIST 104A (FIGS. 1B-1L) for each instance of bump 106, i.e., a 1:1 ratio. In some embodiments, ICs 102(1) and 102(2) exhibit a ratio between the instances of bump 106 and BIST 104A other than 1:1.

Figure 1B:
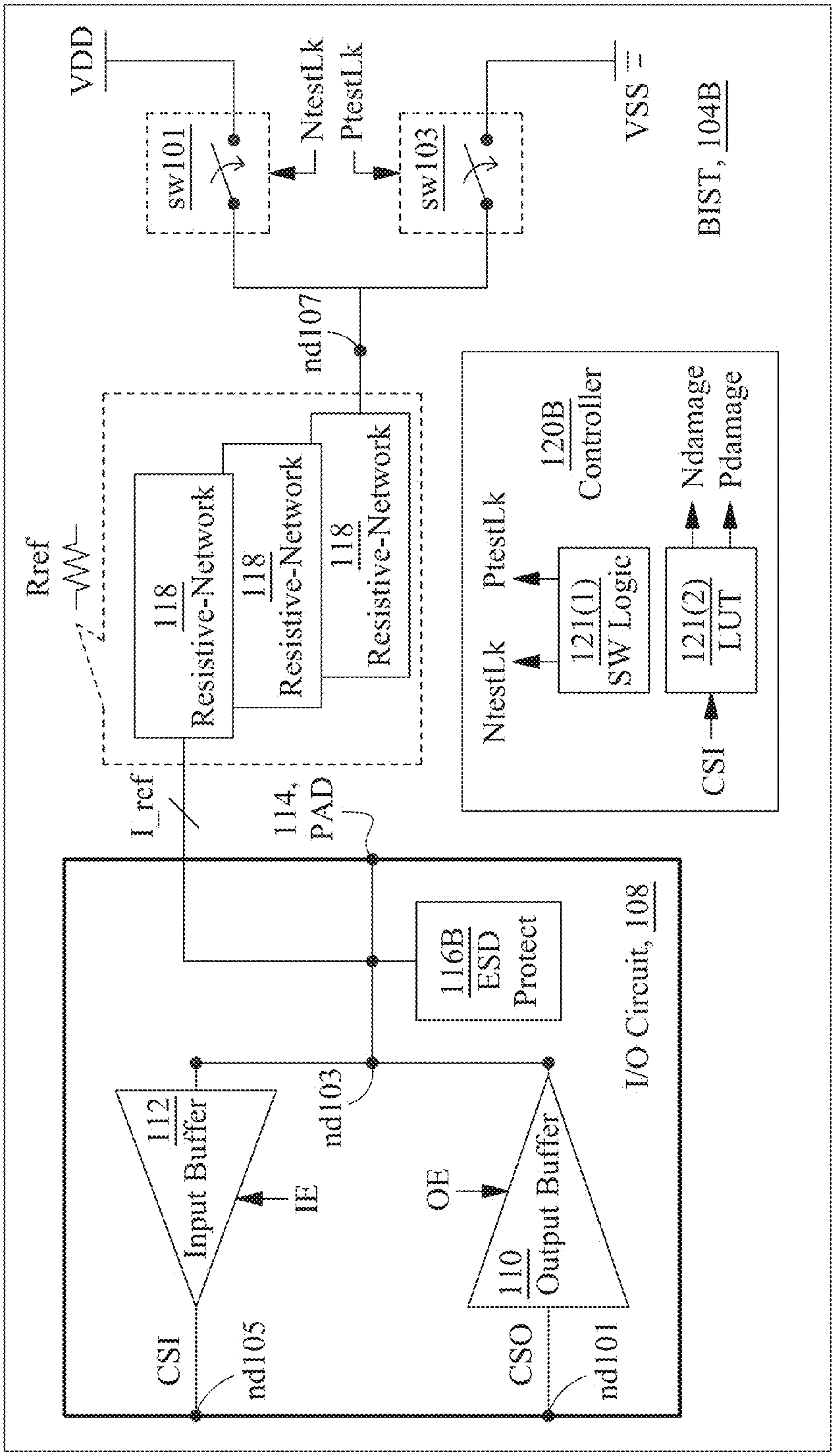
FIGS. 1B-1L are corresponding block diagrams of a BIST or components thereof, in accordance with some embodiments.
Figure 1C:
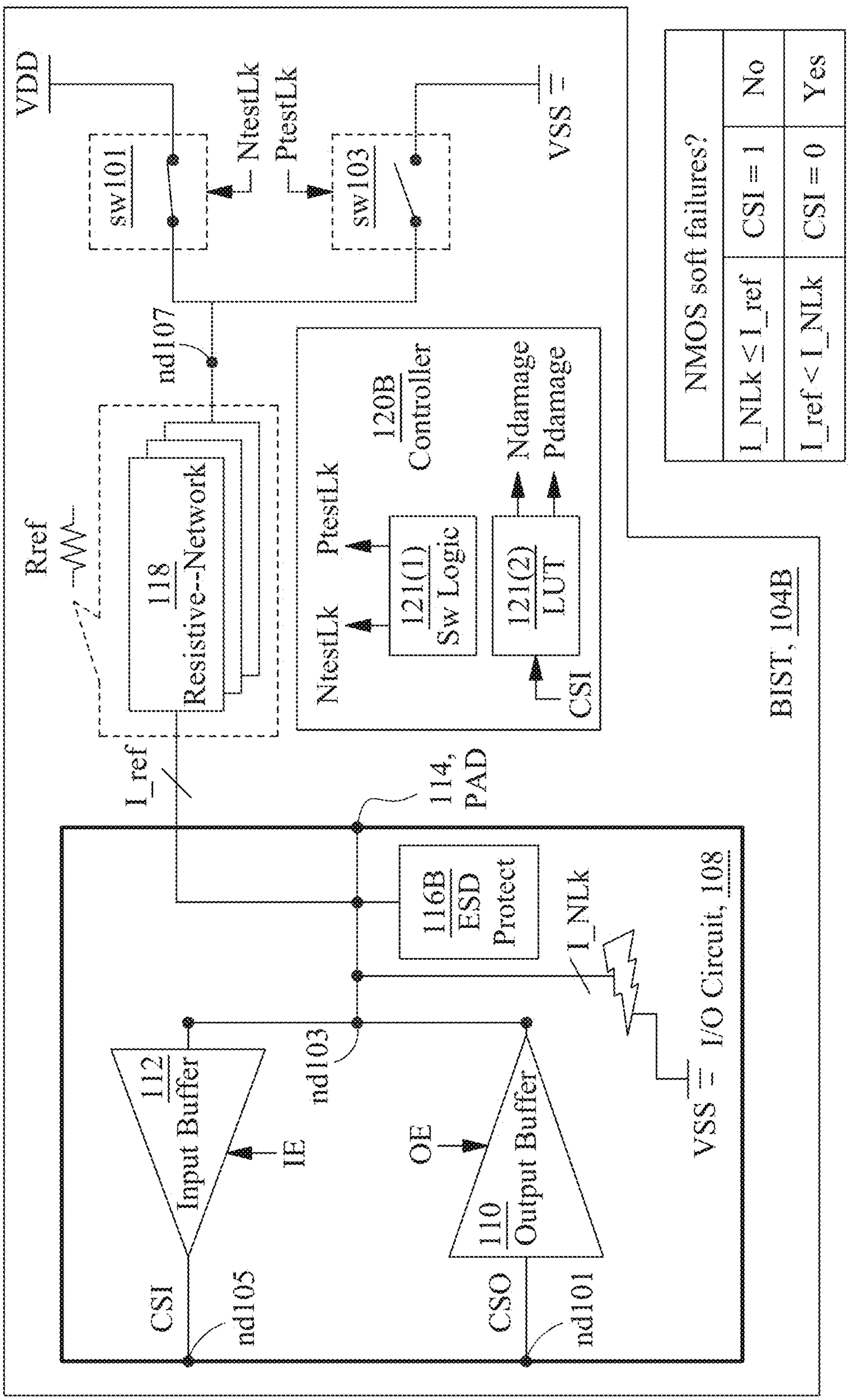
Figure 1D:
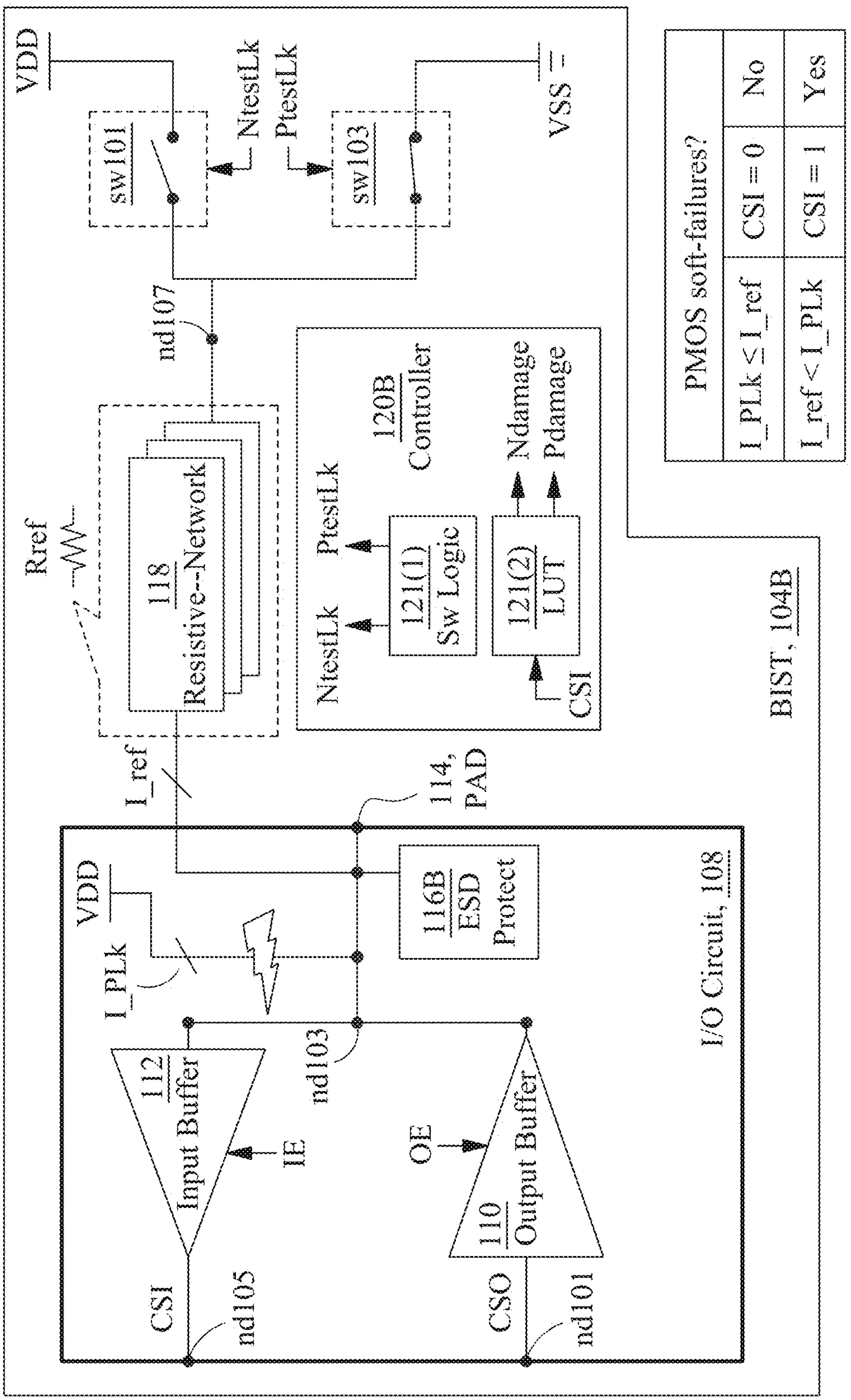

FIGS. 1B-1D are block diagrams of a BIST 104B, in accordance with some embodiments.

FIGS. 1C-1D assume corresponding particular phases of operation of BIST 104B, whereas FIG. 1B is more generalized, i.e., FIG. 1B does not assume a particular operational phase of BIST 104B. BIST 104B is an example of BIST 104A of FIG. 1A.

BIST 104A includes: an I/O circuit 108; one or more instances of a resistive-network cell region 118 (FIGS. 2A-2Q); switches sw101 and sw103; and a controller 120B. I/O circuit 108 includes: a digital output buffer 110 (FIG. 1K); a digital input buffer 112 (FIG. 1L); an ESD protection circuit 116B (FIGS. 1I-1J); and an I/O terminal (or pad) 114. In some embodiments, output buffer 110 is referred to as an output driver.

Each of output buffer 110 and input buffer 112 is a digital tri-state device. As digital tri-state devices, each of output buffer 110 and input buffer 112 correspondingly receives an input enable (IE) signal, an output enable (OE) signal, or the like, as a control signal which determines operation as follows: where the control signal selects normal behavior, and in response to an input signal having a logical low value/state, the tri-state device generates an output signal having a logical low value/state; where the control signal selects normal behavior, and in response to an input signal having a logical high value/state, the tri-state device generates an output signal having a logical high value/state; and where the control signal selects Hi-Z behavior, regardless of a logical value/state of the input signal, the tri-state device generates a high impedance (Hi-Z) state at the output terminal thereof. Relative to the perspective of an external node to which the output terminal of the tri-state device is coupled (as contrasted to being coupled to an internal node which is internal to the tri-state device), the Hi-Z state behaves, in effect, as if an open circuit condition otherwise exists between the output terminal of the tri-state device and the external node.

In FIG. 1B, at a node nd101, an input terminal of output buffer 110 is coupled to core circuitry (not shown) of an IC of which BIST 104B is a part, e.g., IC 102(1) or IC 102(2) of FIG. 1A. An output terminal of output buffer 110 is coupled to a node nd103. Also coupled to node nd103 are an input terminal of input buffer 112, an input terminal of ESD protection circuit 116B and I/O terminal 114. An output terminal of input buffer 112 is coupled to a node nd105.

Instances of I/O circuit 108 are correspondingly used by ICs 102(1) and 102(2) to communicate externally. More particularly, I/O circuit 108 communicates externally through an I/O terminal 104. Under a first circumstance in which input buffer 112 is controlled to have a Hi-Z state, output buffer 110 receives a core signal output (CSO) signal (signal CSO), e.g., a data signal, control signal, logic signal, or the like, from the core circuitry at node nd101, and buffers signal CSO onto node nd103 and thereby onto I/O terminal 114 as an I/O signal. Under a second circumstance in which output buffer 110 is controlled to have a Hi-Z state, input buffer 112 receives an I/O signal from I/O terminal 114 via node 103, and buffers the I/O signal onto node nd105 and thereby to the core circuitry as a core signal input (CSI) signal (signal CSI), e.g., a data signal, control signal, logic signal, or the like.

In FIG. 1B, the one or more instances of resistive-network cell region 118 are coupled together (variously in series and/or in parallel (FIGS. 2A-2Q, 4A-4G, or the like) in a manner that represents a resistor Rref having first and second terminals. The first terminal of resistor Rref is coupled to node nd103. The second terminal of resistor Rref is coupled to a node nd107. Node nd107 is also coupled to first terminals of each of switches sw101 and sw103. A second terminal of switch sw101 is coupled to a first reference voltage, which is VDD in FIG. 1B. A second terminal of switch sw103 is coupled to a second reference voltage, which is VSS in FIG. 1B. In some embodiments, the first and second reference voltages are corresponding voltages other than VDD and VSS.

Switch sw101 is controlled by a signal NteskLk, which is generated by controller 120B. Switch sw103 is controlled by a signal PteskLk, which is generated by controller 120B. Controller 120B uses control signals NtestLk and PtestLk to selectively couple resistor Rref alternatively to VDD (FIG. 1C) or VSS (FIG. 1D).

In FIG. 1B, Controller 120B includes a switching (SW) logic 121(1) by which control signals NtestLk and PtestLk are selectively generated. In some embodiments, controller 120B includes a processor (not shown).

In some embodiments, operational phases of controller 120B further include a non-testing phase in which control signals NtestLk and PtestLk are used to couple resistor Rref neither to VDD nor to VSS, i.e., to decouple Rref from each of VDD and VSS. In FIG. 1B, a reference current I_ref flows between resistor Rref and node nd103.

FIG. 1C assumes an N-type MOSFET (NMOS) soft-failure testing phase of operation of BIST 104B.

In FIG. 1C, controller 120B configures values of control signals NtestLk and PtestLk correspondingly to close switch sw101 and open switch sw103. As a result, the second terminal of resistor Rref is coupled to VDD and decoupled from VSS.

During the NMOS soft-failure testing phase of FIG. 1C, in response to the reference current I_ref, which flows from resistor Rref to node nd103 being smaller than a leakage current I_NLk received at node nd103 from NMOS transistors included in one or more of output buffer 110 or input buffer 112, input buffer 112 sees the voltage level on node nd103 as representing a logical zero value and so input buffer 112 generates a logical zero value for its output signal CSI (CSI=0). For simplicity, FIG. 1C represents the leakage current received at node nd103 from damaged NMOS transistors included in one or more of output buffer 110 or input buffer 112, i.e., leakage current I_NLk, as flowing from node nd103 to VSS. Where the operational phase is the NMOS soft-failure testing phase, controller 120B: receives signal CSI, interprets the logical zero value of signal CSI (CSI=0) as indicative of ESD-induced soft failures being present amongst the NMOS transistors included in output buffer 110 or input buffer 112; and accordingly activates a warning/fault signal Ndamage, e.g., by setting Ndamage=1. In FIG. 1B, controller 120B includes a lookup table 121(2) by which warning/fault signal Ndamage and Pdamage (the latter discussed below) are selectively generated based on signal CSI.

Also during the NMOS soft-failure testing phase of FIG. 1C, in response to the reference current I_ref being equal to or larger than leakage current I_NLk, the voltage level on node nd103 represents a logical one value and so input buffer 112 generates a logical one value for its output signal CSI (CSI=1). In light of the operational phase being the NMOS soft-failure testing phase, controller 120B: interprets the logical one value of signal CSI (CSI=1) as indicative of ESD-induced soft failures not being present amongst the NMOS transistors included in output buffer 110 or input buffer 112; and accordingly deactivates warning/fault signal Ndamage, e.g., by setting Ndamage=0.

In some embodiments, the summation of currents at node nd103, i.e., at the single input terminal of input buffer 112, is described as representing a comparison. In such embodiments, because (1) the reference current I_ref is received at node nd103 and (2) a leakage current from ESD-damaged NMOS transistors are received at node nd103 during the NMOS soft-failure testing phase, the resultant voltage (net voltage) on node nd103 is regarded as representing the result of a comparison between I_ref and the leakage current from the ESD-damaged NMOS transistors.

FIG. 1D assumes a P-type MOSFET (PMOS) soft-failure testing phase of operation of BIST 104B.

In FIG. 1D, controller 120B configures values of control signals NtestLk and PtestLk correspondingly to open switch sw101 and close switch sw103. As a result, the second terminal of resistor Rref is coupled to VSS and decoupled from VDD.

During the PMOS soft-failure testing phase of FIG. 1D, in response to the reference current I_ref, which flows from resistor Rref to node nd103 being smaller than a leakage current I_PLk received at node nd103 from PMOS transistors included in one or more of output buffer 110 or input buffer 112, the voltage level on node nd103 represents a logical one value and so input buffer 112 generates a logical one value for its output signal CSI (CSI=1). For simplicity, FIG. 1D represents the leakage current received at node nd103 from damaged PMOS transistors included in one or more of output buffer 110 or input buffer 112, i.e., leakage current I_PLk, as flowing from VDD to node nd103. In light of the operational phase being the PMOS soft-failure testing phase, controller 120B: receives signal CSI, interprets the logical one value of signal CSI (CSI=1) as indicative of ESD-induced soft failures being present amongst the PMOS transistors included in output buffer 110 or input buffer 112; and accordingly activates a warning/fault signal Pdamage, e.g., by setting Pdamage=1. Again, controller 120B includes lookup table 121(2) by which warning/fault signal Pdamage is selectively generated based on signal CSI.

Also during the PMOS soft-failure testing phase of FIG. 1D, in response to the reference current I_ref being equal to or larger than leakage current I_PLk, the voltage level on node nd103 represents a logical zero value and so input buffer 112 generates a logical zero value for its output signal CSI (CSI=0). In light of the operational phase being the PMOS soft-failure testing phase, controller 120B: interprets the logical zero value of signal CSI (CSI=0) as indicative of ESD-induced soft failures not being present amongst the PMOS transistors included in output buffer 110 or input buffer 112; and accordingly deactivates warning/fault signal Pdamage, e.g., by setting Pdamage=0.

In some embodiments, the summation of currents at node nd103, i.e., at the single input terminal of input buffer 112, is described as representing a comparison. In such embodiments, because (1) the reference current I_ref is received at node nd103 and (2) a leakage current from ESD-damaged PMOS transistors are received at node nd103 during the PMOS soft-failure testing phase, the resultant voltage (net voltage) on node nd103 is regarded as representing the result of a comparison between I_ref and the leakage current from the ESD-damaged PMOS transistors.

Returning to FIG. 1B, the one or more instances of resistive-network cell region 118 and the manner of coupling the same imposes a small penalty in terms of the area consumed, i.e., the footprint thereof. In some embodiments of FIG. 1B, the footprint of the one or more instances of resistive-network cell region 118 and the manner of coupling the same has a footprint less than about 2.7 square micrometers (2.7 μm2). In some embodiments of FIG. 1B, relative to a footprint of IC 102(1) or 102(2), the footprint of the one or more instances of resistive-network cell region 118 (FIGS. 2D-2P, or the like) and the manner of coupling the same consumes about 3.7% of the footprint of IC 102(1) or 102(2). In some embodiments of FIG. 1B, the footprint of the one or more instances of resistive-network cell region 118 (FIGS. 2A-2P, or the like) and the manner of coupling the same having a footprint less than about 2.7 square micrometers (2.7 μm2) represents about 50 units of resistive-network cell region 118. In some embodiments of FIG. 1B, where resistor Rref is represented by about 50 units of resistive-network cell region 118 (FIGS. 2A-2P, or the like), resistor Rref has a resistance of about 7.50 kiloohms (kΩ). In some embodiments of FIG. 1B, the footprint of the one or more instances of resistive-network cell region 118 and the manner of coupling the same which is less than about 2.7 square micrometers (2.7 μm2) consumes less than about 20 microwatts (μW) of power. In some embodiments of FIG. 1B, the footprint of the one or more instances of resistive-network cell region 118 and the manner of coupling the same which is less than about 2.7 square micrometers (2.7 μm2) introduces less than about 3 femtofarads (fF) of capacitive loading.

Figure 2A:
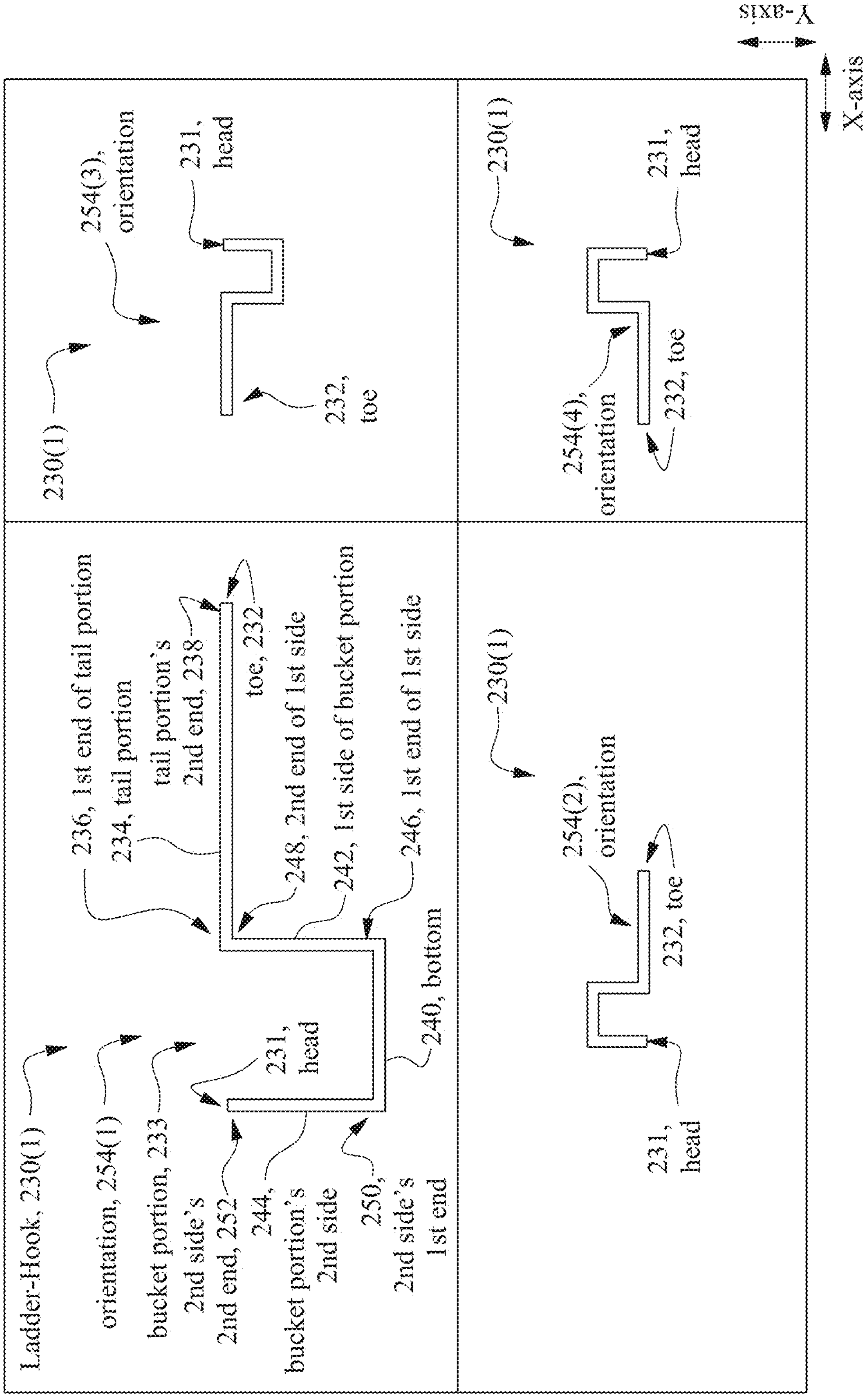
FIG. 2A is a diagram of a shape, in accordance with some embodiments.

In some embodiments of FIG. 1B, the footprint of the one or more instances of resistive-network cell region 118 and the manner of coupling the same has a footprint less than about 1.01 square micrometers (1.01 μm2). In some embodiments of FIG. 1B, relative to a footprint of IC 102(1) or 102(2), the footprint of the one or more instances of resistive-network cell region 118 (FIGS. 2A-2P, or the like) and the manner of coupling the same consumes about 1.4% of the footprint of IC 102(1) or 102(2). In some embodiments of FIG. 1B, the footprint of the one or more instances of resistive-network cell region 118 and the manner of coupling the same having a footprint less than about 1.01 square micrometers (1.01 μm2) represents about 19 units of resistive-network cell region 118 (FIGS. 2A-2P, or the like). In some embodiments of FIG. 1B, where resistor Rref is represented by about 19 units of resistive-network cell region 118 (FIGS. 2A-2P, or the like), resistor Rref has a resistance of about 2.80 kiloohms (kΩ).

Figure 1E:
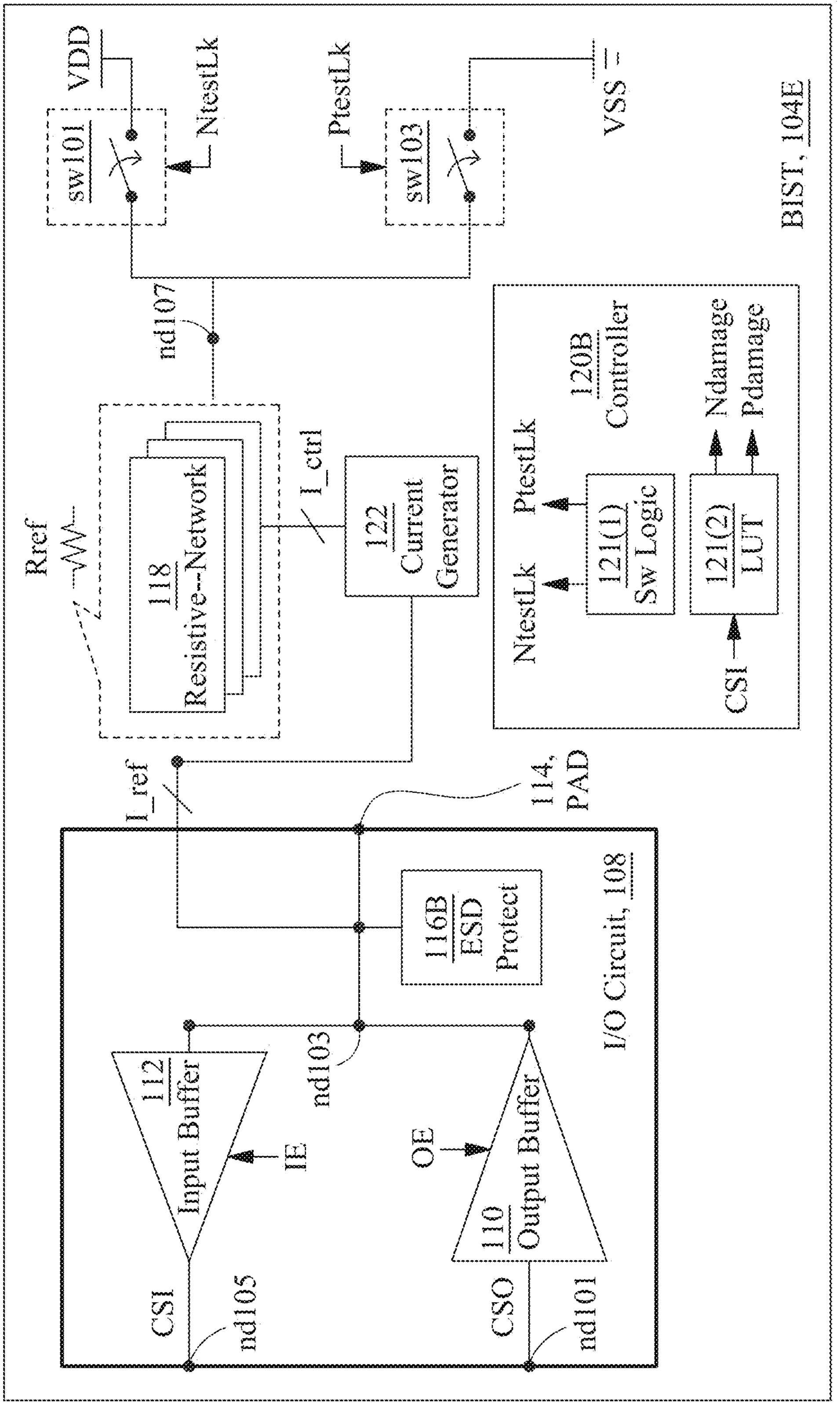

FIG. 1E is a block diagram of a BIST 104E, in accordance with some embodiments.

BIST 104E of FIG. 1E is similar to BIST 104B of FIGS. 1B-1D. For brevity, the discussion will focus on differences of BIST 104E as compared to BIST 104B rather than on similarities. Likewise, regarding other instances in which a second figure is similar to a first figure, the discussion will focus on differences of the second figure with respect to the first figure, for brevity.

BIST 104E of FIG. 1E further includes a current generator 122 as compared to BIST 104B of FIG. 1B. BIST 104E is an example of BIST 104A of FIG. 1A. Current generator 122 is coupled between resistor Rref and node nd103. Current generator 122 receives a control current I_ctrl from resistor Rref and generates reference current I_ref.

Figure 1F:
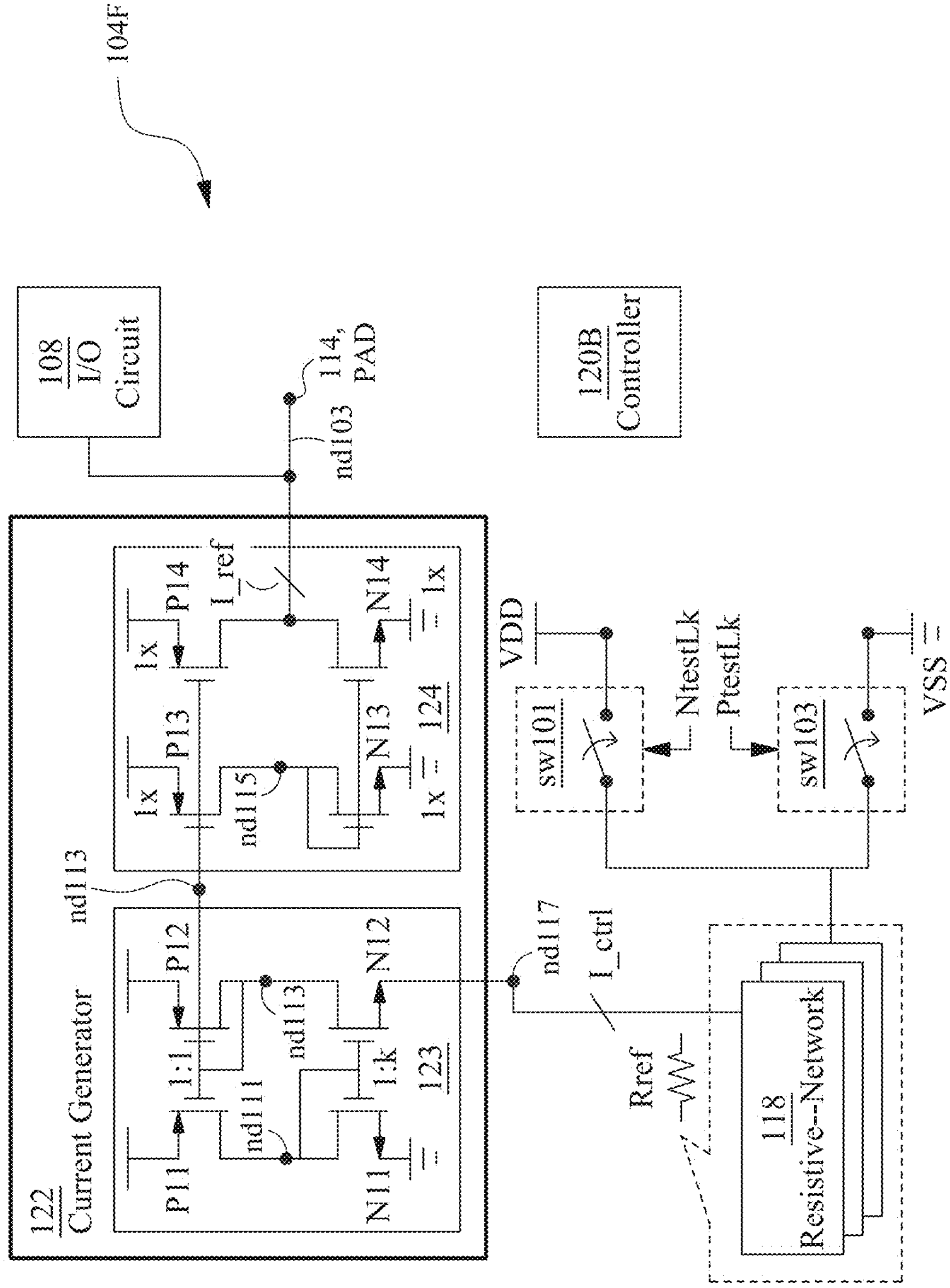

FIG. 1F is a block diagram of a BIST 104F, in accordance with some embodiments.

BIST 104F is an example of BIST 104E of FIG. 1E. In FIG. 1F, current generator 122 includes a beta multiplier 123 and a current mirror 124. Beta multiplier 123 includes PMOS transistors (PFETs) P11-P12 and NMOS transistors (NFETs) N11-N12. In some embodiments, PFET P11 and NFET N11 are considered as being included in a first branch of beta multiplier 123. In some embodiments, PFET P12 and NFET N12 are considered as being included in a second branch of beta multiplier 123.

In FIG. 1F, a source terminal of each of PFETs P11 and P12 is coupled with VDD. A drain terminal of PFET P11 is coupled to a node nd111. A drain terminal of PFET P12 is coupled to a node nd113. Gate terminals of PFETs P11 and P12 are coupled to each other and to node nd113. A drain terminal of NFET N11 is coupled to node nd111. A drain terminal of NFET N12 is coupled to node nd113. A source terminal of NFET N11 is coupled to VSS. A source terminal of NFET N12 is coupled to a node nd117. Gate terminals of NFETs N11 and N12 are coupled to each other and to node nd111. As the drain terminal of NFET N12 is coupled to node nd113, beta multiplier 123, and thus current generator 122, receives control current I_ctrl from resistor Rref at node nd117. Node nd117 represents the input terminal of beta multiplier 123.

Current mirror 124 includes PFETs P13-P14 and NFETs N13-N14. In some embodiments, PFET P13 and NFET N13 are considered as being included in a first branch of current mirror 124. In some embodiments, PFET P14 and NFET N14 are considered as being included in a second branch of current mirror 124.

In FIG. 1F, a source terminal of each of PFETs P13 and P14 is coupled with VDD. A drain terminal of PFET P13 is coupled to a node nd115. A drain terminal of PFET P14 is coupled to node nd103. Gate terminals of PFETs P13 and P14 are coupled to each other and to node nd113. A drain terminal of NFET N13 is coupled to node nd115. A drain terminal of NFET N14 is coupled to node nd103. A source terminal of NFET N13 is coupled to VSS. A source terminal of NFET N14 is coupled to VSS. Gate terminals of NFETs N13 and N14 are coupled to each other and to node nd115.

Each of the first and second branches of current mirror 124 is labeled 1*x* to indicate that the current through the second branch is substantially the same as the current through the first branch. In some embodiments, the variable x in the label 1*x* represents a unit of current such that the current through each of the first and second branch is one unit of X.

In FIG. 1F, NFET N12 of beta multiplier 123 is k times larger than NFET N11, where k is a positive number greater than one, 1<k. The transconductance, gm, of beta multiplier 123 is a function of the size difference between NFETs N11 and N12 and resistor Rref. Where Rref is substantially invariant with respect to process, voltage and temperature (PVT-invariant), similarly the transconductance gm of beta multiplier 123 is substantially invariant with respect to voltage and temperature along with a small/low dependence on process variations. As current mirror 124 is also coupled to node nd113, in effect, node nd113 represents the output terminal of beta multiplier 123 and the input terminal of current mirror 124. Beta multiplier 123 drives current mirror 124 with a result that current mirror 124 generates a substantially constant gm bias on node nd103.

In some embodiments of FIGS. 1E-1F, because of the inclusion of current generator 122, the footprint of the one or more instances of resistive-network cell region 118 and the manner of coupling the same has a footprint less than about 0.72 square micrometers (0.72 μm2), i.e., less than in FIGS. 1B-1D. In some embodiments of FIGS. 1E-1F, relative to a footprint of IC 102(1) or 102(2), the footprint of the one or more instances of resistive-network cell region 118 (FIGS. 2A-2P, or the like) and the manner of coupling the same consumes less than about 1.0% of the footprint of IC 102(1) or 102(2). In some embodiments of FIGS. 1E-1F, the footprint of the one or more instances of resistive-network cell region 118 and the manner of coupling the same having a footprint less than about 0.72 square micrometers (0.72 μm2) represents about 3 units of resistive-network cell region 118 (FIGS. 2A-2P, or the like). In some embodiments of FIGS. 1E-1F, where resistor Rref is represented by about 3 units of resistive-network cell region 118 (FIGS. 2A-2P, or the like), resistor Rref has a resistance of about 0.45 kiloohms (kΩ).

Figure 1G:
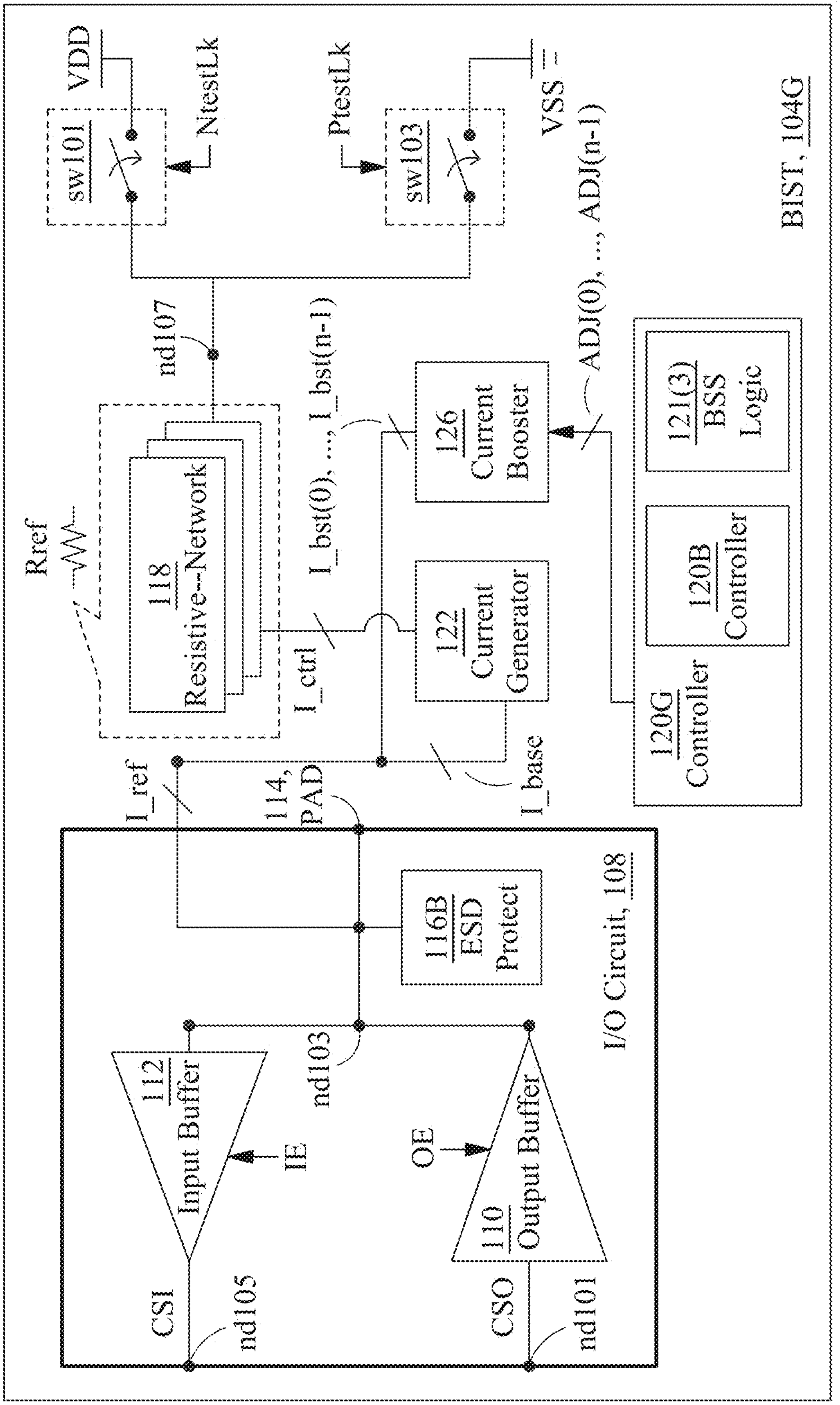

FIG. 1G is a block diagram of a BIST 104G, in accordance with some embodiments.

BIST 104G of FIG. 1G is similar to BIST 104E of FIG. 1E. For brevity, the discussion will focus on differences of BIST 104G as compared to BIST 104E rather than on similarities.

BIST 104G of FIG. 1G further includes a current booster 126 and a controller 120G in place of controller 120B, as compared to BIST 104E of FIG. 1E. BIST 104G is an example of BIST 104A of FIG. 1A. In addition to current generator 122, current booster 126 (FIG. 1H) is coupled to node nd103. Current booster 126 (FIG. 1H) receives boosting-stage-selection (BSS) signals ADJ(0), . . . , ADJ(n−1) from controller 120G and generates corresponding booster currents I_bst(0), . . . , I_bst(n−1), where n is a positive integer and 1≤n. Controller 120G includes controller 120B plus BSS logic 121(3) which generates BSS signals ADJ(0), . . . , ADJ(n−1).

Figure 1H:
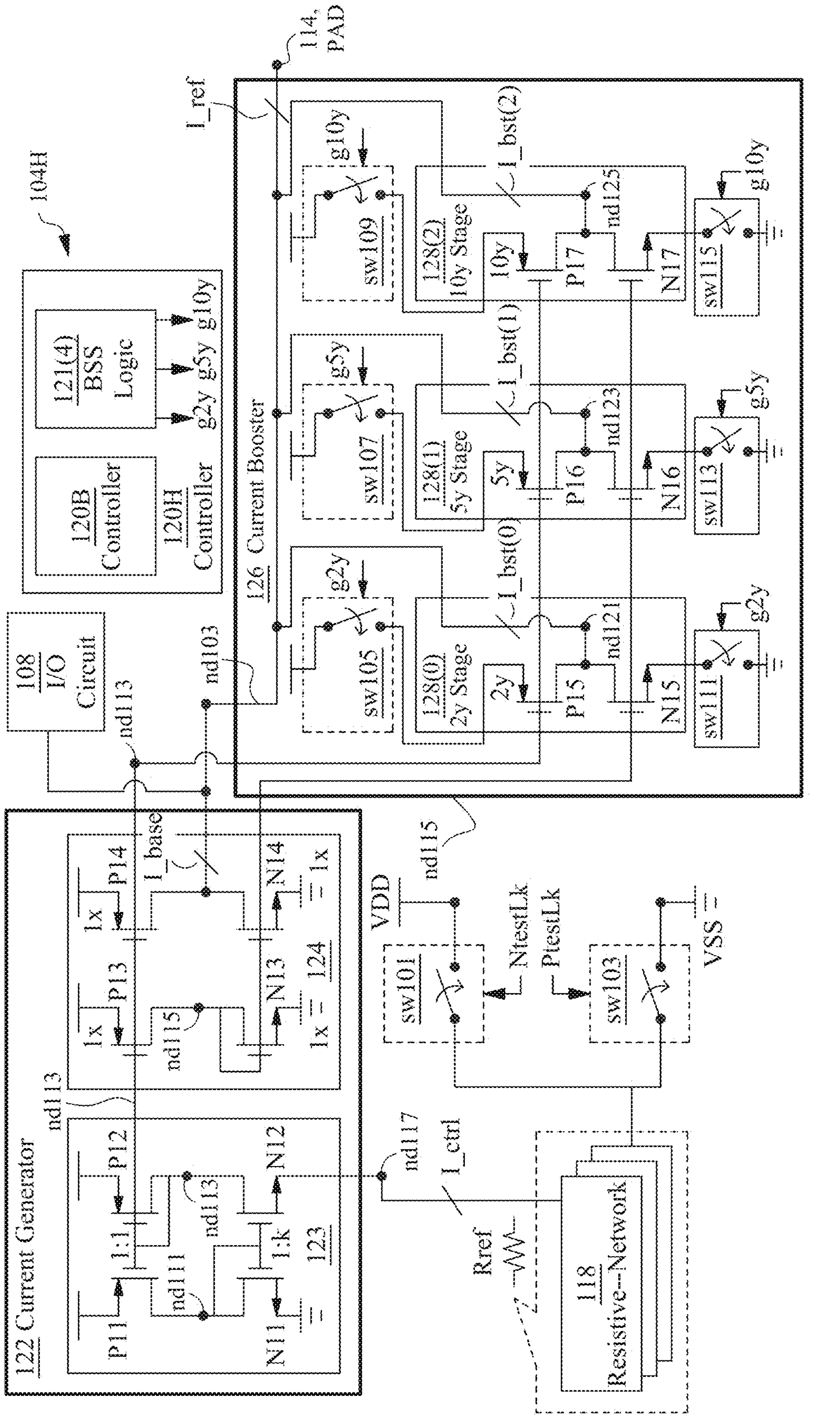

FIG. 1H is a block diagram of a BIST 104H, in accordance with some embodiments.

BIST 104H is an example of BIST 104G of FIG. 1G. BIST 104H includes controller 120H rather than controller 120G of FIG. 1G. Controller 120H includes BSS logic 121(4) whereas controller 120G includes BSS logic 121(3). FIG. 1H assumes that n=3 such that BSS logic 121(4) is an example of BSS logic 121(3) which produces an amount n=3 of BSS signals, namely g2*y*, g5*y* and g10*y* (discussed below). Under the assumption that n=3, current booster 126 includes boosting stages 128(0), 128(1) and 128(2). In some embodiments, n is a positive integer other than n=3. A node nd121 represents the output terminal of boosting stage 128(0). A node nd123 represents the output terminal of boosting stage 128(1). A node nd125 represents the output terminal of boosting stage 128(2). Each of nodes nd121, nd123 and nd125 is coupled to node nd103.

FIG. 1H further assumes: boosting stage 128(0) is configured to generate a boost current I_bst(0) that has a gain of 2*y* relative to base current I_base; boosting stage 128(1) is configured to generate a boost current I_bst(1) that has a gain of 5*y* relative to base current I_base; and boosting stage 128(2) is configured to generate a boost current I_bst(2) that has a gain of 10*y* relative to boost base current I_base. In some embodiments, the variable y in the labels 2*y*, 5*y* and 10*y* represents a unit of current such that the corresponding boosting gains are 2 units, 5 units and 10 units of current. In some embodiments, the variable y of current booster 126 and the variable x of current generator 122 represent the same unit of current. In some embodiments, boosting stages 128(0)-128(2) represent a set of gains other than the set {2×, 5×, 10×}.

Current booster 126 further includes switches sw105, sw107, sw109, swill, sw113 and sw115. First terminals of each of switches sw105, sw107 and sw109 are coupled to VDD. A second terminal of switch sw105 is coupled to a source terminal of a PFET P15. A second terminal of switch sw107 is coupled to a source terminal of a PFET P16. A second terminal of switch sw109 is coupled to a source terminal of a PFET P17. A first terminal of switch sw111 is coupled to a source terminal of an NFET N15. A first terminal of switch sw113 is coupled to a source terminal of an NFET N16. A first terminal of switch sw115 is coupled to a source terminal of an NFET N17. Second terminals of each of switches sw111, sw113 and sw115 are coupled to VSS.

Each of switches sw105 and sw111 is controlled by a BSS signal ADJ(0) which is referred to as g2*y* in FIG. 1H, and which is generated by BSS logic 121(4) of controller 120H. Each of switches sw107 and sw113 is controlled by a BSS signal ADJ(1) which is referred to as g5*y* in FIG. 1H, and which is generated by BSS logic 121(4) of controller 120H. Each of switches sw109 and sw115 is controlled by a BSS signal ADJ(2) which is referred to as g10*y* in FIG. 1H, and which is generated by BSS logic 121(4) of controller 120H. Controller 120H correspondingly uses BSS signals g2*y*, g5*y* and g10*y* to selectively couple boost currents I_bst(0), I_bst(1) and I_bst(2) of boosting stages 128(0), 128(1) and 128(2) to node nd103.

In FIG. 1H, reference current I_ref flows is formed as a summation of base current I_bias and boost currents I_bst (0), I_bst(1) and I_bst(2). When switches sw105 and sw111 are open, boost current I_bst(0) is (in effect) zero, i.e., I_bst(0)≈0. When switches sw107 and sw113 are open, boost current I_bst(1) is (in effect) zero, i.e., I_bst(1)≈0. When switches sw109 and sw115 are open, boost current I_bst(2) is (in effect) zero, i.e., I_bst(2)≈0.

Regarding current booster 126, boosting stage 128(0) includes PFET P15 and NFET N15. Boosting stage 128(1) includes PFET P16 and NFET N16. Boosting stage 128(2) includes PFET P17 and NFET N17. A drain terminal of PFET P15 is coupled to node nd121. A drain terminal of PFET P16 is coupled to a node nd123. A drain terminal of PFET P17 is coupled to node nd125. Gate terminals of PFETs P15, P16 and P17 are coupled to each other and to node nd113. A drain terminal of NFET N15 is coupled to node nd121. A drain terminal of NFET N16 is coupled to node nd123. A drain terminal of NFET N17 is coupled to node nd125. Gate terminals of NFETs N15, N16 and N17 are coupled to each other and to node nd115.

Regarding FIG. 1H, in a circumstance in which BSS logic 121(4) configures each of BSS signals g2*y*, g5*y* and g10*y* to correspondingly open switches sw105-sw115, BIST 104H uses only current generator 122 to generate reference current I_ref, i.e., I_ref=I_base, which corresponds to how reference current I_ref is generated in FIGS. 1E-1F. In other circumstances in which each controller 120H configures at least one of BSS signals g2*y*, g5*y* or g10*y* to correspondingly close switches sw105 & sw111, or sw107 & sw113 or sw109 & sw113, BIST 104H uses current generator 122 and one or more of boosting stages 128(0), 128(1) and 128(2) to generate reference current I_ref. As such, BIST 104H uses boost currents I_bst(0), I_bst(1) and I_bst(2) of current booster 126 to adjust/tune the value of reference current I_ref as compared to the value of reference current I_ref generated by current generator 122 taken alone. In light of such adjustment/tuning capability, in some embodiments, BIST 104 uses a different value of I_ref for the NMOS soft-failure testing phase (FIG. 1C) and the PMOS soft-failure testing phase (FIG. 1D).

Figure 1I:
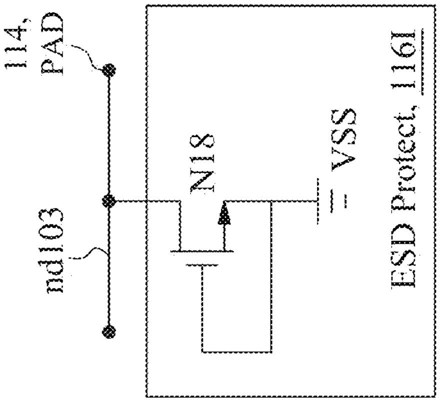

FIG. 1I is a block diagram of an ESD protection circuit 1161, in accordance with some embodiments.

ESD protection circuit 1161 is an example of ESD protection circuit 116B of FIGS. 1B-IE and 1G. ESD protection circuit 1161 includes an NFET N18 coupled between node nd103 and VSS. The gate terminal of NFET N18 is coupled to VSS in a grounded-gate NMOS configuration (ggNMOS).

Figure 1J:
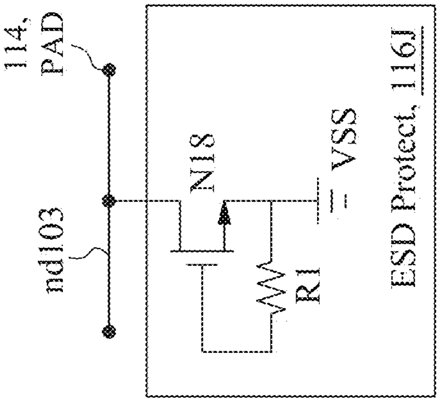

FIG. 1J is a block diagram of an ESD protection circuit 116J, in accordance with some embodiments.

ESD protection circuit 116J is an example of ESD protection circuit 116B of FIGS. 1B-IE and 1G. ESD protection circuit 116J of FIG. 1J is similar to ESD protection circuit 1161 of FIG. 1I. For brevity, the discussion will focus on differences of ESD protection circuit 116J as compared to ESD protection circuit 1161 rather than on similarities.

ESD protection circuit 116J further includes a resistor R1 as compared to ESD protection circuit 1161. Resistor R1 is coupled between the gate terminal of NFET N18 and VSS and thus is another type of ggNMOS.

Figure 1K:
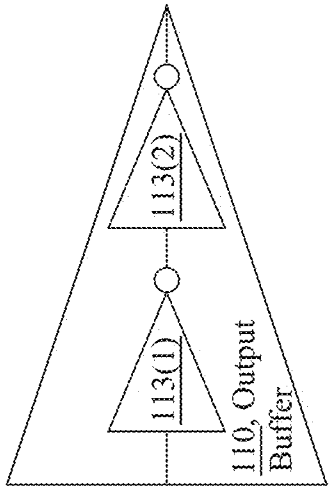

FIG. 1K is a block diagram of output buffer 110, in accordance with some embodiments.

In FIG. 1K, output buffer 110 includes inverters 113(1) and 113(2). Inverters 113(1) and 113(2) are coupled in series between the input and output terminals of output buffer 110.

Figure 1L:
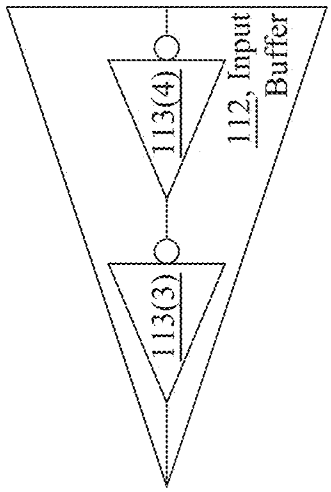

FIG. 1L is a block diagram of input buffer 112, in accordance with some embodiments.

In FIG. 1L, input buffer 112 includes inverters 113(3) and 113(4). Inverters 113(3) and 113(4) are coupled in series between the input and output terminals of input buffer 112.

FIG. 2A is a diagram of a shape 230(1) referred to herein as a ladder-hook, in accordance with some embodiments.

FIG. 2A relates to FIGS. 2B-2K, or the like, as follows: various resistive-sub-networks in FIGS. 2A-2K have shapes similar to shape 230(1) of FIG. 2A, and thus such that resistive-sub-networks in FIGS. 2A-2K are referred to as ladder-hooks.

In FIG. 2A, ladder-hook 230(1) has a head 231 and a toe 232. Ladder-hook 230(1) includes a bucket portion 233 and a tail portion 234.

Tail portion 234 extends in a first direction, e.g., parallel to the X-axis. As such, tail portion 234 is described as extending horizontally. Tail portion 234 includes a first end 236 and a second end 238. Toe 232 of bucket portion 233 corresponds to second end 238 of tail portion 234.

Bucket portion 233 includes a bottom 240, a first side 242 and a second side 244. Bottom 240 extends parallel to the X-axis and is described as extending horizontally. First side 242 and second side 244 extend in a second direction perpendicular to the first direction, e.g., the second direction is parallel to the Y-axis. As such, first side 242 and second side 244 are described as extending vertically. In some embodiments, the first and second directions are something other than being correspondingly parallel to the X-axis and the Y-axis. First side 242 and second side 244 of bucket portion 244 are substantially the same length.

Regarding bucket portion 233, first side 242 has a first end 246 and a second end 248. Second side 244 has a first end 250 and a second end 252. Head 231 of bucket portion 233 corresponds to second end 252 of second side 244. First end 246 of first side 242 and first end 250 of second side 244 intersect corresponding ends (not numbered) of bottom 240. Corresponding ends (not numbered) of bottom 240 intersect first end 246 of first side 242 and first end 250 of second side 244. As such, bottom 240 extends between first end 246 of first side 242 and first end 250 of second side 244. Bottom 240 does not extend beyond either first side 242 or second side 244. Bottom 240 is perpendicular to each of first side 242 and second side 244 of bucket portion 244.

First end 236 of tail portion 234 intersects second end 248 of first side 242. From first end 236, tail portion extends perpendicularly away from first side 242 of bucket portion 233. Relative to the Y-axis and to bottom 240, neither of first side 242 nor second side 244 extends beyond tail portion 234. Relative to the Y-axis, bottom 240 is on a first side of tail portion 234 and neither of first side 242 nor second side 244 extends into an area on opposite second side of tail portion 234.

In FIG. 2A, ladder-hook 230(1) is shown in four different orientations with respect to the X-axis and the Y-axis. In the upper-left portion of FIG. 2A, ladder-hook 230(1) is shown in orientation 254(1). Relative to the Y-axis, in the orientation 254(1), the open end of bucket portion 233 is above bottom 240. Relative the X-axis, in the orientation 254(1), the bucket portion 233 is to the left side of tail portion 234.

In the lower-left portion of FIG. 2A, ladder-hook 230(1) is shown in orientation 254(2). Relative to the X-axis, orientation 254(2) is mirror symmetric with respect to orientation 254(1). In the upper-right portion of FIG. 2A, ladder-hook 230(1) is shown in orientation 254(3). Relative to the Y-axis, orientation 254(3) is mirror symmetric with respect to orientation 254(1). Relative to a third direction perpendicular to each of the first and second directions, e.g., the third direction is parallel to the Z-axis, orientation 254(3) is rotated 180 degrees (180°) with respect to orientation 254(2). In the lower-right portion of FIG. 2A, ladder-hook 230(1) is shown in orientation 254(4). Relative to the X-axis, orientation 254(4) is mirror symmetric with respect to orientation 254(3). Relative to the Y-axis, orientation 254(3) is mirror symmetric with respect to orientation 254(2). Relative to the Z-axis, orientation 254(4) is rotated 180 degrees (180°) with respect to orientation 254(1).

Regarding FIG. 2A, in some embodiments, intersections are to be understood as a horizontally-extending part of a given ladder-hook which overlaps the corresponding vertically-extending part of the given ladder-hook. In such embodiments, corresponding ends (not numbered) of bottom 240 underlie first end 246 of first side 242 and first end 250 of second side 244, and first end 236 of tail portion 234 overlies second end 248 of first side 242.

Also regarding FIG. 2A, in some embodiments, intersections are to be understood as a horizontally-extending part of a given ladder-hook which underlaps the corresponding vertically-extending part of the given ladder-hook. In such embodiments, corresponding ends (not numbered) of bottom 240 overlie first end 246 of first side 242 and first end 250 of second side 244, and first end 236 of tail portion 234 underlies second end 248 of first side 242.

Figure 2B:
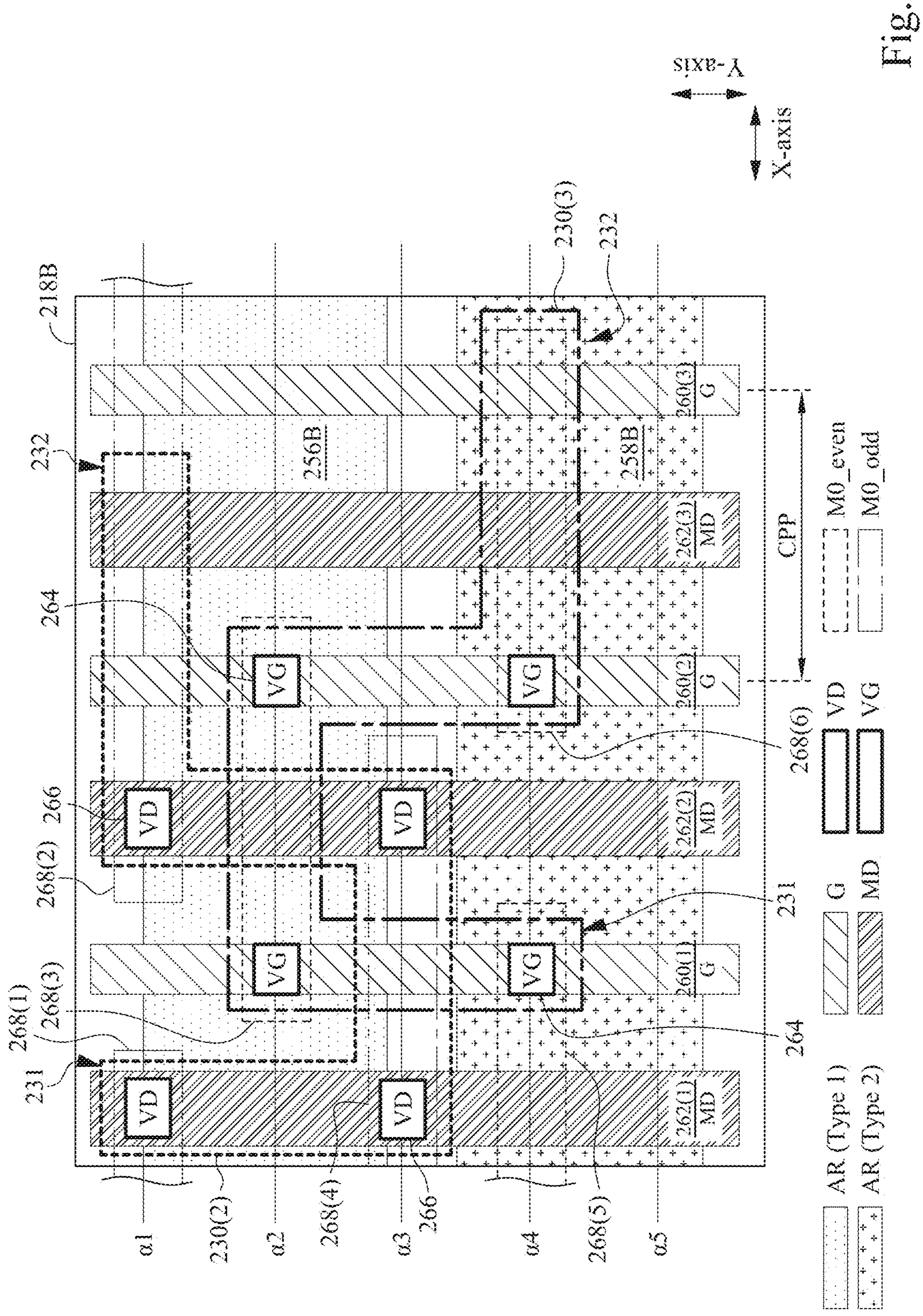
FIGS. 2B-2R are layout diagrams of corresponding BISTs, in accordance with some embodiments.
Figure 2C:
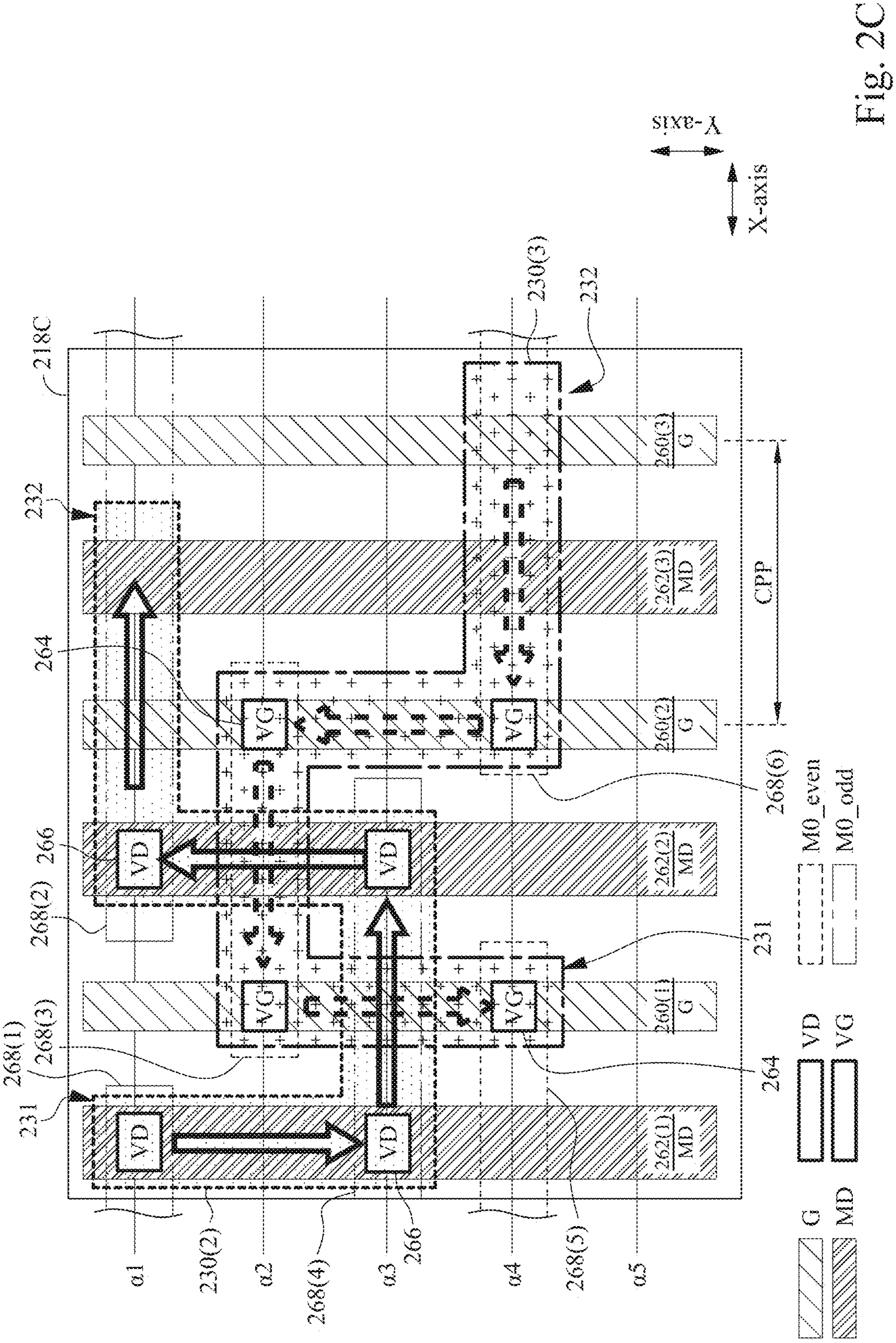

FIGS. 2B-2C are layout diagrams of corresponding of resistive-network cell regions 218B and 218C, in accordance with some embodiments.

Cell region 218C of FIG. 2C is similar to cell region 218B of FIG. 2B. For brevity, the discussion will address aspects which are similar across cell regions 218B and 218C; and then the discussion will address differences of cell region 218C as compared to cell region 218B.

In FIGS. 2B-2C, each of resistive-network cell regions 218B-218C includes a first resistive-sub-network represented by ladder-hook 230(2) and a second resistive-sub-network represented by ladder-hook 230(3).

In general, a layout diagram represents a semiconductor device. Shapes in the layout diagram represent corresponding components in the semiconductor device. The layout diagram per se is a top view. Shapes in the layout diagram are two-dimensional relative to, e.g., the X-axis and the Y-axis, whereas the semiconductor device being represented is three-dimensional. Typically, relative to the Z-axis, the semiconductor device is organized as a stack of layers in which are located corresponding structures, i.e., to which belong corresponding structures. Accordingly, each shape in the layout diagram represents, more particularly, a component in a corresponding layer of the corresponding semiconductor device. Typically, the layout diagram represents relative depth, i.e., positions along the Z-axis, of shapes and thus layers by superimposing a second shape on a first shape so that the second shape at least partially overlaps the first shape. For simplicity of discussion, i.e., as a discussion-expedient, some elements in a layout diagram (e.g., FIGS. 2B-2C, or the like) are referred to as if they are counterpart structures in a corresponding semiconductor device rather than patterns/shapes per se.

Layout diagrams vary in terms of the amount of detail represented. In some circumstances, selected layers of a layout diagram are combined/abstracted into a single layer, e.g., for purposes of simplification. Alternatively, and/or additionally, in some circumstances, not all layers nor components therein of the corresponding semiconductor device are represented, i.e., selected layers of the layout diagram are omitted, e.g., for simplicity of illustration. For example, FIG. 2C omit ARs 256D and 258D of AR layer 375(1). In some embodiments, the layout diagram of FIG. 2A is part of a larger layout diagram.

In FIGS. 2B-2C, in an active region (AR) layer 375(1), resistive-network cell region 218B includes ARs 256B and 258B that extend in a first direction, e.g., parallel to the X-axis. AR 256B has a first type of conductivity and AR 258B has a different second type of conductivity. For simplicity of illustration, in some embodiments, the layout diagram of FIG. 2A is part of a larger layout diagram. In FIG. 2B, the following is assumed: the first type of conductivity is a positive-type (P-type) conductivity appropriate to PMOS transistors; and the second type of conductivity is a negative-type (N-type) of conductivity appropriate to NMOS transistors. In some embodiments, alternatively, the first type of conductivity is a negative-type (N-type) of conductivity and that the second type of conductivity is a positive-type (P-type) conductivity.

In FIGS. 2B-2C, in a GMD layer 375(2) (FIGS. 3A-3B), resistive-network cell region 218B further includes gate structures and metal-to-drain/source (MD) structures that extend in a second direction perpendicular to the first direction, e.g., the second direction is parallel to the Y-axis. In some embodiments, the first and second directions are other than being correspondingly parallel to the X-axis and the Y-axis. Relative to the X-axis, the locations of gate structures 260(1), 260(2) and 260(3)) alternate with respect to MD structures 262(1), 262(2) and 262(3). Relative to the X-axis: gate structure 260(1) is between MD structures 262(1) and 262(2); MD structure 262(2) is between gate structures 260(1) and 260(2); gate structure 260(2) is between MD structures 262(2) and 262(3); and MD structure 262(3) is between gate structures 206(2) and 260(3).

In FIGS. 2B-2C, in a VGD layer 375(3) (FIGS. 3A-3B) over GMD layer 375(2), resistive-network cell region 218B further includes via-to-gate (VG) structures 264 and via-to-MD (VD) structures 266 over corresponding ones of gate structures 260(1)-260(2) and MD structures 262(1)-262(2). Cell region 218B is arranged according to alpha tracks $\alpha$1, $\alpha$2, $\alpha$3, $\alpha$4 and $\alpha$5 that extend in parallel to the X-axis. Relative to the Y-axis, VG structures 264 and VD structures 266 are aligned correspondingly to alpha tracks $\alpha$1, $\alpha$2, $\alpha$3 and $\alpha$4. In cell region 218B, no instance of VG structure 264 nor an instance of VD structure 266 is over alpha track $\alpha$5.

In FIGS. 2B-2C, in a first layer of metallization (M*1st layer) 375(4) (FIGS. 3A-3B) over VGD layer 375(3), resistive-network cell region 218B further includes M*1st conductors 268(1)-268(6) that extend parallel to the X-axis, are aligned correspondingly to alpha tracks $\alpha$1-$\alpha$5, and thus are over corresponding ones of VG structure 264 and VG structure 264.

In FIGS. 2B-2C, and for that matter FIGS. 2C-2Q and 3A-3B, a numbering convention is assumed in which the M*1st layer is metallization layer zero (M0) and correspondingly the first layer of interconnection (VIA*1st layer) is interconnection layer zero (V0). In some embodiments, depending upon the numbering convention of the corresponding process node by which a semiconductor device corresponding to FIGS. 2B-2Q and 3A-3B, the M*1st layer is metallization layer one (M1) and correspondingly the VIA*1st layer is interconnection layer one (V1).

In FIGS. 2B-2C, M0 conductors 268(1)-268(2) are aligned to alpha track $\alpha$1. M0 conductor 268(3) is aligned to alpha track $\alpha$2. M0 conductor 268(4) is aligned to alpha track $\alpha$3. M0 conductors 268(5)-268(6) are aligned to alpha track $\alpha$4. In cell region 218B, no M0 conductors are aligned to alpha track $\alpha$5. Relative to the Y-axis: a distance between adjacent alpha tracks is one instance of a unit of measure referred to as a track pitch (TP); and a height of resistive-network cell regions 218B-218C is 5 TP such that five alpha tracks are overlapped by each of resistive-network cell regions 218B-218C.

Relative to the X-axis, gate structures 260(1)-260(3) are separated from each other by a uniform distance. In FIGS. 2B-2Q, the uniform distance represents one contacted poly pitch (CPP) for the corresponding semiconductor process technology node. Here, the word 'poly' in the term CPP does not necessarily imply that the gate structures in semiconductor devices based correspondingly on FIGS. 2B-2Q are to be formed of polysilicon but instead represents a historical convenience, i.e., because gate structures in ICs manufactured according to a predecessor semiconductor process technology node often were typically formed of polysilicon. Relative to the X-axis, a width of cell region 218B, and likewise cell region 218C is 3 CPP. In some embodiments, cell regions 218B-218C have a width different than 3 CPP. Relative to the X-axis, each of cell regions 218B-218C is abuttable (FIGS. 4A-4D, or the like).

In FIGS. 2B-2C, each of resistive-network cell regions 218B-218C includes a first resistive-sub-network represented by ladder-hook 230(2) and a second resistive-sub-network represented by ladder-hook 230(3).

Ladder-hook 230(2) has orientation 254(1). Ladder-hook 230(2) includes: a portion of MD structure 262(1) that represents second side 244 of bucket portion 233, the portion extending from slightly above alpha track α1 to slightly below alpha track α3; a portion of MD structure 262(2) that represents first side 242 of bucket portion 233, the portion extending from slightly above alpha track α1 to slightly below alpha track α3; a substantially entire portion of M0 conductor 268(4) that represents bottom 240 of bucket portion 233; a portion of M0 conductor 268(2) that represents tail portion 234 and which extends from slightly left of MD structure 262(2) to slightly right of MD structure 262(3), the latter representing toe 232 of ladder-hook 230(2); an instance of VD structure 266 which couples an end portion of M0 conductor 268(1) to MD structure 262(1), the intersection of the end portion of M0 conductor 268(1) and MD structure 262(1) representing head 231 of ladder-hook 230(2); an instance of VD structure 266 which couples M0 conductor 268(4) to MD structure 262(1), i.e., which couples bottom 230 to first end 250 of second side 244 of bucket portion 233; an instance of VD structure 266 which couples M0 conductor 268(4) to MD structure 262(2), i.e., which couples bottom 230 to first end 246 of first side 242 of bucket portion 233; and an instance of VD structure 266 which couples MD structure 262(2) to M0 conductor 268(2), i.e., which couples second end 248 of first side 242 of bucket portion 233 to first end 236 of tail portion 234.

As ladder-hook 230(2) includes portions of MD structures 262(1)-262(2) but does not include a portion of any of gate structures 260(1)-260(3), ladder-hook 230(2) is referred to as an MD-based ladder-hook. In FIGS. 2B-2C, horizontally-extending parts of ladder-hook 230(2) are aligned with corresponding odd ones of the alpha tracks, namely alpha tracks α1 and α3.

Ladder-hook 230(3) has orientation 254(2). Ladder-hook 230(3) includes: a portion of gate structure 260(1) that represents second side 244 of bucket portion 233, the portion extending from slightly above alpha track α2 to slightly below alpha track α4; a portion of gate structure 260(2) that represents first side 242 of bucket portion 233, the portion extending from slightly above alpha track α2 to slightly below alpha track α4; a substantially entire portion of M0 conductor 268(3) that represents bottom 240 of bucket portion 233; a portion of M0 conductor 268(6) that represents tail portion 234 and which extends from slightly left of gate structure 260(2) to slightly right of gate structure 260(3), the latter representing toe 232 of ladder-hook 230(3); an instance of VG structure 264 which couples an end portion of M0 conductor 268(5) to gate structure 260(1), the intersection of the end portion of M0 conductor 268(5) and gate structure 260(1) representing head 231 of ladder-hook 230(3); an instance of VG structure 264 which couples M0 conductor 268(3) to gate structure 260(1), i.e., which couples bottom 230 to first end 250 of second side 244 of bucket portion 233; an instance of VG structure 264 which couples M0 conductor 268(3) to gate structure 260(2), i.e., which couples bottom 230 to first end 246 of first side 242 of bucket portion 233; and an instance of VG structure 264 which couples gate structure 260(2) to M0 conductor 268(6), i.e., which couples second end 248 of first side 242 of bucket portion 233 to first end 236 of tail portion 234.

As ladder-hook 230(3) includes portions of gate structures 260(1)-260(2) but does not include a portion of any of MD structures 262(1)-262(3), ladder-hook 230(3) is referred to as a gate-based ladder-hook. In FIGS. 2B-2C, horizontally-extending parts of gate-based ladder-hook 230(3) are aligned with corresponding even ones of the alpha tracks, namely alpha tracks α2 and α4.

Gate-based ladder-hook 230(3) is interleaved with MD-based ladder-hook 230(2) relative to each of the X-axis and the Y-axis. The middle region of bottom 240 of gate-based ladder-hook 230(3) overlies the middle region of first side 242 of bucket portion 232 of MD-based ladder-hook 230(2), i.e., a portion of M0 conductor 268(3) of gate-based ladder-hook 230(3) overlies a portion of MD structure 262(2) of MD-based ladder-hook 230(2). The middle region of bottom 240 of MD-based ladder-hook 230(2) overlies the middle region of second side 244 of bucket portion 232 of gate-based ladder-hook 230(3), i.e., a portion of M0 conductor 268(4) of MD-based ladder-hook 230(2) overlies a portion of gate structure 260(1) of gate-based ladder-hook 230(2).

In FIGS. 2B-2C, no portion of ladder-hook 230(2) or ladder-hook 230(3) is aligned with alpha track α5. FIGS. 2B-2C reflect a first design rule of a corresponding process node which reserves the area above one of the alpha tracks in cell regions 218B-218C for accommodating one or more M0 conductors which are to be used as something other than as part of a ladder-hook (reserved alpha track), e.g., to be used in routing, to be used as part of a power grid, or the like. In FIGS. 2B-2C, the reserved alpha track is alpha track α5. In some embodiments, the reserved alpha track is an alpha track other than alpha track α5. In some embodiments, the first design rule is not applied which results in a different version of cell region 218B.

In FIGS. 2B-2C, no portion of MD structure 262(3) is included in MD-based ladder-hook 230(2). FIGS. 2B-2C reflect a second design rule of a corresponding process node which reserves one of the MD-structures to be free from having an overlying instance of VD structure 266 within a corresponding footprint of cells 218B-218C (reserved MD structure). In FIGS. 2A-2C, the reserved MD structure is MD structure 262(3). In some embodiments, reserved MD structure is MD structure 262(1) or 262(2). In some embodiments, the second design rule is not applied which results in a different version of cell region 218B.

In FIGS. 2B-2C, no portion of gate structure 260(3) is included in gate-based ladder-hook 230(3). FIGS. 2B-2C reflect a third design rule of a corresponding process node which reserves one of the gate-structures to be free from having an overlying instance of VG structure 264 within a corresponding footprint of cells 218B-218C (reserved gate structure). In FIGS. 2A-2C, the reserved gate structure is gate structure 260(3). In some embodiments, reserved gate structure is gate structure 260(1) or 260(2). In some embodiments, the third design rule is not applied which results in a different version of cell region 218B.

In some embodiments, the reserved gate structure is designated to become an isolation dummy gate (IDG). An IDG is a dielectric structure that includes one or more dielectric materials and functions as an electrical isolation structure. Accordingly, an IDG is not a structure that is electrically conductive and thus does not function, e.g., as an electricity-conducting component of a ladder-hook, as an active gate of a transistor, or the like. In some embodiments, an IDG is based on a gate structure as a precursor. In some embodiments, a dummy gate structure includes a gate conductor, a gate-insulator layer, (optionally) one or more spacers, or the like. In some embodiments, an IDG is formed by first forming a gate structure, e.g., a dummy gate structure, sacrificing/removing (e.g., etching) the gate conductor of the gate structure to form a trench, (optionally) removing a portion of a substrate that previously had been under the gate conductor to deepen the trench, and then filling the trench with one or more dielectric materials such that the physical dimensions of the resultant electrical isolation structure, i.e., the IDG, are similar to the dimensions of the dummy gate conductor which was sacrificed, namely the gate conductor or the combination of the gate conductor and the portion of the substrate. In some embodiments, an IDG is a dielectric feature that includes one or more dielectric materials (e.g., oxide, nitride, oxynitride, or other suitable materials), and functions as an isolation feature. In some embodiments, an IDG is a continuous polysilicon on oxide diffusion (OD) edge structure and is referred to as a CPODE structure.

Regarding FIG. 2C, as a simplification, ARs 256B and 258B of FIG. 2B are omitted from FIG. 2C. Whereas FIG. 2B shows the outline of each of ladder-hooks 230(2) and 230(3) but correspondingly does not fill the same with a combination of fill color and/or fill pattern, FIG. 2C shows each ladder-hooks 230(2) and 230(3) correspondingly with a combination of fill color and/or fill pattern, e.g., to emphasize the shapes of ladder-hooks 230(2) and 230(3) and the interleaving thereof.

Each of ladder-hooks 230(2) and 230(3) represents a corresponding resistor. Accordingly, first and second terminals of the resistor represented by ladder-hook 230(2) correspond to head 231 and toe 232 of ladder-hook 230(2). First and second terminals of the resistor represented by ladder-hook 230(3) correspond to head 231 and toe 232 of ladder-hook 230(3).

In light of ladder-hook 230(2) representing a resistor, FIG. 2C additionally includes arrows which represent a current flow path from head 231 to toe 232 of ladder-hook 230(2). In some embodiments, depending upon how ladder-hook 230(2) is coupled to other components of a circuit, the current flow path is from toe 232 to head 231 of ladder-hook 230(2). In light of ladder-hook 230(3) representing a resistor, FIG. 2C additionally includes arrows which represent a current flow path from toe 232 to head 231 of ladder-hook 230(3). In some embodiments, depending upon how ladder-hook 230(3) is coupled to other components of a circuit, the current flow path is from head 231 to toe 232 of ladder-hook 230(3).

Regarding FIGS. 2B-2C, in some embodiments each of ladder-hook 230(2) and 230(3) represents a resistance of about 3.5 kiloohms (kΩ). In some embodiments in which cell regions 218B-218C are entirely series-coupled internally (ESCI), i.e., ladder-hook 230(2) is series-coupled to ladder-hook 230(3), each of cell regions 218B-218C represents a resistance of about 7.0 kiloohms (kΩ).

Figure 2D:
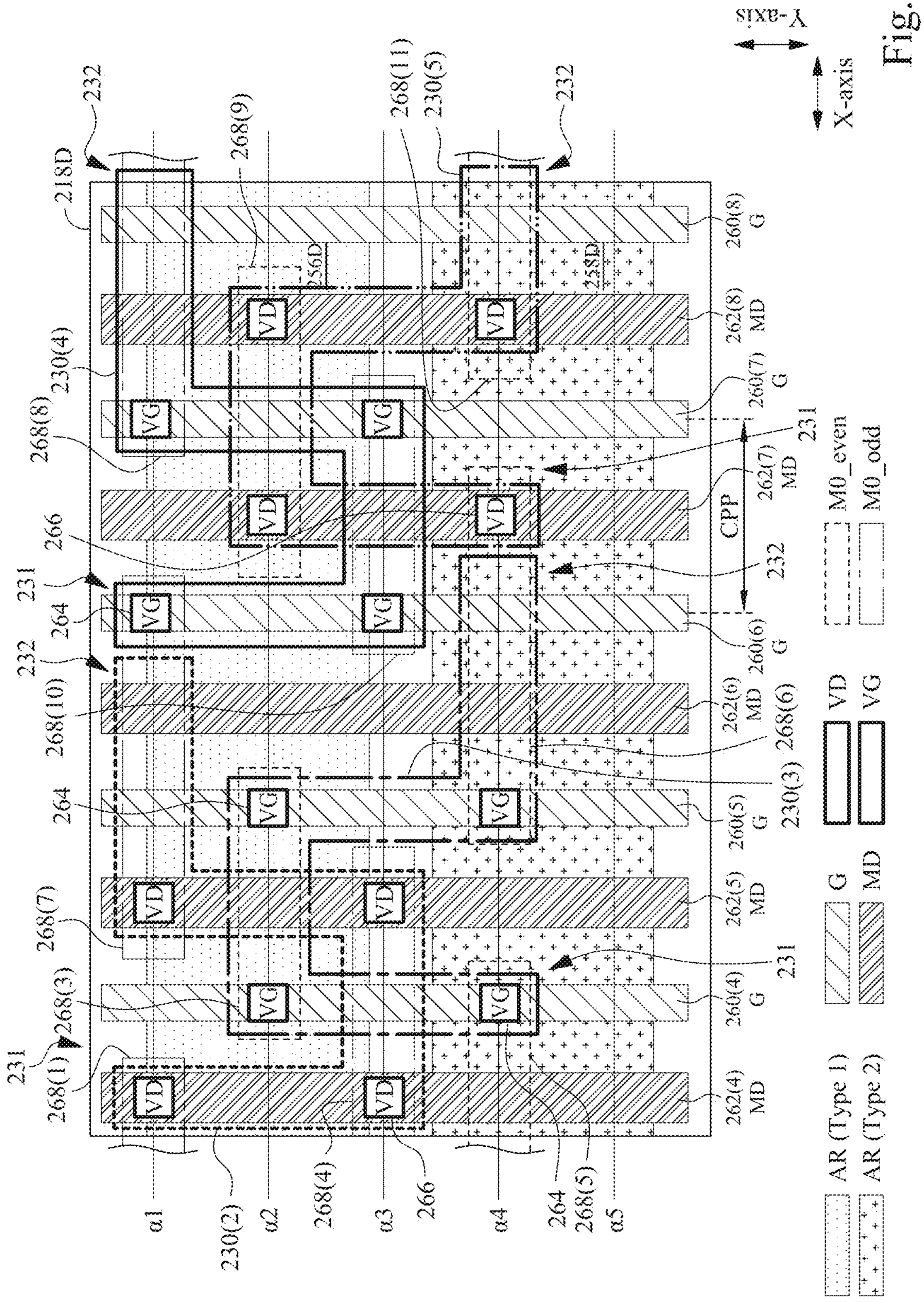
Figure 2E:
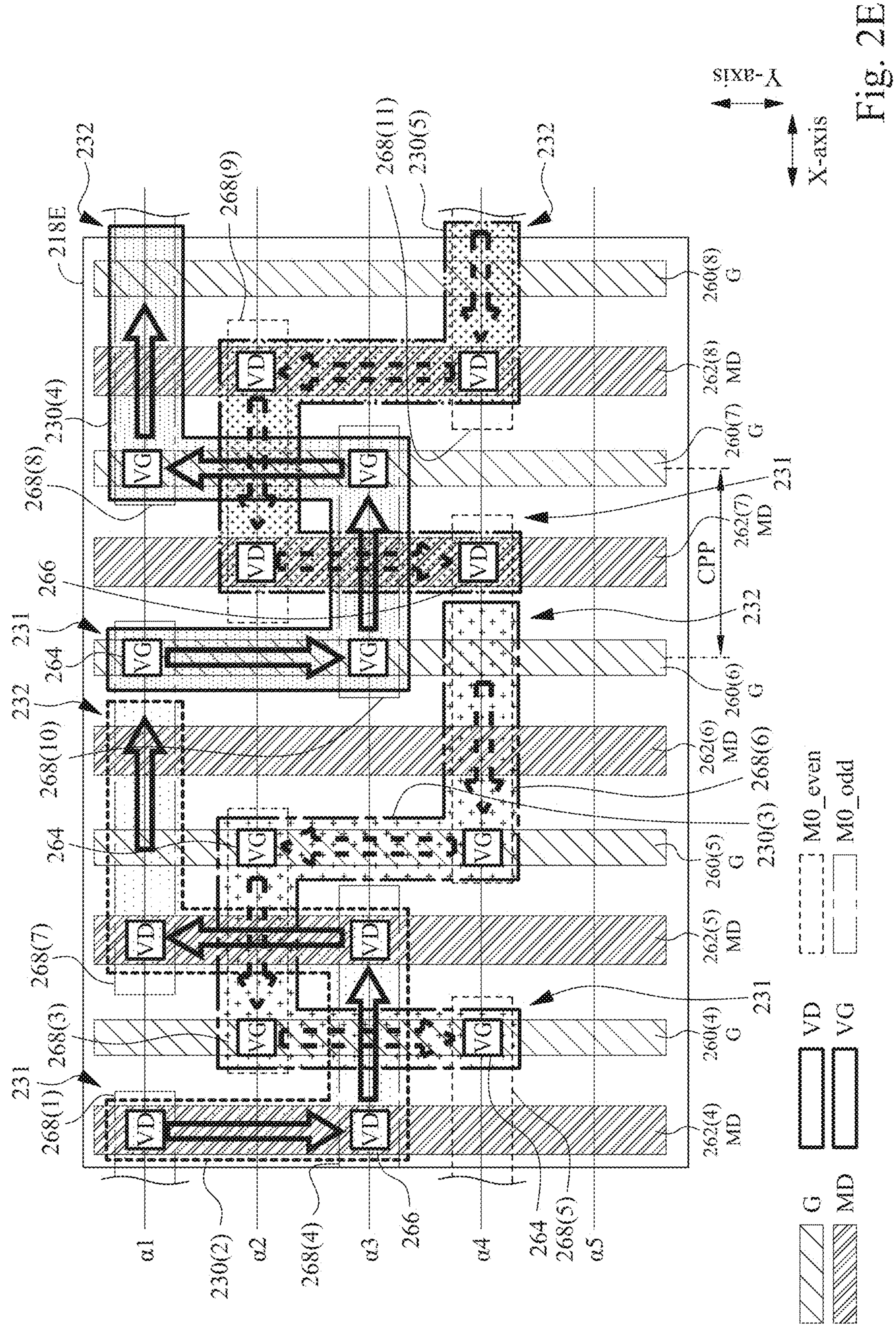

FIGS. 2D-2E are layout diagrams of corresponding of resistive-network cell regions 218D and 218C, in accordance with some embodiments.

Cell regions 218D-218E of FIGS. 2D-2E are correspondingly similar to cell regions 218B-281C of FIGS. 2B-2C. For brevity, the discussion will focus on differences of cell regions 218D-218E as compared to cell regions 218B-218C rather than on similarities. Also, cell region 218E of FIG. 2E is similar to cell region 218D of FIG. 2D. For brevity, the discussion will address aspects which are similar across cell regions 218D and 218E; and then the discussion will address differences of cell region 218E as compared to cell region 218D.

In FIGS. 2D-2E, each of cell regions 218D-218E additionally includes gate-based ladder-hook 230(4) and MD-based ladder-hook 230(5), as compared to FIGS. 2B-2C. Relative to the X-axis, a width of each of cell regions 218D-218E, and for that matter cell regions 218F-218L of corresponding FIGS. 2F-2L, is 5 CPP. In some embodiments, cell regions 218D-218E have a width different than 3 CPP. Relative to the X-axis, each of cell regions 218D-218E, and for that matter cell regions 218F-218L of corresponding FIGS. 2F-2L, is abuttable (FIGS. 4A-4D, or the like).

Each of cell regions 218D-218E of FIGS. 2D-2E includes ARs 256D and 258D rather than corresponding ARs 256B and 258B of FIGS. 2B-2C. Each of cell regions 218D-218E of FIGS. 2D-2E includes MD structures 262(4)-262(8) and gate structures 260(4)-260(8) rather than MD structures 262(1)-262(3) and gate structures 260(1)-260(3) of FIGS. 2B-2C. Relative to the X-axis, the locations of gate structures 260(4)-260(8) alternate with respect to MD structures 262(4)-262(8). Cell regions 218D-218E further include M0 conductors 268(7)-268(11), but does not include M0 conductor 268(2), as compared to FIGS. 2B-2C.

Ladder-hook 230(5) is an MD-based ladder-hook and has orientation 254(2). Ladder-hook 230(5) includes: a portion of MD structure 262(7) that represents second side 244 of bucket portion 233, the portion extending from slightly above alpha track α2 to slightly below alpha track α4; a portion of MD structure 262(8) that represents first side 242 of bucket portion 233, the portion extending from slightly above alpha track α2 to slightly below alpha track α4; a substantially entire portion of M0 conductor 268(9) that represents bottom 240 of bucket portion 233; a portion of M0 conductor 268(11) that represents tail portion 234 and which extends from slightly left of MD structure 262(8) to somewhere (not shown) right of gate structure 260(8), i.e., to slightly right of an MD structure (not shown) to the right of gate structure 260(8), the latter representing toe 232 of ladder-hook 230(5); an instance of VD structure 266 which couples an end portion of M0 conductor 268(6) of ladder-hook 230(3) to MD structure 262(7), the intersection of the end portion of M0 conductor 268(6) and MD structure 262(7) representing head 231 of ladder-hook 230(5); an instance of VD structure 266 which couples M0 conductor 268(9) to MD structure 262(7), i.e., which couples bottom 230 to first end 250 of second side 244 of bucket portion 233; an instance of VD structure 266 which couples M0 conductor 268(9) to MD structure 262(8), i.e., which couples bottom 230 to first end 246 of first side 242 of bucket portion 233; and an instance of VD structure 266 which couples MD structure 262(8) to M0 conductor 268 (11), i.e., which couples second end 248 of first side 242 of bucket portion 233 to first end 236 of tail portion 234. In FIGS. 2D-2E, horizontally-extending parts of ladder-hook 230(5) are aligned with corresponding even ones of the alpha tracks, namely alpha tracks α2 and α4.

Ladder-hook 230(4) is a gate-based ladder-hook and has orientation 254(1). Ladder-hook 230(4) includes: a portion of gate structure 260(6) that represents second side 244 of bucket portion 233, the portion extending from slightly above alpha track α1 to slightly below alpha track α3; a portion of gate structure 260(7) that represents first side 242 of bucket portion 233, the portion extending from slightly above alpha track α1 to slightly below alpha track α3; a substantially entire portion of M0 conductor 268(10) that represents bottom 240 of bucket portion 233; a portion of M0 conductor 268(8) that represents tail portion 234 and which extends from slightly left of gate structure 260(7) to slightly right of gate structure 260(8), the latter representing toe 232 of ladder-hook 230(4); an instance of VG structure 264 which couples an end portion of M0 conductor 268(7)

to gate structure 260(6), the intersection of the end portion of M0 conductor 268(7) and gate structure 260(6) representing head 231 of ladder-hook 230(4); an instance of VG structure 264 which couples M0 conductor 268(10) to gate structure 260(6), i.e., which couples bottom 230 to first end 250 of second side 244 of bucket portion 233; an instance of VG structure 264 which couples M0 conductor 268(10) to gate structure 260(7), i.e., which couples bottom 230 to first end 246 of first side 242 of bucket portion 233; and an instance of VG structure 264 which couples gate structure 260(7) to M0 conductor 268(8), i.e., which couples second end 248 of first side 242 of bucket portion 233 to first end 236 of tail portion 234. In FIGS. 2D-2E, horizontally-extending parts of gate-based ladder-hook 230(4) are aligned with corresponding odd ones of the alpha tracks, namely alpha tracks α1 and α3.

Gate-based ladder-hook 230(4) is interleaved with MD-based ladder-hook 230(5) relative to each of the X-axis and the Y-axis. The middle region of bottom 240 of gate-based ladder-hook 230(4) overlies the middle region of second side 244 of bucket portion 232 of MD-based ladder-hook 230(5), i.e., a portion of M0 conductor 268(10) of gate-based ladder-hook 230(4) overlies a portion of MD structure 262(7) of MD-based ladder-hook 230(5). The middle region of bottom 240 of MD-based ladder-hook 230(5) overlies the middle region of first side 242 of bucket portion 232 of gate-based ladder-hook 230(4), i.e., a portion of M0 conductor 268(9) of MD-based ladder-hook 230(5) overlies a portion of gate structure 260(7) of gate-based ladder-hook 230(4).

In FIGS. 2D-2E, no portion of ladder-hook 230(5) or ladder-hook 230(4) is aligned with alpha track α5. FIGS. 2D-2E reflect the first design rule (discussed above). In FIGS. 2D-2E, the reserved alpha track pursuant to the first design rule is alpha track α5. In some embodiments, the reserved alpha track is an alpha track other than alpha track α5. In some embodiments, the first design rule is not applied which results in a different version of cell region 218D.

In FIGS. 2D-2E, no portion of MD structure 262(6) is included in MD-based ladder-hooks 230(2) or 230(5). FIGS. 2D-2E reflect the second design rule, discussed above. In FIGS. 2A-2E, the reserved MD structure pursuant to the second design rule is MD structure 262(6). In some embodiments, reserved MD structure is one of MD structures 262(4)-262(5) or 262(7)-262(8). In some embodiments, the second design rule is not applied which results in a different version of cell region 218D.

In FIGS. 2D-2E, no portion of gate structure 260(8) is included in gate-based ladder-hooks 230(3) or 230(4). FIGS. 2D-2E reflect the third design rule, discussed above. In FIGS. 2A-2E, the reserved gate structure pursuant to the third design rule is gate structure 260(8). In some embodiments, reserved gate structure is one of gate structures 260(4)260(5). In some embodiments, the third design rule is not applied which results in a different version of cell region 218D. In some embodiments, the reserved gate structure is designated to become an isolation dummy gate (IDG).

Each of ladder-hooks 230(2), 230(3), 230(4) and 230(5) represents a corresponding resistor. Ladder-hooks 230(2) and 230(4) are coupled in series by the instance of VG structure 264 at the intersection of M0 conductor 268(7) and gate structure 260(6). Accordingly, first and second terminals of the resistor represented by series-coupled ladder-hooks 230(2) and 230(4) correspond to head 231 of ladder-hook 230(2) and toe 232 of ladder-hook 230(4). Ladder-hooks 230(3) and 230(5) are coupled in series by the instance of VD structure 266 at the intersection of M0 conductor 268(6) and MD structure 262(7). Accordingly, first and second terminals of the resistor represented by series-coupled ladder-hooks 230(3) and 230(5) correspond to head 231 of ladder-hook 230(3) and toe 232 of ladder-hook 230(5).

Regarding FIG. 2E, as a simplification, ARs 256D and 258D of FIG. 2D are omitted from FIG. 2E. Whereas FIG. 2D shows the outline of each of ladder-hooks 230(2)-230(5) but correspondingly does not fill the same with a combination of fill color and/or fill pattern, FIG. 2E shows each ladder-hooks 230(2)-230(5) correspondingly with a combination of fill color and/or fill pattern, e.g., to emphasize the shapes of ladder-hooks 230(5) and 230(4) and the interleaving thereof.

FIG. 2E additionally includes arrows which represent a current flow path from head 231 of ladder-hook 230(2) to toe 232 of ladder-hook 230(4). In some embodiments, depending upon how series-coupled ladder-hooks 230(2) and 230(4) are coupled to other components of a circuit, the current flow path is from toe 232 of ladder-hook 230(4) to head 231 of ladder-hook 230(2). FIG. 2E additionally includes arrows which represent a current flow path from toe 232 of ladder-hook 230(5) to head 231 of ladder-hook 230(3). In some embodiments, depending upon how series-coupled ladder-hooks 230(3) and 230(5) are coupled to other components of a circuit, the current flow path is from head 231 of ladder-hook 230(3) to toe 232 of ladder-hook 230(5).

Regarding FIGS. 2D-2E, in some embodiments, each of (1) series-coupled ladder-hooks 230(4) and 230(2) and (2) series-coupled ladder-hooks 230(3) and 230(5) represents a resistance of about 7.5 kiloohms (kΩ). In some embodiments in which cell region 218D (taken here as representative to cell regions 218D-218E) is entirely series-coupled internally (ESCI), i.e., in which (1) series-coupled ladder-hooks 230(4) and 230(2) is series-coupled to (2) series-coupled ladder-hooks 230(3) and 230(5), cell region 218D represents a resistance of about 15.0 kiloohms (kΩ). Recalling that cell region 218B (taken here as representative of cell regions 218B-218C) of FIG. 2B is 3 CPP, and that each cell region 218D (taken here as representative of cell regions 218D-218E) of FIG. 2D has a width of 5 CPP, cell region 218D is wider than cell region 218B. However, in some embodiments in which two instances of cell region 218B are abutted relative to the X-axis and are coupled in series, and in which each instance of cell region 218B is ESCI, the width of the two instances of cell region 218B is 6 CPP, i.e., is wider than a sole instance of cell region 218D. Such two instances of cell region 218B represent a resistance of 14.0 kiloohms (kΩ), which is less than the resistance of a sole instance of cell region 218E which is ESCI. As such, as compared to the two such instances of cell region 218B, the sole instance of cell region 218D which is ESCI is more efficient, e.g., in terms of resistance per unit area. As compared to the two such instances of cell region 218B, the sole instance of cell region 218D which is ESCI provides about a 7.1.% greater resistance while consuming about 16.7% less area, i.e., the footprint of latter is about 83.3% of the footprint of the former.

Figure 2F:
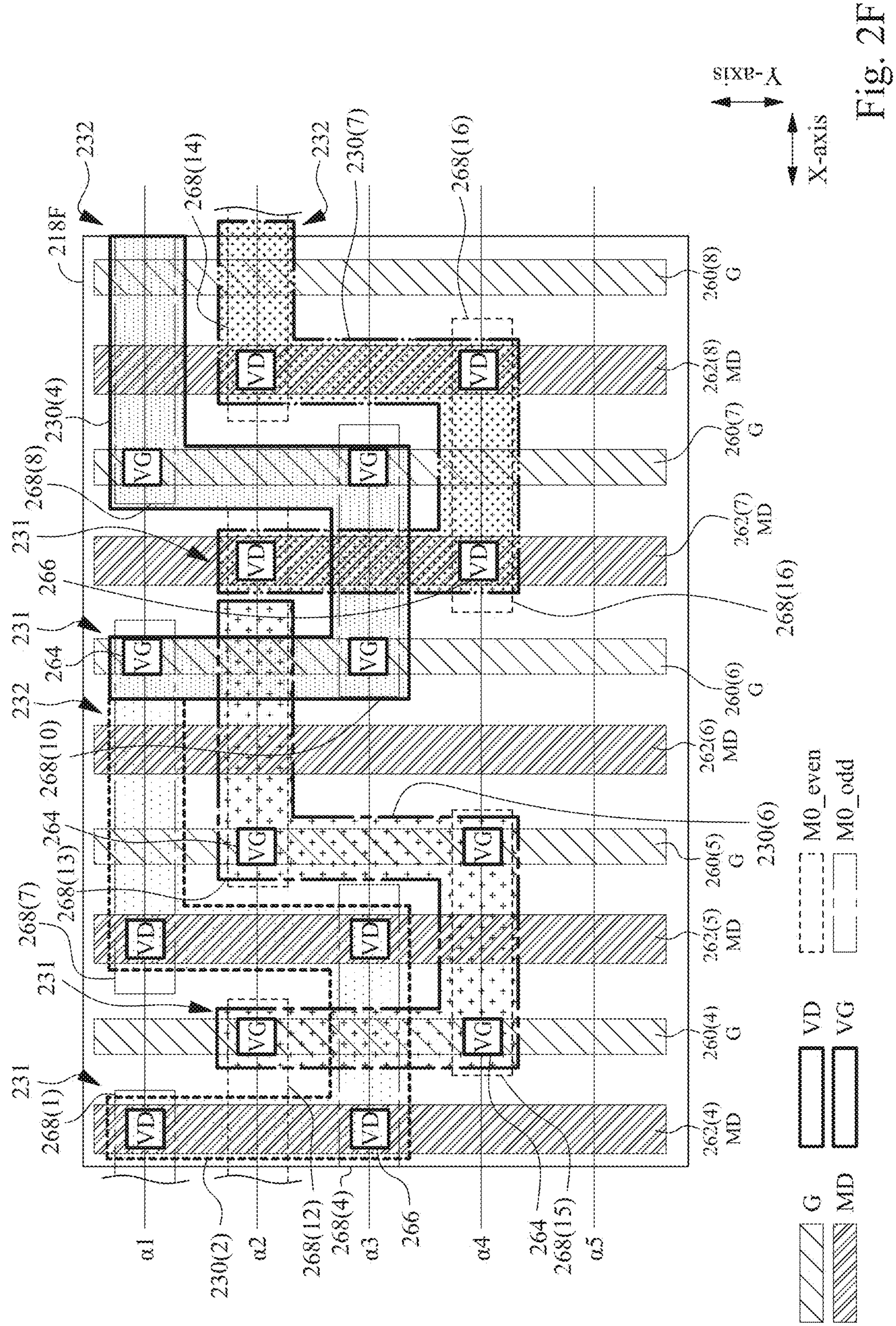

FIG. 2F is a layout diagram of a resistive-network cell region 218F, in accordance with some embodiments.

Cell region 218F is similar to cell region 218E of FIG. 2E. For brevity, the discussion will focus on differences of cell region 218F as compared to cell region 218E rather than on similarities.

In FIG. 2F, cell region 218F additionally includes gate-based ladder-hook 230(6) and MD-based ladder-hook 230(7), as compared to FIG. 2E. Also, cell region 218F does not include gate-based ladder-hook 230(3) nor MD-based ladder-hook 230(5) of FIG. 2E. Gate-based ladder-hook 230(6) replaces gate-based ladder-hook 230(3) of FIG. 2E, and MD-based ladder-hook 230(7) replaces MD-based ladder-hook 230(5) of FIG. 2E. Cell region 218F additionally includes M0 conductors 268(12), 268(13), 268(14), 268(15) and 268(16) as compared to cell region 218E. Cell region 218F does not include M0 conductors 268(3), 268(5), 268(6), 268(9) nor 268(11) of cell region 218E.

Ladder-hook 230(6) of FIG. 2F has orientation 254(1) whereas ladder-hook 230(3) of FIG. 2E has orientation 254(2), where orientation 254(2) is mirror symmetric with respect to orientation 254(1) relative to the X-axis. Ladder-hook 230(7) of FIG. 2F has orientation 254(1) whereas ladder-hook 230(5) has orientation 254(2). In FIG. 2F, the reserved alpha track is alpha track α5.

Ladder-hook 230(6) includes: a portion of gate structure 260(4) that represents second side 244 of bucket portion 233, the portion extending from slightly above alpha track α2 to slightly below alpha track α4; a portion of gate structure 260(5) that represents first side 242 of bucket portion 233, the portion extending from slightly above alpha track α2 to slightly below alpha track α4; a substantially entire portion of M0 conductor 268(15) that represents bottom 240 of bucket portion 233; a portion of M0 conductor 268(13) that represents tail portion 234 and which extends from slightly left of gate structure 260(5) to slightly right of gate structure 260(6), the latter representing toe 232 of ladder-hook 230(6); an instance of VG structure 264 which couples an end portion of M0 conductor 268(12) to gate structure 260(4), the intersection of the end portion of M0 conductor 268(12) and gate structure 260(4) representing head 231 of ladder-hook 230(6); an instance of VG structure 264 which couples M0 conductor 268(15) to gate structure 260(4), i.e., which couples bottom 230 to first end 250 of second side 244 of bucket portion 233; an instance of VG structure 264 which couples M0 conductor 268(15) to gate structure 260(5), i.e., which couples bottom 230 to first end 246 of first side 242 of bucket portion 233; and an instance of VG structure 264 which couples gate structure 260(5) to M0 conductor 268(13), i.e., which couples second end 248 of first side 242 of bucket portion 233 to first end 236 of tail portion 234. In FIG. 2F, horizontally-extending parts of gate-based ladder-hook 230(6) are aligned with corresponding even ones of the alpha tracks, namely alpha tracks α2 and α4.

Gate-based ladder-hook 230(6) is interleaved with each of MD-based ladder-hook 230(2) and gate-based ladder-hook 230(4), relative to each of the X-axis and the Y-axis. The middle region of bottom 240 of MD-based ladder-hook 230(2) overlies the middle region of second side 244 of bucket portion 232 of gate-based ladder-hook 230(6), i.e., a portion of M0 conductor 268(4) of MD-based ladder-hook 230(2) overlies a portion of gate structure 260(4) of gate-based ladder-hook 230(6). Second end 238 of tail portion 234 of gate-based ladder-hook 230(6) overlies a middle region of second side 244 of bucket portion 232 of gate-based ladder-hook 230(4), i.e., a portion of M0 conductor 268(13) of gate-based ladder-hook 230(6) overlies a portion of gate structure 260(6) of gate-based ladder-hook 230(4).

Ladder-hook 230(7) includes: a portion of MD structure 262(7) that represents second side 244 of bucket portion 233, the portion extending from slightly above alpha track α2 to slightly below alpha track α4; a portion of MD structure 262(8) that represents first side 242 of bucket portion 233, the portion extending from slightly above alpha track α2 to slightly below alpha track α4; a substantially entire portion of M0 conductor 268(16) that represents bottom 240 of bucket portion 233; a portion of M0 conductor 268(14) that represents tail portion 234 and which extends from slightly left of MD structure 262(8) to somewhere (not shown) right of gate structure 260(8), i.e., to slightly right of an MD structure (not shown) to the right of gate structure 260(8), the latter representing toe 232 of ladder-hook 230(7); an instance of VD structure 266 which couples an end portion of M0 conductor 268(13) of ladder-hook 230(7) to MD structure 262(7), the intersection of the end portion of M0 conductor 268(13) and MD structure 262(7) representing head 231 of ladder-hook 230(7); an instance of VD structure 266 which couples M0 conductor 268(16) to MD structure 262(7), i.e., which couples bottom 230 to first end 250 of second side 244 of bucket portion 233; an instance of VD structure 266 which couples M0 conductor 268(16) to MD structure 262(8), i.e., which couples bottom 230 to first end 246 of first side 242 of bucket portion 233; and an instance of VD structure 266 which couples MD structure 262(8) to M0 conductor 268(14), i.e., which couples second end 248 of first side 242 of bucket portion 233 to first end 236 of tail portion 234. In FIG. 2F, horizontally-extending parts of ladder-hook 230(7) are aligned with corresponding even ones of the alpha tracks, namely alpha tracks α2 and α4.

In FIG. 2F, each of ladder-hooks 230(2), 230(3), 230(6) and 230(7) represents a corresponding resistor. Ladder-hooks 230(2) and 230(4) are coupled in series by the instance of VG structure 264 at the intersection of M0 conductor 268(7) and gate structure 260(6). Accordingly, first and second terminals of the resistor represented by series-coupled ladder-hooks 230(2) and 230(4) correspond to head 231 of ladder-hook 230(2) and toe 232 of ladder-hook 230(4). Ladder-hooks 230(6) and 230(7) are coupled in series by the instance of VD structure 266 at the intersection of M0 conductor 268(13) and MD structure 262(7). Accordingly, first and second terminals of the resistor represented by series-coupled ladder-hooks 230(6) and 230(7) correspond to head 231 of ladder-hook 230(6) and toe 232 of ladder-hook 230(7).

Gate-based ladder-hook 230(4) is interleaved with MD-based ladder-hook 230(7) relative to each of the X-axis and the Y-axis. The middle region of bottom 240 of gate-based ladder-hook 230(4) overlies the middle region of second side 244 of bucket portion 232 of MD-based ladder-hook 230(7), i.e., a portion of M0 conductor 268(10) of gate-based ladder-hook 230(4) overlies a portion of MD structure 262(7) of MD-based ladder-hook 230(7).

Figure 2G:
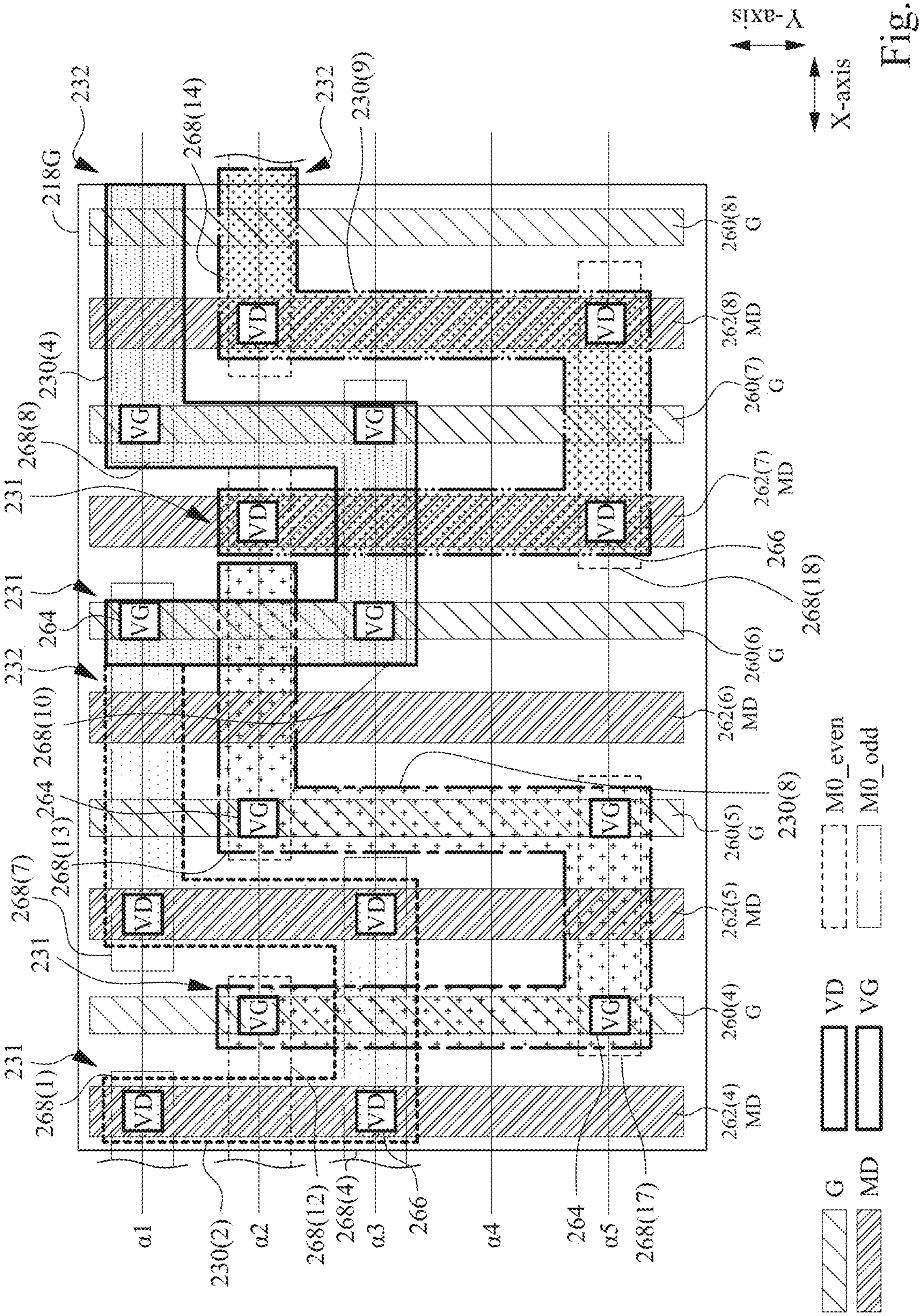

FIG. 2G is a layout diagram of a resistive-network cell region 218G, in accordance with some embodiments.

Cell region 218G is similar to cell region 218F of FIG. 2F. For brevity, the discussion will focus on differences of cell region 218G as compared to cell region 218F rather than on similarities.

In FIG. 2G, cell region 218G additionally includes gate-based ladder-hook 230(8) and MD-based ladder-hook 230(9), as compared to FIG. 2F. Also, cell region 218G does not include gate-based ladder-hook 230(6) nor MD-based ladder-hook 230(7) of FIG. 2F. Cell region 218G additionally includes M0 conductors 268(17) and 268(18) as compared to cell region 218F. Cell region 218G does not include M0 conductors 268(15) nor 268(16) of cell region 218F. In cell region 218G, gate-based ladder-hook 230(8) replaces gate-based ladder-hook 230(6) of FIG. 2F, and MD-based ladder-hook 230(9) replaces MD-based ladder-hook 230(7) of FIG. 2F.

Ladder-hook 230(8) of FIG. 2G has the same orientation 254(1) as the ladder-hook it replaces, namely ladder-hook 230(6) of FIG. 2F. Ladder-hook 230(9) of FIG. 2G has the same orientation 254(1) as the ladder-hook it replaces, namely ladder-hook 230(7) of FIG. 2F. In FIG. 2G, the reserved alpha track is alpha track α4.

Ladder-hook 230(8) includes: a portion of gate structure 260(4) that represents second side 244 of bucket portion 233, the portion extending from slightly above alpha track α2 to slightly below alpha track α5; a portion of gate structure 260(5) that represents first side 242 of bucket portion 233, the portion extending from slightly above alpha track α2 to slightly below alpha track α5; a substantially entire portion of M0 conductor 268(17) that represents bottom 240 of bucket portion 233; a portion of M0 conductor 268(13) that represents tail portion 234 and which extends from slightly left of gate structure 260(5) to slightly right of gate structure 260(6), the latter representing toe 232 of ladder-hook 230(8); an instance of VG structure 264 which couples an end portion of M0 conductor 268(12) to gate structure 260(4), the intersection of the end portion of M0 conductor 268(12) and gate structure 260(4) representing head 231 of ladder-hook 230(8); an instance of VG structure 264 which couples M0 conductor 268(17) to gate structure 260(4), i.e., which couples bottom 230 to first end 250 of second side 244 of bucket portion 233; an instance of VG structure 264 which couples M0 conductor 268(17) to gate structure 260(5), i.e., which couples bottom 230 to first end 246 of first side 242 of bucket portion 233; and an instance of VG structure 264 which couples gate structure 260(5) to M0 conductor 268(13), i.e., which couples second end 248 of first side 242 of bucket portion 233 to first end 236 of tail portion 234. In FIG. 2G, horizontally-extending parts of gate-based ladder-hook 230(8) are aligned corresponding with an even one and an odd one of the alpha tracks, namely alpha tracks α2 and α5.

Gate-based ladder-hook 230(8) is interleaved with each of MD-based ladder-hook 230(2) and gate-based ladder-hook 230(4), relative to each of the X-axis and the Y-axis. The middle region of bottom 240 of MD-based ladder-hook 230(2) overlies an interior region of second side 244 of bucket portion 232 of gate-based ladder-hook 230(8), i.e., a portion of M0 conductor 268(4) of MD-based ladder-hook 230(2) overlies a portion of gate structure 260(4) of gate-based ladder-hook 230(8). Second end 238 of tail portion 234 of gate-based ladder-hook 230(8) overlies a middle region of second side 244 of bucket portion 232 of gate-based ladder-hook 230(4), i.e., a portion of M0 conductor 268(13) of gate-based ladder-hook 230(8) overlies a portion of gate structure 260(6) of gate-based ladder-hook 230(4).

Ladder-hook 230(9) includes: a portion of MD structure 262(7) that represents second side 244 of bucket portion 233, the portion extending from slightly above alpha track α2 to slightly below alpha track α5; a portion of MD structure 262(8) that represents first side 242 of bucket portion 233, the portion extending from slightly above alpha track α2 to slightly below alpha track α5; a substantially entire portion of M0 conductor 268(18) that represents bottom 240 of bucket portion 233; a portion of M0 conductor 268(14) that represents tail portion 234 and which extends from slightly left of MD structure 262(8) to somewhere (not shown) right of gate structure 260(8), i.e., to slightly right of an MD structure (not shown) to the right of gate structure 260(8), the latter representing toe 232 of ladder-hook 230(9); an instance of VD structure 266 which couples an end portion of M0 conductor 268(13) of ladder-hook 230(9) to MD structure 262(7), the intersection of the end portion of M0 conductor 268(13) and MD structure 262(7) representing head 231 of ladder-hook 230(9); an instance of VD structure 266 which couples M0 conductor 268(18) to MD structure 262(7), i.e., which couples bottom 230 to first end 250 of second side 244 of bucket portion 233; an instance of VD structure 266 which couples M0 conductor 268(18) to MD structure 262(8), i.e., which couples bottom 230 to first end 246 of first side 242 of bucket portion 233; and an instance of VD structure 266 which couples MD structure 262(8) to M0 conductor 268 (14), i.e., which couples second end 248 of first side 242 of bucket portion 233 to first end 236 of tail portion 234. In FIG. 2G, horizontally-extending parts of ladder-hook 230(9) are aligned correspondingly with an even one and an odd one of the alpha tracks, namely alpha tracks α2 and α5.

Gate-based ladder-hook 230(4) is interleaved with MD-based ladder-hook 230(9) relative to each of the X-axis and the Y-axis. The middle region of bottom 240 of gate-based ladder-hook 230(4) overlies an interior region of second side 244 of bucket portion 232 of MD-based ladder-hook 230(9), i.e., a portion of M0 conductor 268(10) of gate-based ladder-hook 230(4) overlies a portion of MD structure 262(7) of MD-based ladder-hook 230(9).

In FIG. 2G, each of ladder-hooks 230(2), 230(3), 230(8) and 230(9) represents a corresponding resistor. Ladder-hooks 230(2) and 230(4) are coupled in series by the instance of VG structure 264 at the intersection of M0 conductor 268(7) and gate structure 260(6). Accordingly, first and second terminals of the resistor represented by series-coupled ladder-hooks 230(2) and 230(4) correspond to head 231 of ladder-hook 230(2) and toe 232 of ladder-hook 230(4). Ladder-hooks 230(8) and 230(9) are coupled in series by the instance of VD structure 266 at the intersection of M0 conductor 268(13) and MD structure 262(7). Accordingly, first and second terminals of the resistor represented by series-coupled ladder-hooks 230(8) and 230(9) correspond to head 231 of ladder-hook 230(8) and toe 232 of ladder-hook 230(9).

Figure 2H:
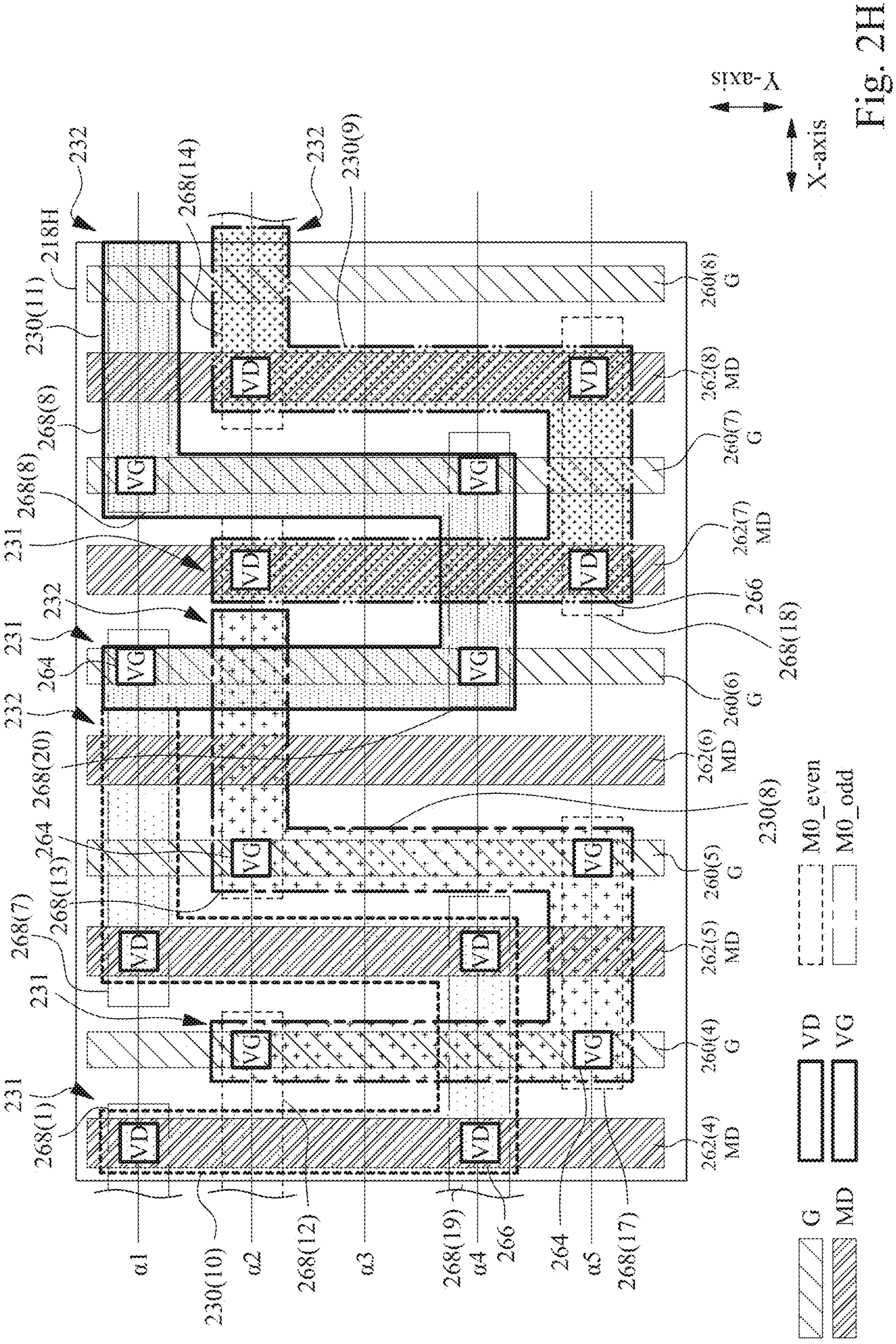

FIG. 2H is a layout diagram of a resistive-network cell region 218H, in accordance with some embodiments.

Cell region 218H is similar to cell region 218G of FIG. 2G. For brevity, the discussion will focus on differences of cell region 218H as compared to cell region 218G rather than on similarities.

In FIG. 2H, cell region 218H additionally includes MD-based ladder-hook 230(10) and gate-based ladder-hook 230 (11), as compared to FIG. 2G. Also, cell region 218H does not include MD-based ladder-hook 230(2) nor gate-based ladder-hook 230(4) of FIG. 2G. Cell region 218H additionally includes M0 conductors 268(19) and 268(20) as compared to cell region 218G. Cell region 218H does not include M0 conductors 268(4) nor 268(10) of cell region 218G. In cell region 218H, MD-based ladder-hook 230(10) replaces MD-based ladder-hook 230(2) of FIG. 2G, and gate-based ladder-hook 230(11) replaces gate-based ladder-hook 230(4) of FIG. 2G.

Ladder-hook 230(10) of FIG. 2H has the same orientation 254(1) as the ladder-hook it replaces, namely ladder-hook 230(2) of FIG. 2G. Ladder-hook 230(11) of FIG. 2H has the same orientation 254(1) as the ladder-hook it replaces, namely ladder-hook 230(4). In FIG. 2H, the reserved alpha track is alpha track α3.

Ladder-hook 230(10) includes: a portion of MD structure 262(4) that represents second side 244 of bucket portion 233, the portion extending from slightly above alpha track α1 to slightly below alpha track α4; a portion of MD structure 262(5) that represents first side 242 of bucket portion 233, the portion extending from slightly above alpha track α1 to slightly below alpha track α4; a substantially entire portion of M0 conductor 268(19) that represents bottom 240 of bucket portion 233; a portion of M0 conductor 268(7) that represents tail portion 234 and which extends from slightly left of MD structure 262(5) to slightly right of MD structure 262(6), the latter representing toe 232 of ladder-hook 230(10); an instance of VD structure 266 which couples an end portion of M0 conductor 268(1) to MD structure 262(4), the intersection of the end portion of M0 conductor 268(1) and MD structure 262(4) representing head 231 of ladder-hook 230(10); an instance of VD structure 266 which couples M0 conductor 268(19) to MD structure 262(4), i.e., which couples bottom 230 to first end 250 of second side 244 of bucket portion 233; an instance of VD structure 266 which couples M0 conductor 268(19) to MD structure 262(5), i.e., which couples bottom 230 to first end 246 of first side 242 of bucket portion 233; and an instance of VD structure 266 which couples MD structure 262(5) to M0 conductor 268(7), i.e., which couples second end 248 of first side 242 of bucket portion 233 to first end 236 of tail portion 234. In FIG. 2H, horizontally-extending parts of ladder-hook 230(10) are aligned correspondingly with an odd one and an even one of the alpha tracks, namely alpha tracks α1 and α4.

MD-based ladder-hook 230(10) is interleaved with gate-based ladder-hook 230(8) relative to each of the X-axis and the Y-axis. The middle region of bottom 240 of MD-based ladder-hook 230(10) overlies an interior region of second side 244 of bucket portion 232 of MD-based ladder-hook 230(8), i.e., a portion of M0 conductor 268(19) of MD-based ladder-hook 230(10) overlies a portion of gate structure 260(4) of gate-based ladder-hook 230(8).

Ladder-hook 230(11) includes: a portion of gate structure 260(6) that represents second side 244 of bucket portion 233, the portion extending from slightly above alpha track α1 to slightly below alpha track α4; a portion of gate structure 260(7) that represents first side 242 of bucket portion 233, the portion extending from slightly above alpha track α1 to slightly below alpha track α4; a substantially entire portion of M0 conductor 268(20) that represents bottom 240 of bucket portion 233; a portion of M0 conductor 268(8) that represents tail portion 234 and which extends from slightly left of gate structure 260(7) to slightly right of gate structure 260(8), the latter representing toe 232 of ladder-hook 230(11); an instance of VG structure 264 which couples an end portion of M0 conductor 268(7) to gate structure 260(6), the intersection of the end portion of M0 conductor 268(7) and gate structure 260(6) representing head 231 of ladder-hook 230(11); an instance of VG structure 264 which couples M0 conductor 268(20) to gate structure 260(6), i.e., which couples bottom 230 to first end 250 of second side 244 of bucket portion 233; an instance of VG structure 264 which couples M0 conductor 268(20) to gate structure 260(7), i.e., which couples bottom 230 to first end 246 of first side 242 of bucket portion 233; and an instance of VG structure 264 which couples gate structure 260(7) to M0 conductor 268(8), i.e., which couples second end 248 of first side 242 of bucket portion 233 to first end 236 of tail portion 234. In FIG. 2H, horizontally-extending parts of gate-based ladder-hook 230(11) are aligned corresponding with an odd one and an even one of the alpha tracks, namely alpha tracks α1 and α4.

Gate-based ladder-hook 230(11) is interleaved with MD-based ladder-hook 230(9), relative to each of the X-axis and the Y-axis. The middle region of bottom 240 of gate-based ladder-hook 230(11) overlies an interior region of second side 244 of bucket portion 232 of gate-based ladder-hook 230(9), i.e., a portion of M0 conductor 268(20) of gate-based ladder-hook 230(11) overlies a portion of MD structure 262(7) of MD-based ladder-hook 230(9).

In FIG. 2H, each of ladder-hooks 230(10), 230(11), 230(8) and 230(9) represents a corresponding resistor. Ladder-hooks 230(10) and 230(11) are coupled in series by the instance of VG structure 264 at the intersection of M0 conductor 268(7) and gate structure 260(6). Accordingly, first and second terminals of the resistor represented by series-coupled ladder-hooks 230(10) and 230(11) correspond to head 231 of ladder-hook 230(10) and toe 232 of ladder-hook 230(11). Ladder-hooks 230(8) and 230(9) are coupled in series by the instance of VD structure 266 at the intersection of M0 conductor 268(13) and MD structure 262(7). Accordingly, first and second terminals of the resistor represented by series-coupled ladder-hooks 230(8) and 230(9) correspond to head 231 of ladder-hook 230(8) and toe 232 of ladder-hook 230(9).

Figure 2I:
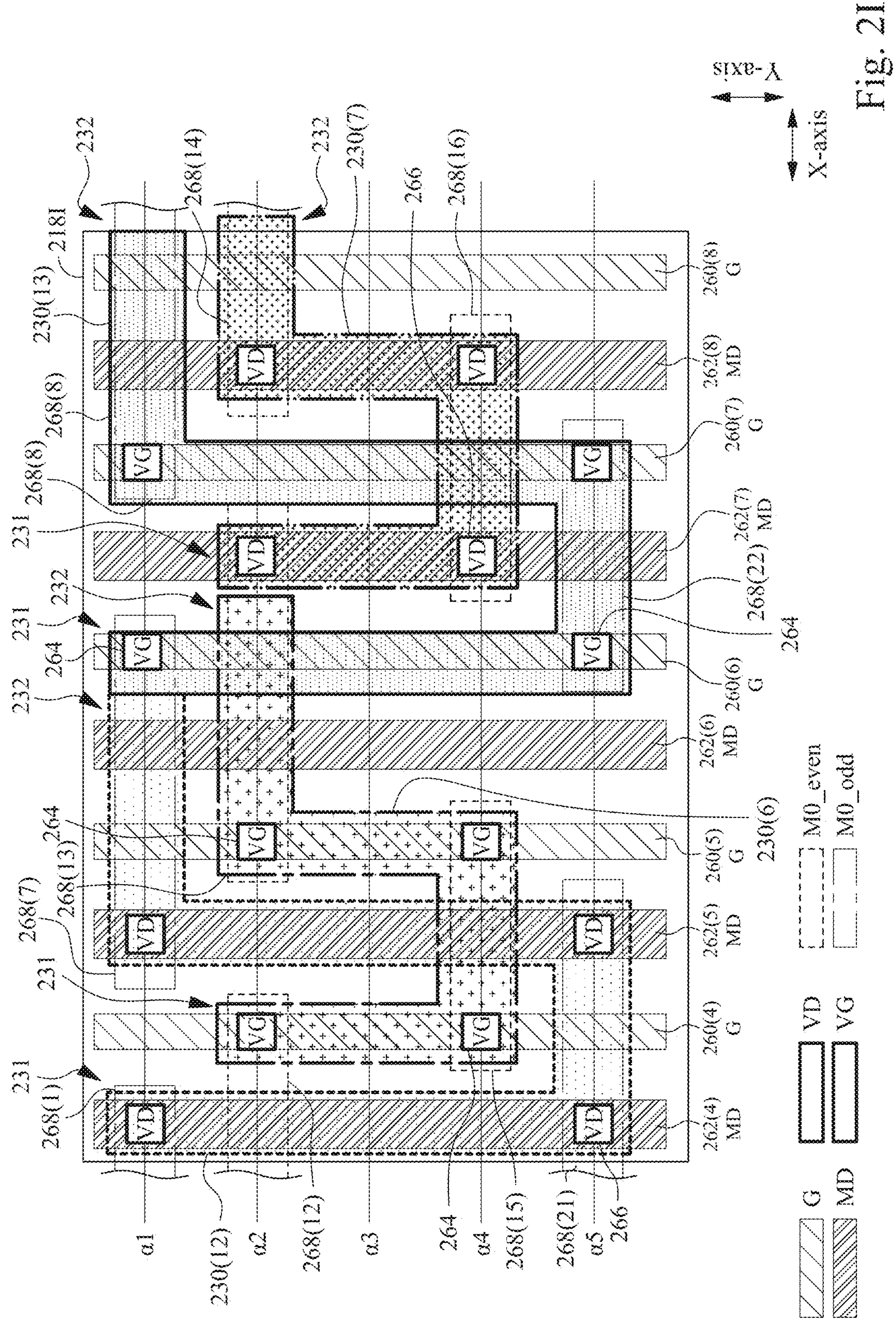

FIG. 2I is a layout diagram of a resistive-network cell region 218I, in accordance with some embodiments.

Cell region 218I is similar to cell region 218F of FIG. 2F. For brevity, the discussion will focus on differences of cell region 218I as compared to cell region 218F rather than on similarities.

In FIG. 2I, cell region 218I additionally includes MD-based ladder-hook 230(12) and gate-based ladder-hook 230(13), as compared to FIG. 2F. Also, cell region 218I does not include MD-based ladder-hook 230(2) nor gate-based ladder-hook 230(4) of FIG. 2F. In cell region 218I, MD-based ladder-hook 230(12) replaces MD-based ladder-hook 230(2) of FIG. 2F, and gate-based ladder-hook 230(13) replaces gate-based ladder-hook 230(4) of FIG. 2F. Cell region 218I additionally includes M0 conductors 268(21) and 268(22) as compared to cell region 218F. Cell region 218I does not include M0 conductors 268(4) nor 268(10) of cell region 218F.

Ladder-hook 230(12) of FIG. 2I has the same orientation 254(1) as the ladder-hook it replaces, namely ladder-hook 230(2) of FIG. 2F. Ladder-hook 230(13) of FIG. 2I has the same orientation 254(1) as the ladder-hook it replaces, namely ladder-hook 230(4). In FIG. 2I, the reserved alpha track is alpha track α3.

Ladder-hook 230(12) includes: a portion of MD structure 262(4) that represents second side 244 of bucket portion 233, the portion extending from slightly above alpha track α1 to slightly below alpha track α5; a portion of MD structure 262(5) that represents first side 242 of bucket portion 233, the portion extending from slightly above alpha track α1 to slightly below alpha track α5; a substantially entire portion of M0 conductor 268(21) that represents bottom 240 of bucket portion 233; a portion of M0 conductor 268(7) that represents tail portion 234 and which extends from slightly left of MD structure 262(5) to slightly right of MD structure 262(6), the latter representing toe 232 of ladder-hook 230(12); an instance of VD structure 266 which couples an end portion of M0 conductor 268(1) to MD structure 262(4), the intersection of the end portion of M0 conductor 268(1) and MD structure 262(4) representing head 231 of ladder-hook 230(12); an instance of VD structure 266 which couples M0 conductor 268(21) to MD structure 262(4), i.e., which couples bottom 230 to first end 250 of second side 244 of bucket portion 233; an instance of VD structure 266 which couples M0 conductor 268(21) to MD structure 262(5), i.e., which couples bottom 230 to first end 246 of first side 242 of bucket portion 233; and an instance of VD structure 266 which couples MD structure 262(5) to M0 conductor 268(7), i.e., which couples second end 248 of first side 242 of bucket portion 233 to first end 236 of tail portion 234. In FIG. 2I, horizontally-extending parts of ladder-hook 230(12) are aligned correspondingly with an odd one and an even one of the alpha tracks, namely alpha tracks α1 and α5.

MD-based ladder-hook 230(12) is interleaved with gate-based ladder-hook 230(6) relative to each of the X-axis and the Y-axis. The middle region of bottom 240 of gate-based ladder-hook 230(6) overlies an interior region of first side 242 of bucket portion 232 of MD-based ladder-hook 230 (12), i.e., a portion of M0 conductor 268(15) of gate-based ladder-hook 230(6) overlies a portion of MD structure 262(5) of MD-based ladder-hook 230(12).

Ladder-hook 230(13) includes: a portion of gate structure 260(6) that represents second side 244 of bucket portion 233, the portion extending from slightly above alpha track α1 to slightly below alpha track α5; a portion of gate structure 260(7) that represents first side 242 of bucket portion 233, the portion extending from slightly above alpha track α1 to slightly below alpha track α5; a substantially entire portion of M0 conductor 268(22) that represents bottom 240 of bucket portion 233; a portion of M0 conductor 268(8) that represents tail portion 234 and which extends from slightly left of gate structure 260(7) to slightly right of gate structure 260(8), the latter representing toe 232 of ladder-hook 230(13); an instance of VG structure 264 which couples an end portion of M0 conductor 268(7) to gate structure 260(6), the intersection of the end portion of M0 conductor 268(7) and gate structure 260(6) representing head 231 of ladder-hook 230(13); an instance of VG structure 264 which couples M0 conductor 268(22) to gate structure 260(6), i.e., which couples bottom 230 to first end 250 of second side 244 of bucket portion 233; an instance of VG structure 264 which couples M0 conductor 268(22) to gate structure 260(7), i.e., which couples bottom 230 to first end 246 of first side 242 of bucket portion 233; and an instance of VG structure 264 which couples gate structure 260(7) to M0 conductor 268(8), i.e., which couples second end 248 of first side 242 of bucket portion 233 to first end 236 of tail portion 234. In FIG. 2I, horizontally-extending parts of gate-based ladder-hook 230(13) are aligned correspondingly with an odd one and an even one of the alpha tracks, namely alpha tracks α1 and α5.

Gate-based ladder-hook 230(13) is interleaved with MD-based ladder-hook 230(7), relative to each of the X-axis and the Y-axis. The middle region of bottom 240 of MD-based ladder-hook 230(7) overlies an interior region of second side 244 of bucket portion 232 of gate-based ladder-hook 230 (13), i.e., a portion of M0 conductor 268(16) of MD-based ladder-hook 230(7) overlies a portion of gate structure 260(7) of gate-based ladder-hook 230(13).

In FIG. 2I, each of ladder-hooks 230(12), 230(13), 230(6) and 230(7) represents a corresponding resistor. Ladder-hooks 230(12) and 230(13) are coupled in series by the instance of VG structure 264 at the intersection of M0 conductor 268(7) and gate structure 260(6). Accordingly, first and second terminals of the resistor represented by series-coupled ladder-hooks 230(12) and 230(13) correspond to head 231 of ladder-hook 230(12) and toe 232 of ladder-hook 230(13). Ladder-hooks 230(6) and 230(7) are coupled in series by the instance of VD structure 266 at the intersection of M0 conductor 268(13) and MD structure 262(7). Accordingly, first and second terminals of the resistor represented by series-coupled ladder-hooks 230(6) and 230(7) correspond to head 231 of ladder-hook 230(6) and toe 232 of ladder-hook 230(7).

Figure 2J:
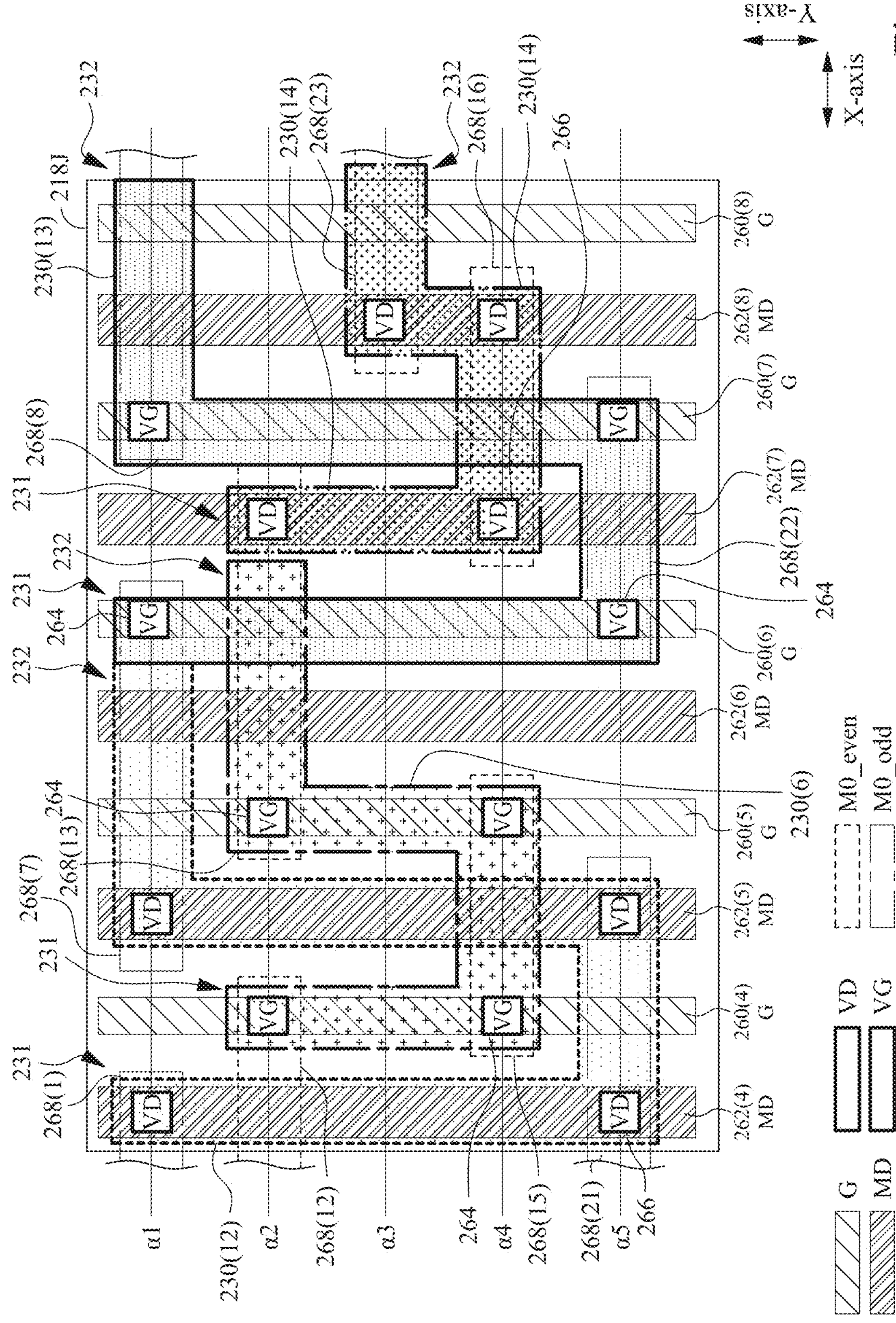

FIG. 2J is a layout diagram of a resistive-network cell region 218J, in accordance with some embodiments.

Cell region 218J is similar to cell region 218I of FIG. 2I. For brevity, the discussion will focus on differences of cell region 218J as compared to cell region 218I rather than on similarities.

In FIG. 2J, cell region 218J additionally includes MD-based ladder-hook 230(14), as compared to FIG. 2I. Also, cell region 218J does not include MD-based ladder-hook 230(7) of FIG. 2I. In cell region 218J, MD-based ladder-hook 230(14) replaces MD-based ladder-hook 230(7) of FIG. 2I. Cell region 218J additionally includes M0 conductor 268(23) as compared to cell region 218I. Cell region 218J does not include M0 conductor 268(14) of cell region 218I.

Ladder-hook 230(14) of FIG. 2J has the same orientation 254(1) as the ladder-hook it replaces, namely ladder-hook 230(7) of FIG. 2I. In FIG. 2J, no alpha track is reserved. Accordingly, FIG. 2J does not comply with the first design rule (discussed above).

Ladder-hook 230(14) includes: a portion of MD structure 262(7) that represents second side 244 of bucket portion 233, the portion extending from slightly above alpha track α2 to slightly below alpha track α4; a portion of MD structure 262(8) that represents first side 242 of bucket portion 233, the portion extending from slightly above alpha track α3 to slightly below alpha track α4; a substantially entire portion of M0 conductor 268(16) that represents bottom 240 of bucket portion 233; a portion of M0 conductor 268(23) that represents tail portion 234 and which extends from slightly left of MD structure 262(8) to somewhere (not shown) right of gate structure 260(8), i.e., to slightly right of an MD structure (not shown) to the right of gate structure 260(8), the latter representing toe 232 of ladder-hook 230(14); an instance of VD structure 266 which couples an end portion of M0 conductor 268(13) to MD structure 262(7), the intersection of the end portion of M0 conductor 268(13) and MD structure 262(7) representing head 231 of ladder-hook 230(14); an instance of VD structure 266 which couples M0 conductor 268(16) to MD structure 262(7), i.e., which couples bottom 230 to first end 250 of second side 244 of bucket portion 233; an instance of VD structure 266 which couples M0 conductor 268(16) to MD structure 262(8), i.e., which couples bottom 230 to first end 246 of first side 242 of bucket portion 233; and an instance of VD structure 266 which couples MD structure 262(8) to M0 conductor 268(23), i.e., which couples second end 248 of first side 242 of bucket portion 233 to first end 236 of tail portion 234. In FIG. 2J, horizontally-extending parts of ladder-hook 230(14) are aligned correspondingly with even ones and an odd one of the alpha tracks, namely alpha tracks α2, α3 and α4.

MD-based ladder-hook 230(14) is interleaved with gate-based ladder-hook 230(13) relative to each of the X-axis and the Y-axis. The middle region of bottom 240 of MD-based ladder-hook 230(14) overlies an interior region of first side 242 of bucket portion 232 of gate-based ladder-hook 230 (13), i.e., a portion of M0 conductor 268(16) of gate-based ladder-hook 230(14) overlies a portion of gate structure 260(7) of gate-based ladder-hook 230(13).

In FIG. 2J, each of ladder-hooks 230(12), 230(13), 230(6) and 230(14) represents a corresponding resistor. Ladder-hooks 230(12) and 230(13) are coupled in series by the instance of VG structure 264 at the intersection of M0 conductor 268(7) and gate structure 260(6). Accordingly, first and second terminals of the resistor represented by series-coupled ladder-hooks 230(12) and 230(13) correspond to head 231 of ladder-hook 230(12) and toe 232 of ladder-hook 230(13). Ladder-hooks 230(6) and 230(14) are coupled in series by the instance of VD structure 266 at the intersection of M0 conductor 268(13) and MD structure 262(7). Accordingly, first and second terminals of the resistor represented by series-coupled ladder-hooks 230(6) and 230(14) correspond to head 231 of ladder-hook 230(6) and toe 232 of ladder-hook 230(14).

Figure 2K:
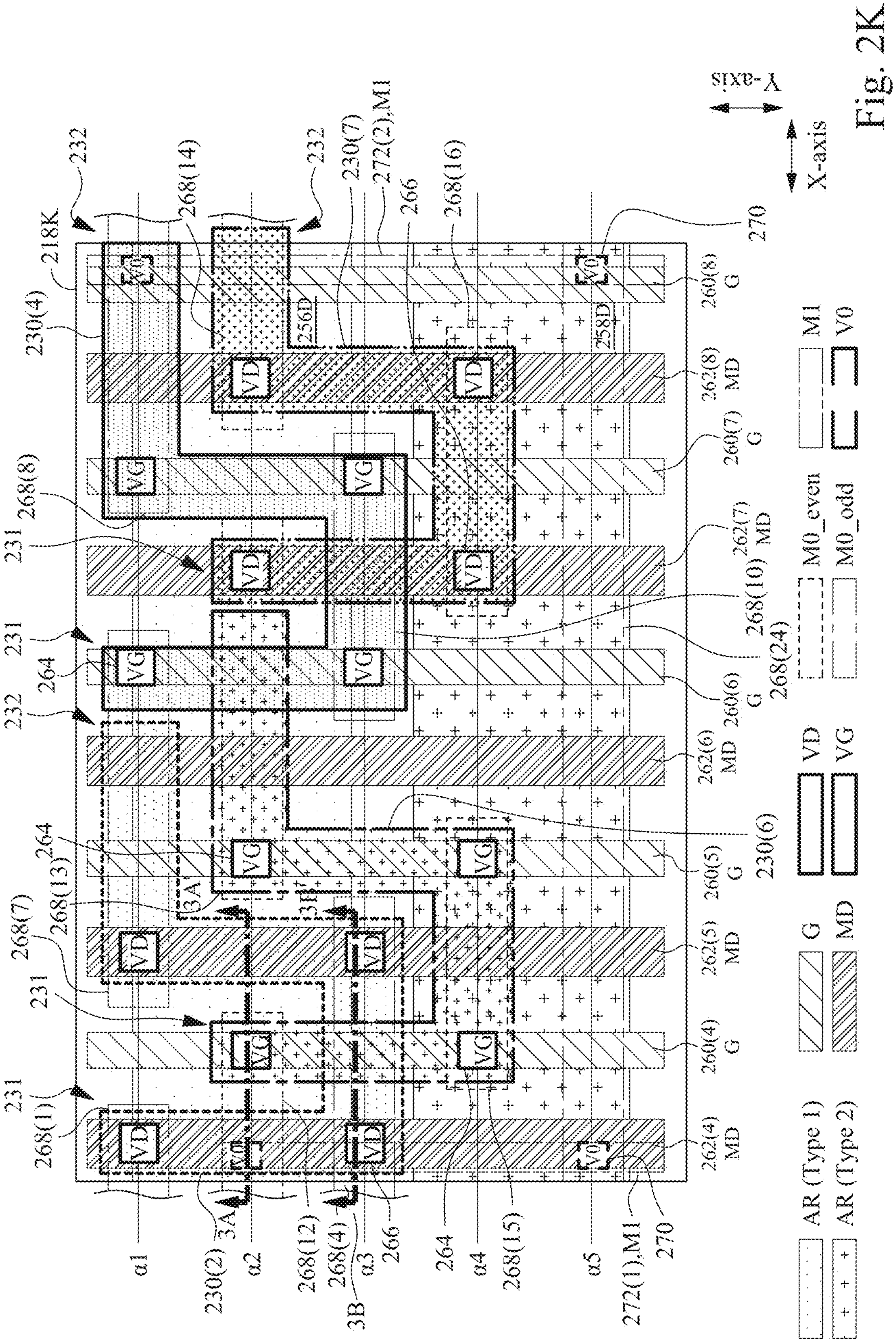

FIG. 2K is a layout diagram of a resistive-network cell region 218K, in accordance with some embodiments.

Cell region 218K is similar to cell region 218F of FIG. 2F. For brevity, the discussion will focus on differences of cell region 218K as compared to cell region 218F rather than on similarities.

Cell region 218K additionally includes M0 conductor 268(24) as compared to cell region 218F. M0 conductor 268(24) is aligned with alpha track α5. As such, no alpha track is reserved in FIG. 2K. Accordingly, FIG. 2K does not comply with the first design rule (discussed above).

In FIG. 2K, cell region 218I further includes a first layer of interconnection (VIA*1st) layer 375(5) (FIGS. 3A-3B), which is referred to herein as V0 layer 375(5) according to the assumed naming convention, and which is over M0 layer 375(4). In V0 layer 375(5), cell region 218K further includes instances of via-to-M*1st (VIA*1st) structure, i.e., via-to-M0 (V0) structure, 270 over corresponding ones of M0 conductors 268(8), 268(12) and 268(24). Relative to the Y-axis, V0 structures 270 are aligned correspondingly to alpha tracks α1, α2 and α5.

Cell region 218I further includes a second layer of metallization (M*2nd layer) 375(6) (FIGS. 3A-3B), which is referred to herein as M1 layer 375(6) according to the assumed naming convention, and which is over V0 layer 375(5). In M1 layer 375(6), cell region 218K further includes M*2nd conductors, i.e., M1 conductors, 272(1)-272(2) that extend parallel to the Y-axis and are over corresponding ones of V0 structure 272.

In FIG. 2K as in FIG. 2F, each of ladder-hooks 230(2), 230(4), 230(6) and 230(7) represents a corresponding resistor, and thus each of (1) series-coupled ladder-hooks 230(2) and 230(4) and (2) series-coupled ladder-hooks 230(6) and 230(7) represents a corresponding resistor. First and second terminals of the resistor represented by series-coupled ladder-hooks 230(6) and 230(7) correspond to head 231 of ladder-hook 230(6) and toe 232 of ladder-hook 230(7).

In FIG. 2K, M1 conductors 272(1)-272(2), M0 conductor 268(24) and corresponding instances of V0 structure 270 comprise a jumper that couples (1) series-coupled ladder-hooks 230(2) and 230(4) to (2) series-coupled ladder-hooks 230(6) and 230(7). Toe 232 of ladder-hook 230(4) is coupled by the jumper to head 231 of ladder-hook 230(6). In FIG. 2K, the jumper is within the boundaries of cell region 218K. In some embodiments, at least a part of the jumper is outside the boundaries of cell region 218K.

Cell region 218K is entirely series-coupled internally (ESCI), i.e., (1) series-coupled ladder-hooks 230(2) and 230(4) are coupled in series by the jumper to (2) series-coupled ladder-hooks 230(6) and 230(7). Accordingly, the resistor represented by series-coupled ladder-hooks 230(2), 230(4), 230(6) and 230(7) has as a first terminal represented by head 231 of ladder-hook 230(2) and a second terminal represented by toe 232 of ladder-hook 230(7).

Figure 3A:
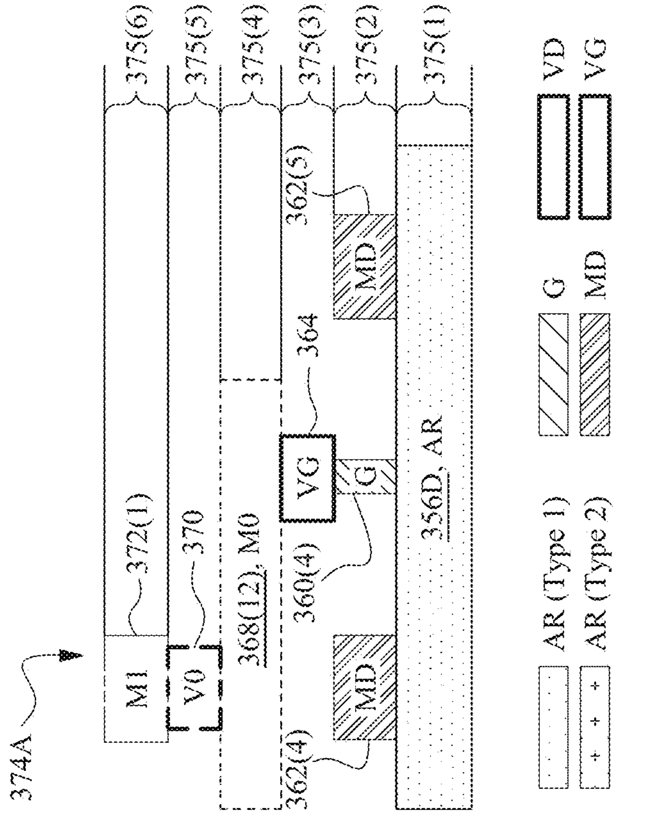
FIGS. 3A-3B are corresponding cross-sections, in accordance with some embodiments.

In cell region 218K, section line 3A-3A', which is corresponds to cross-section 374A of FIG. 3A. Section line 3A-3A' is shown as a phantom (dashed) line and is located in FIG. 2K approximately at the intersection of a group including MD structure 262(4), gate structure 260(4) and MD structure 262(5) with alpha track α2. Section line 3B-3B', which is shown as a phantom (dashed) line, corresponds to cross-section 374B of FIG. 3B. Section line 3B-3B' is also shown as a phantom (dashed) line and is located in FIG. 2K approximately at the intersection of the group including MD structure 262(4), gate structure 260(4) and MD structure 262(5) with alpha track α3.

Figure 2L:
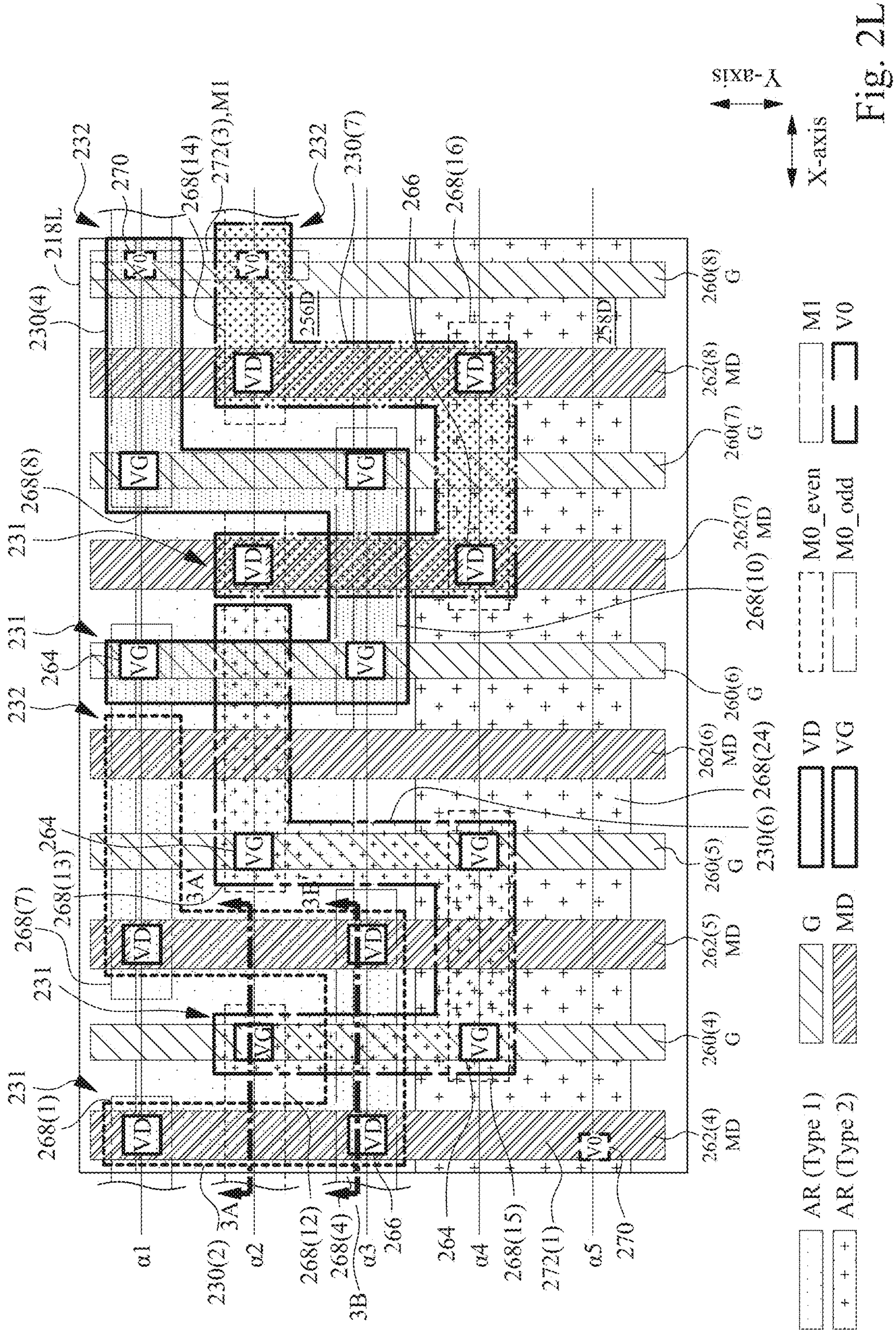
Figure 2N:
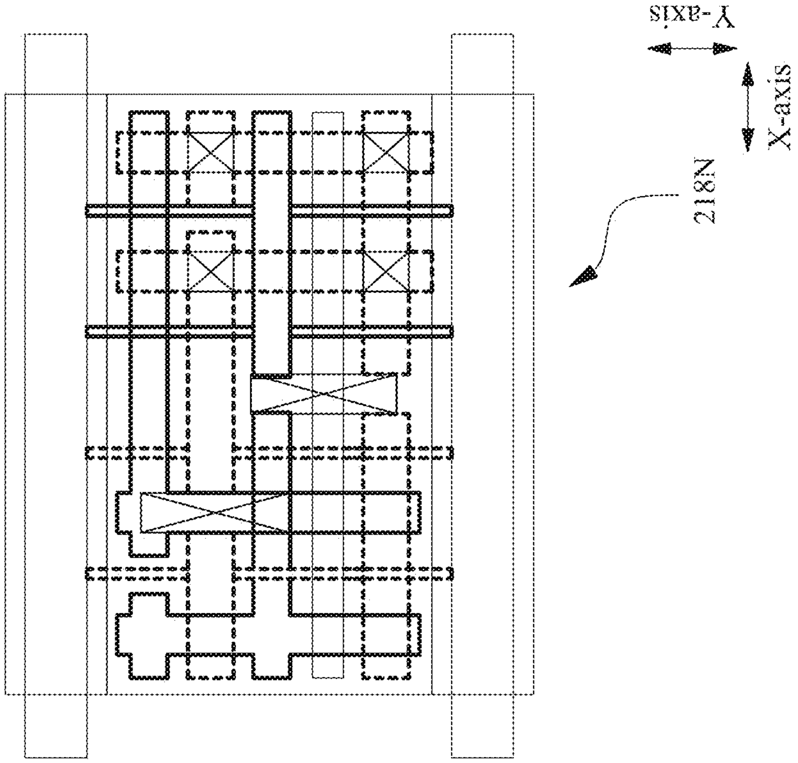
Figure 2M:
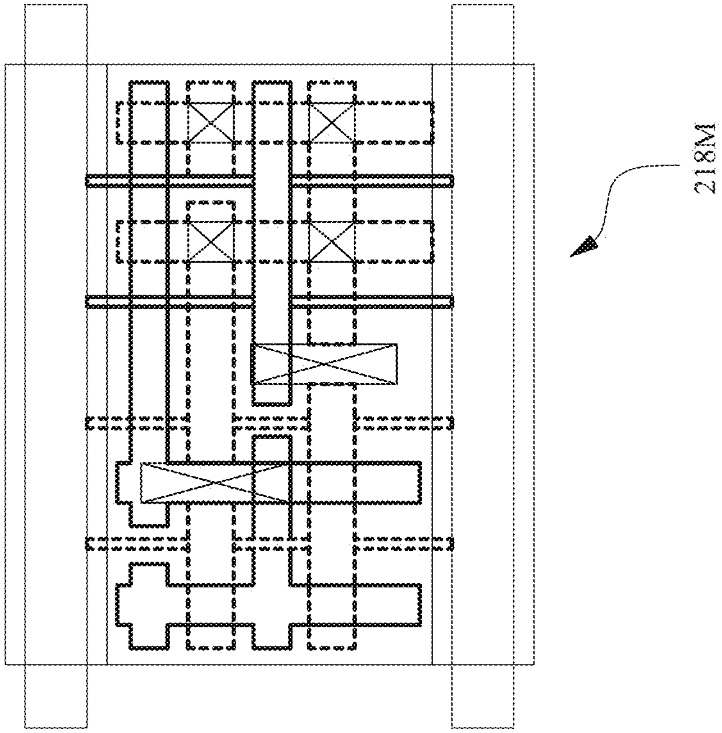
Figure 2P:
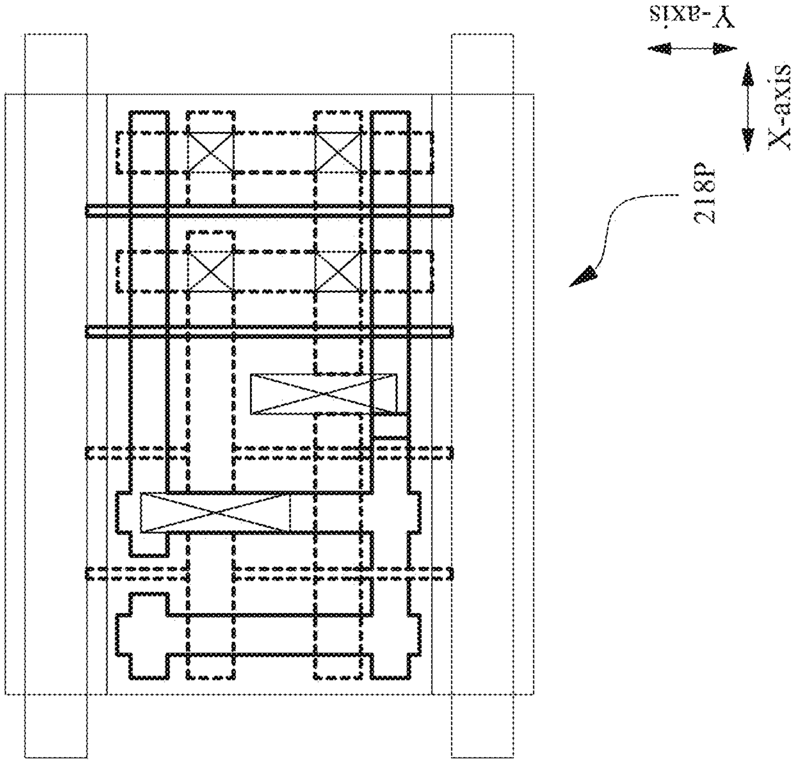
Figure 2O:
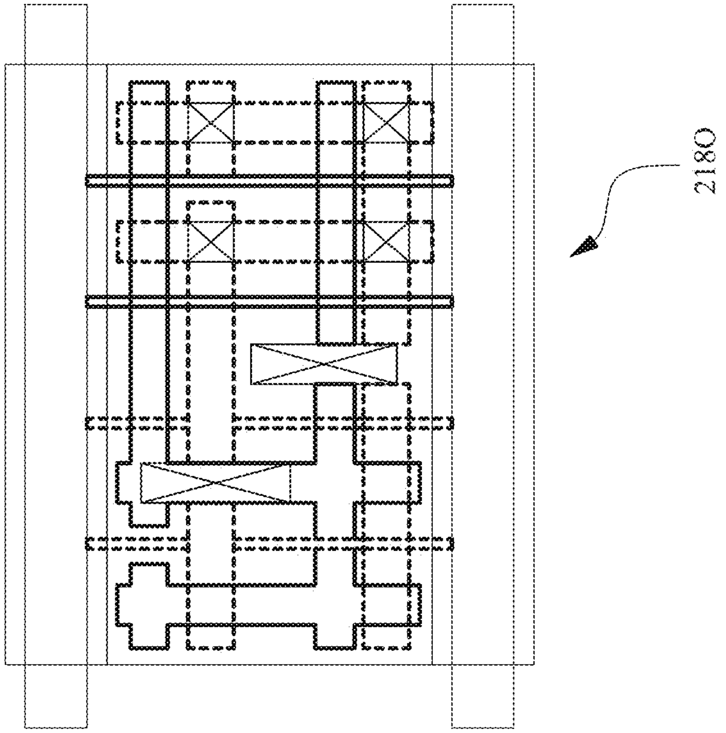
Figure 2Q:
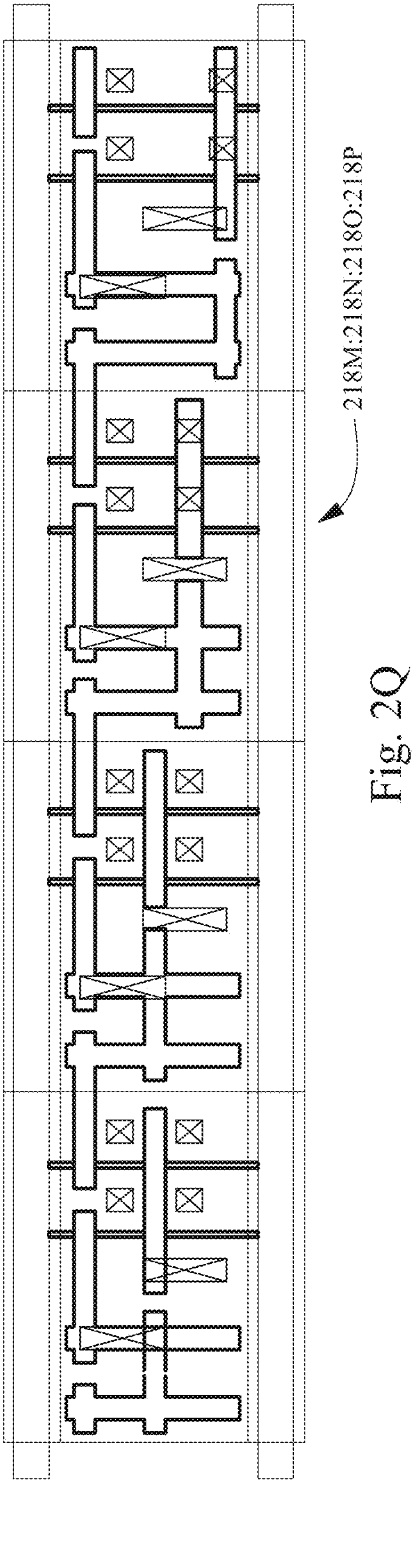

FIG. 2L is a layout diagram of a resistive-network cell region 218L, in accordance with some embodiments.

Cell region 218L is similar to cell region 218K of FIG. 2K. For brevity, the discussion will focus on differences of cell region 218L as compared to cell region 218K rather than on similarities.

Cell region 218L additionally includes M1 conductor 272(3) as compared to cell region 218K. Cell region does not include M1 conductors 272(1)-272(2) of cell region 218K. Furthermore, cell region 218L does not include M0 conductor 268(24) of cell region 218K. Accordingly, FIG. 2L does comply with the first design rule (discussed above) whereas FIG. 2K does not.

In FIG. 2L as in FIG. 2K, each of ladder-hooks 230(2), 230(4), 230(6) and 230(7) represents a corresponding resistor, and thus each of (1) series-coupled ladder-hooks 230(2) and 230(4) and (2) series-coupled ladder-hooks 230(6) and 230(7) represents a corresponding resistor. First and second terminals of the resistor represented by series-coupled ladder-hooks 230(6) and 230(7) correspond to head 231 of ladder-hook 230(6) and toe 232 of ladder-hook 230(7).

In FIG. 2L, M1 conductor 272(3) and corresponding instances of V0 structure 270 comprise a jumper that couples (1) series-coupled ladder-hooks 230(2) and 230(4) to (2) series-coupled ladder-hooks 230(6) and 230(7). Toe 232 of ladder-hook 230(4) is coupled by the jumper to toe 232 of ladder-hook 230(7). In FIG. 2L, the jumper is within the boundaries of cell region 218L. In some embodiments, at least a part of the jumper is outside the boundaries of cell region 218L.

Cell region 218L is entirely series-coupled internally (ESCI), i.e., (1) series-coupled ladder-hooks 230(2) and 230(4) are coupled in series by the jumper to (2) series-coupled ladder-hooks 230(6) and 230(7). Accordingly, the resistor represented by series-coupled ladder-hooks 230(2), 230(4), 230(6) and 230(7) has as a first terminal represented by head 231 of ladder-hook 230(2) and a second terminal represented by head 231 of ladder-hook 230(6).

FIGS. 2M-2P are layout diagrams of corresponding resistive-network cell regions 218M, 218N, 218O and 218P, in accordance with some embodiments.

Figure 4A:
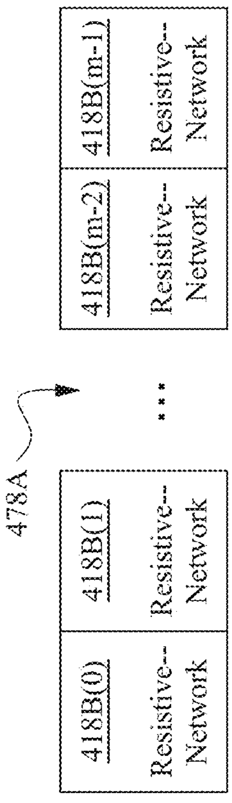
FIGS. 4A-4G are block diagrams of corresponding abutment arrangements, in accordance with some embodiments.

Relative to the X-axis, each of cell regions 218M-218P has a width of 4 CPP and a height of 5 TP, five alpha tracks are overlapped by each of cell regions 218M-218P. Also, relative to the X-axis, each of cell regions 218M-218P is abuttable (FIGS. 2Q-2R, 4A, or the like).

FIG. 2Q is a layout diagram of abutted resistive-network cell regions, in accordance with some embodiments.

In FIG. 2Q, relative to the X-axis, cell regions 218M-218P of corresponding FIGS. 2M-2P are abutted in a sequence: 218M:218N:218O:218P.

Figure 2R:
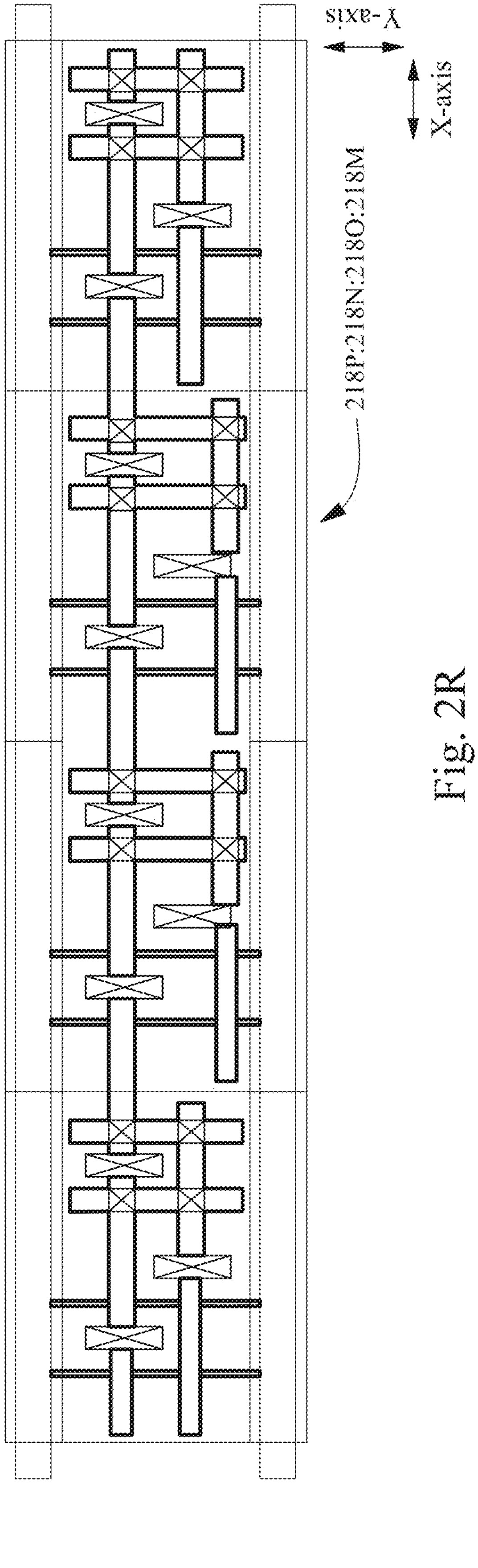

FIG. 2R is a layout diagram of abutted resistive-network cell regions, in accordance with some embodiments.

In FIG. 2R, relative to the X-axis, cell regions 218M-218P of corresponding FIGS. 2M-2P are abutted in a sequence: 218P:218N:218O:218M.

Figure 3B:
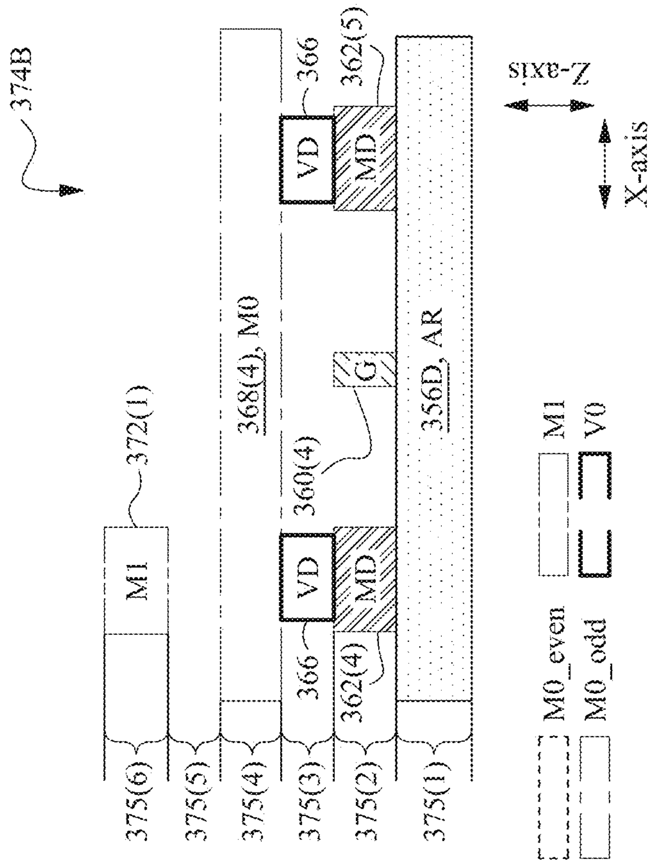

FIGS. 3A-3B are corresponding cross-sections 374A and 337B of a semiconductor device based on cell region 218K of FIG. 2K, in accordance with some embodiments.

Cross-sections 374A-374B are corresponding parts of a cell region of a semiconductor device which is fabricated based on a larger layout diagram which includes a smaller layout diagram such as one or more of the layout diagrams disclosed herein, e.g., the layout diagram of cell region 218K of FIG. 2K.

Cross-sections 374A-374B follow a similar numbering scheme to that of the layout diagram of cell region 218K of FIG. 2K. Though some components correspond, such components also differ. To help identify components which correspond but nevertheless have differences, the numbering convention uses 3-series numbers for cross-sections 374A-374B while FIG. 2K uses 2-series numbers. For example, MD structure 362(4) in FIGS. 3A-3B corresponds to MD structure 262(4) in FIG. 2K, with similarities being reflected in the common root _62(_) and the common parenthetical ____(4), and with the differences being reflected in the corresponding leading digit 3__(_) and 2__(_). For brevity, the discussion will focus more on differences between FIGS. 3A-3B and FIG. 2K than on similarities.

Regarding FIG. 3A, cross-section 374A corresponds to section line 3A-3A' in FIG. 2K. Regarding FIG. 3B, cross-section 374B corresponds to section line 3B-3B' in FIG. 2K. Each of FIGS. 3A-3B includes layers 375(1)-375(6).

In each of FIGS. 3A-3B, AR layer 375(1) includes AR 356D. In each of FIGS. 3A-3B, GMD layer 375(2) includes gate structure 360(4) and MD structures 362(4) and 362(5). In FIG. 3A, VGD layer 375(3) includes an instance of VG structure 364. In FIG. 3B, VGD layer 375(3) includes instances of VD structure 366. In FIG. 3A, M0 layer 374(4) includes M0 conductor 368(12). In FIG. 3B, M0 layer 374(4) includes M0 conductor 368(4). In FIG. 3A, V0 layer 375(5) includes an instance of V0 structure 370. In FIG. 3A, M1 layer 375(6) includes M1 conductor 372(1).

FIGS. 4A-4G are block diagrams of corresponding abutment arrangements 478A, 478B, 478C, 478D, 478E, 478F and 478G of resistive-network cell regions, in accordance with some embodiments.

Abutment arrangements 478A-478G follow a similar numbering scheme to that of cell regions 218B-218L of corresponding FIGS. 2B-2L. Though some components correspond, such components also differ. To help identify components which correspond but nevertheless have differences, the numbering convention uses 4-series numbers for abutment arrangements 478A-478G while FIGS. 2K-2L use 2-series numbers. For example, instances of a V0 structure (if present and if numbered) in FIGS. 4A-4G are assigned number 470 whereas instances of V0 (if numbered) in FIGS. 2K-2L are assigned number 270.

Cell regions 418B(0)-418B(m−1) are coupled together (variously in series and/or in parallel (FIGS. 4B-4D, or the like) in a manner that represents a resistor, e.g., resistor Rref of FIGS. 1B-1H, having first and second terminals. In some embodiments, each of cell regions 418B(0)-418B(m−1) includes first and second resistive-sub-networks, i.e., first and second ladder-hooks, e.g., as in FIGS. 2B-2J, or the like.

In FIG. 4A, abutment arrangement 478A includes resistive-network cell regions 418B(0), 418B(1), . . . , 418B(m−2) and 418B(m−1) which abut each other relative to a first direction, e.g., parallel to X-axis, and where m is a positive integer equal to or greater than 2, i.e., 2≤m.

Relative to the X-axis, FIG. 4A shows pairs of adjacent cell regions, e.g., 418B(1) and 418B(2), abutting horizontally with substantially no space between. In some embodiments (not shown), depending upon design considerations, e.g., routing, or the like, not every pair of adjacent cell regions is horizontally abutting, i.e., a significant space exists between one or more corresponding pairs of adjacent cell regions 418B(0)-418B(m−1).

Regarding FIGS. 4B-4D and 4F-4G, in each cell region, each ladder-hook is represented with a resistor symbol. For example, in FIG. 4B, each of ladder-hooks 480(0) and 482(0) in cell region 418B(0) and ladder-hooks 480(*m*−1) and 482(*m*−1) in cell region 418(*m*−1) is shown with a resistor symbol.

Figure 4B:
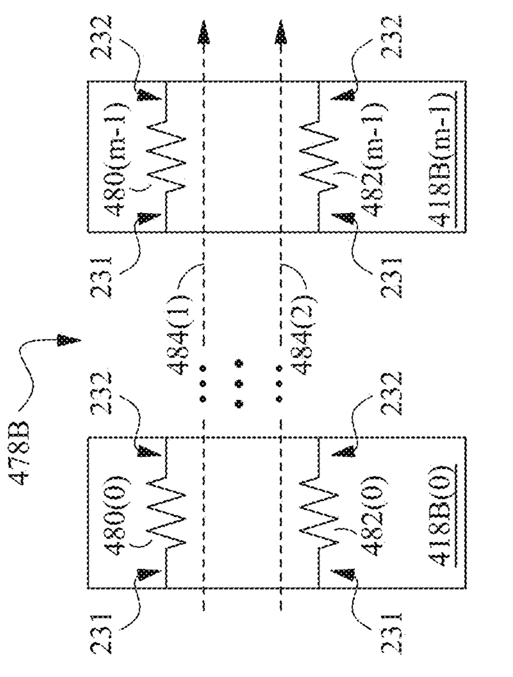

In FIG. 4B, the first and second ladder-hooks of each of cell regions 418B(0)-418B(m−1) are coupled together (variously in series and/or in parallel (FIGS. 4B-4D, or the like) in a manner that represents a resistor Rref having first and second terminals. In some embodiments, one or more of cell regions 418B(0)-418B(m−1) is entirely series-coupled internally (ESCI), i.e., the first ladder-hook is series-coupled to the second ladder-hook, as in FIGS. 2K-2L, 4D, or the like.

Regarding FIG. 4B, in abutment arrangement 478B, ladder-hooks 480(*i*) in cell regions 418B(0)-418B(m−1) are coupled in series as indicated by current path 484(1), where i is a variable, i is an integer and i is a range 0≤i≤(m−1). Toe 232 of ladder-hook 480(0) of cell region 418B(0) is coupled to head 231 of ladder-hook 480(1) (not shown) of cell region 418B(1) (not shown) . . . . Toe 232 of ladder-hook 480(*m*−2) (not shown) of cell region 418B(m−2) is coupled to head 231 of ladder-hook 480(*m*−1) of cell region 418B(m−1). Accordingly, ladder-hooks 480(0)-480(*m*−1) of corresponding cell regions 418B(0)-418B(m−1) represent a first resistor. Head 231 of ladder-hook 480(0) of cell region 418B(0) represents a first terminal of the first resistor. Toe 232 of ladder-hook 480(*m*−1) of cell region 418B(m−1) represents a second terminal of the first resistor. Similarly, in abutment arrangement 478B of FIG. 4B, ladder-hooks 482(*i*) in cell regions 418B(0)-418B(m−1) are coupled in series as indicated by current path 484(2).

Figure 4C:
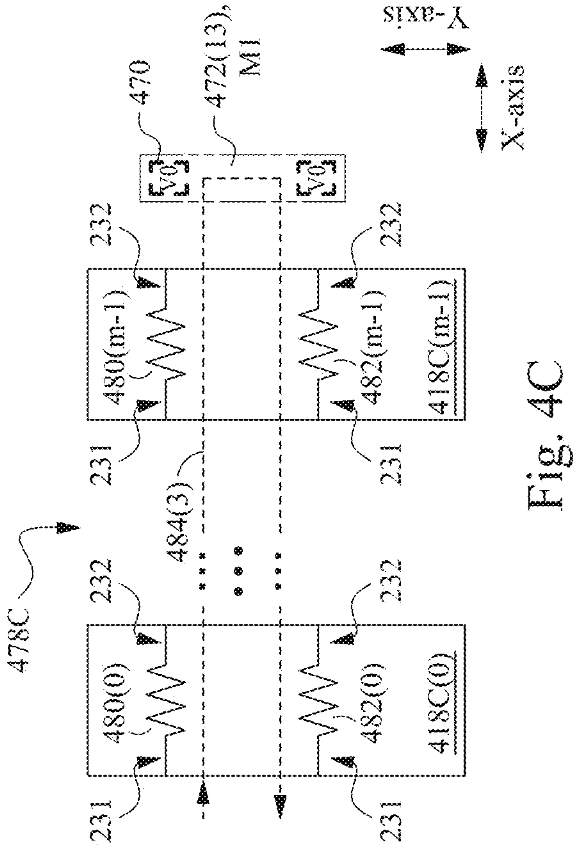

Regarding FIG. 4C, abutment arrangement 478C is similar to abutment arrangement 478B of FIG. 4B. For brevity, the discussion will focus on differences of abutment arrangement 478C as compared to abutment arrangement 478B rather than on similarities. Abutment arrangement 478C additionally includes M1 conductor 472(13) and instances of V0 structure 470, as compared to abutment arrangement 478B.

In FIG. 4C, M1 conductor 472(13) and corresponding instances of V0 structure 470 comprise a first jumper that couples current paths 484(1) and 484(2) of cell region 418C(m−1) to form current path 484(3). Toe 232 of ladder-hook 480(*m*−1) of cell region 418C(m−1) is coupled by the first jumper to toe 232 of ladder-hook 482(*m*−1) of cell region 418B(m−1). In some embodiments, M1 conductor 472(13) is substantially within the boundaries of cell region 418B(m−1) such that cell region 418B(m−1) has an ESCI configuration. Series-coupled ladder-hooks 480(0)-480(*m*−1) of corresponding cell regions 418C(0)-418C(m−1) are coupled in series by the first jumper to series-coupled ladder-hooks 482(*m*−1)-482(0) of corresponding cell regions 418C(m−1)-418C(0). Accordingly, series-coupled ladder-hooks 480(0)-480(*m*−1) and 482(*m*−1)-482(0) represent a third resistor. Head 231 of ladder-hook 480(0) of cell region 418C(0) represents a first terminal of the third resistor. Head 231 of ladder-hook 482(0) of cell region 418C(0) represents a second terminal of the third resistor. In some embodiments, current path 484(3) is described as having a serpentine shape.

Figure 4D:
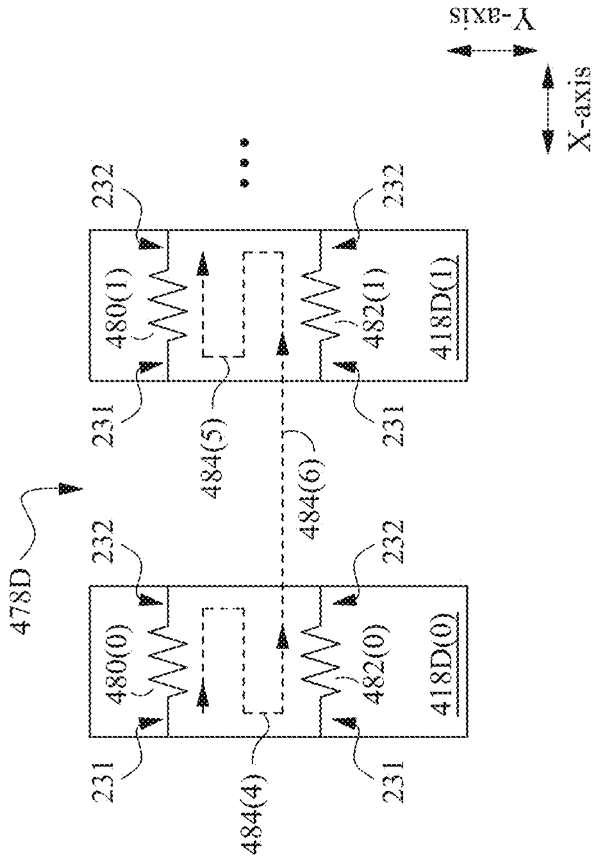

Regarding FIG. 4D, abutment arrangement 478D shows cell regions 418D(0)-418D(1) but does not show cell regions 418D(2)-418D(m−1), the latter not being shown for simplicity of illustration. In some embodiments, each of cell regions 418D(0)-418D(m−1) has an ESCI configuration.

In cell region 418D(0), ladder-hook 480(0) is coupled in series to ladder-hook 482(0) as indicated by current path 484(4). In cell region 418D(1), ladder-hook 480(1) is coupled in series to ladder-hook 482(1) as indicated by current path 484(5). Current paths 484(4) and 484(5) are coupled to each other, as indicated by current path 484(6). In some embodiments, each of current paths 484(4) and 484(5) is described as having a serpentine shape.

In FIG. 4D, relative to a long axis of symmetry parallel to a second direction, e.g., a direction parallel to the Y-axis, cell region 418D(0) has a first orientation. More generally, even-numbered ones of cell regions 418D(0)-418D(m−1) have the first orientation, i.e., cell regions 418D(j) have the first orientation, where j is an integer, j is in a range (0)≤j≤(m−1), and j=2k, where k is a non-negative integer.

Also in FIG. 4D, relative to a long axis of symmetry parallel to the Y-axis, cell region 418D(1) has a second orientation. Relative to the Y-axis, the second orientation is mirror symmetric with respect to the first orientation. More generally, odd-numbered ones of cell regions 418D(0)-418D(m−1) have the second orientation, i.e., cell regions 418D(q) have the second orientation, where q is an integer, q is in a range (0)≤q≤(m−1), and q=(2k+1), where k is a non-negative integer.

In FIG. 4D, in cell region 418D(0), toe 232 of ladder-hook 480(0) is coupled toe 232 of ladder-hook 482(0). Toe 232 of ladder-hook 482(0) is coupled to head 231 of ladder-hook 482(1) of cell region 418D(1). In cell region 418D(1), toe 232 of ladder-hook 482(1) is coupled head 231 of ladder-hook 480(1).

Figure 4G:
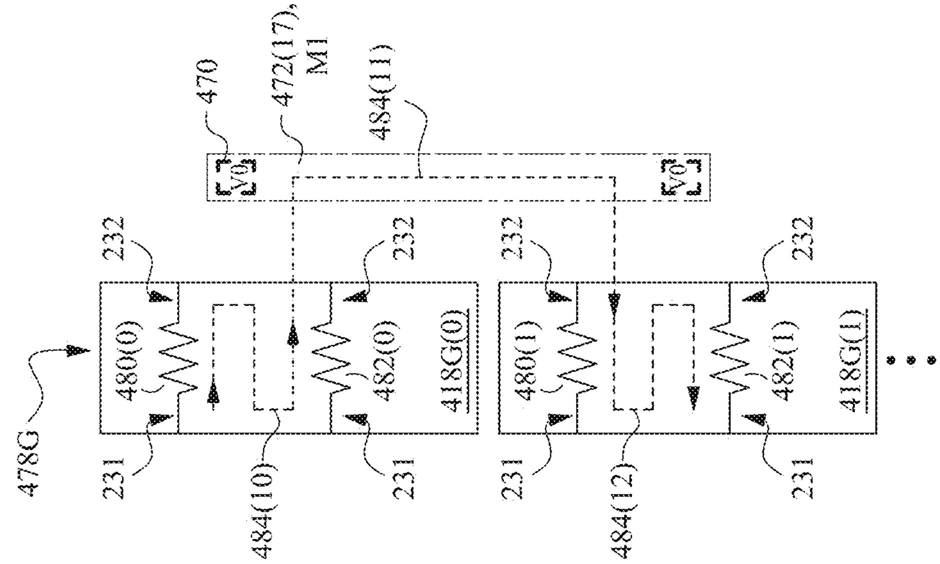
Figure 4F:
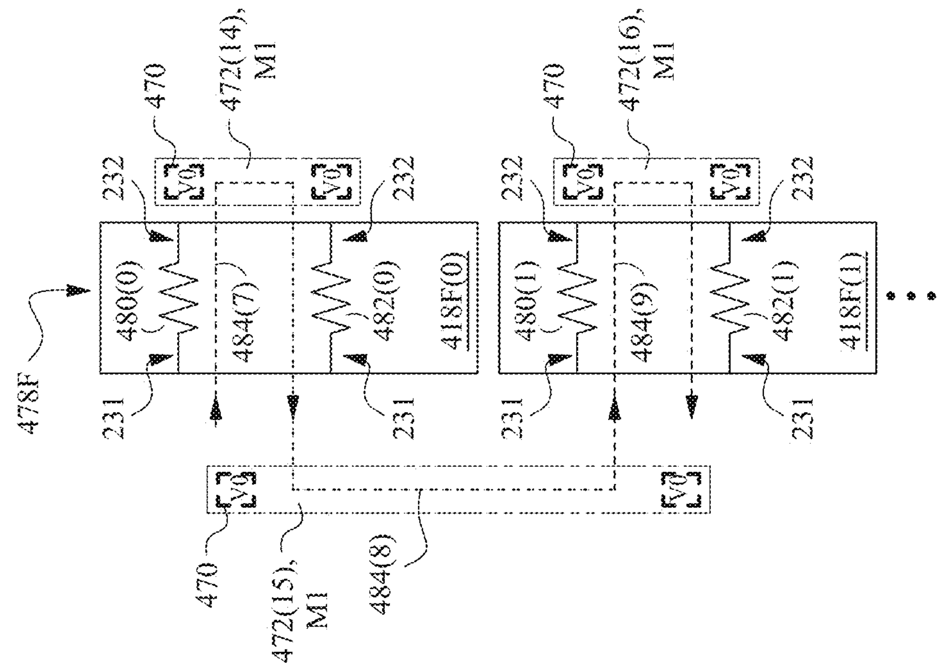
Figure 4E:
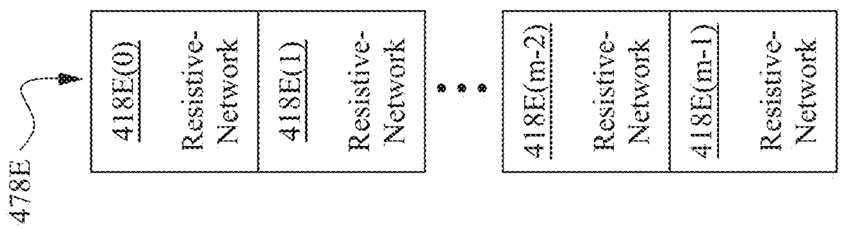

In FIG. 4E, abutment arrangement 478E includes resistive-network cell regions 418B(0)-418E(m−1) which abut each other relative to the Y-axis.

Relative to the Y-axis, FIG. 4E shows pairs of adjacent cell regions, e.g., 418E(1) and 418E(2), abutting vertically with substantially no space between. In some embodiments (not shown), depending upon design considerations, e.g., routing, or the like, not every pair of adjacent cell regions is vertically abutting, i.e. a significant space exists between one or more corresponding pairs of adjacent cell regions 418E(0)-418E(m−1).

Regarding FIG. 4F, abutment arrangement 478F shows cell regions 418F(0)-418F(1) but does not show cell regions 418F(2)-418F(m−1), the latter not being shown for simplicity of illustration.

Regarding cell region 418F(0), M1 conductor 472(14) and corresponding instances of V0 structure 470 comprise a second jumper that couples ladder-hook 480(0) in series with ladder-hook 482(0). Toe 232 of ladder-hook 480(0) of cell region 418F(0) is coupled by the second jumper to toe 232 of ladder-hook 482(0) of cell region 418F(0), as represented by a current path 484(7). In some embodiments, M1 conductor 474(14) is substantially within the boundaries of cell region 418F(0) such that cell region 418F(0) has an ESCI configuration. In some embodiments, current path 484(7) is described as having a serpentine shape.

Regarding cell region 418F(1), M1 conductor 472(16) and corresponding instances of V0 structure 470 comprise a third jumper that couples ladder-hook 480(1) in series with ladder-hook 482(1). Toe 232 of ladder-hook 480(1) of cell region 418F(1) is coupled by the third jumper to toe 232 of ladder-hook 482(1) of cell region 418F(1), as represented by a current path 484(9). In some embodiments, M1 conductor 474(16) is substantially within the boundaries of cell region 418F(1) such that cell region 418F(1) has an ESCI configuration. In some embodiments, current path 484(9) is described as having a serpentine shape.

In FIG. 4F, M1 conductor 472(13) and corresponding instances of V0 structure 470 comprise a fourth jumper that couples (1) series-coupled ladder-hooks 480(0) and 482(0) of cell region 418F(0) in series with (2) series-coupled ladder-hooks 480(1) and 482(1) of cell region 418F(1). Head 231 of ladder-hook 482(0) of cell region 418F(0) is coupled by the fourth jumper to head 231 of ladder-hook 480(1) of cell region 418F(1), as represented by a current path 484(8). In some embodiments, taken together, current paths 484(7)-484(9) are described as having a serpentine shape.

Regarding FIG. 4G, abutment arrangement 478G shows cell regions 418G(0)-418G(1) but does not show cell regions 418G(2)-418G(m−1), the latter not being shown for simplicity of illustration. In some embodiments, each of cell regions 418G(0)-418G(m−1) has an ESCI configuration.

In cell region 418G(0), ladder-hook 480(0) is coupled in series to ladder-hook 482(0) as indicated by current path 484(10). In cell region 418G(1), ladder-hook 480(1) is coupled in series to ladder-hook 482(1) as indicated by current path 484(12). In some embodiments, each of current paths 484(10) and 484(12) is described as having a serpentine shape.

In FIG. 4G, M1 conductor 472(17) and corresponding instances of V0 structure 470 comprise a fifth jumper that couples (1) series-coupled ladder-hooks 480(0) and 482(0) of cell region 418G(0) in series with (2) series-coupled ladder-hooks 480(1) and 482(1) of cell region 418G(1). Toe 232 of ladder-hook 482(0) of cell region 418G(0) is coupled by the fifth jumper to toe 232 of ladder-hook 480(1) of cell region 418G(1), as represented by a current path 484(11). In some embodiments, taken together, current paths 484(10)-484(11) are described as having a serpentine shape.

Figure 5:
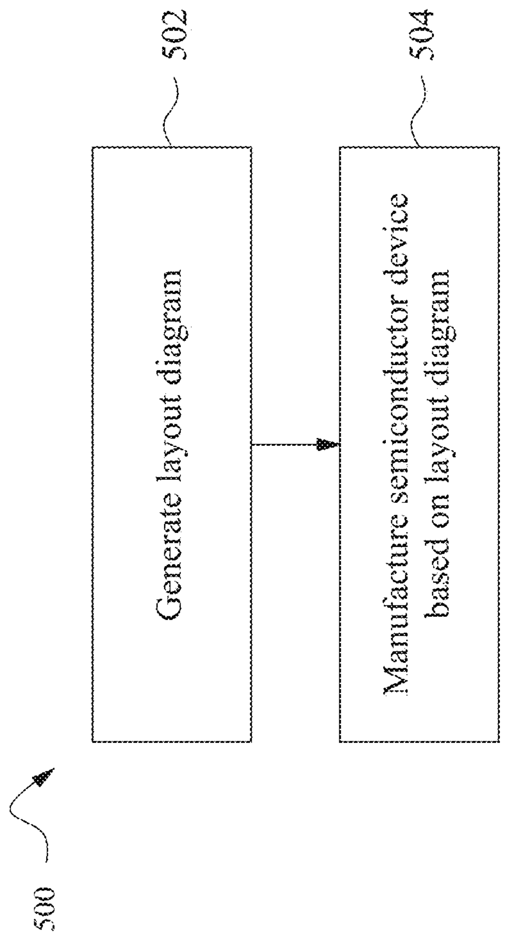
FIG. 5 is a flow diagram of a method of manufacturing a semiconductor device, in accordance with some embodiments.

FIG. 5 is a flow diagram 500 of a method of manufacturing a semiconductor device, in accordance with some embodiments.

The method of flowchart (flow diagram) 500 is implementable, for example, using EDA system 800 (FIG. 8, discussed below) and an IC manufacturing system 900 (FIG. 9, discussed below), in accordance with some embodiments. Examples of a semiconductor device which can be manufactured according to the method of flowchart 500 include the semiconductor devices of FIGS. 1A-1H, semiconductor devices based on the layout diagrams disclosed herein, semiconductor devices based on the cross-sections disclosed herein, or the like.

In FIG. 5, the method of flowchart 500 includes blocks 502-504. At block 502, a layout diagram is generated which, among other things, includes one or more of layout diagrams disclosed herein, or the like. Block 502 is implementable, for example, using EDA system 800 (FIG. 8, discussed below), in accordance with some embodiments. From block 502, flow proceeds to block 504.

At block 504, based on the layout diagram, at least one of (A) one or more photolithographic exposures are made or (b) one or more semiconductor masks are fabricated or (C) one or more components in a layer of a semiconductor device are fabricated. See discussion below of IC manufacturing system 900 in FIG. 9 below.

Figure 6A:
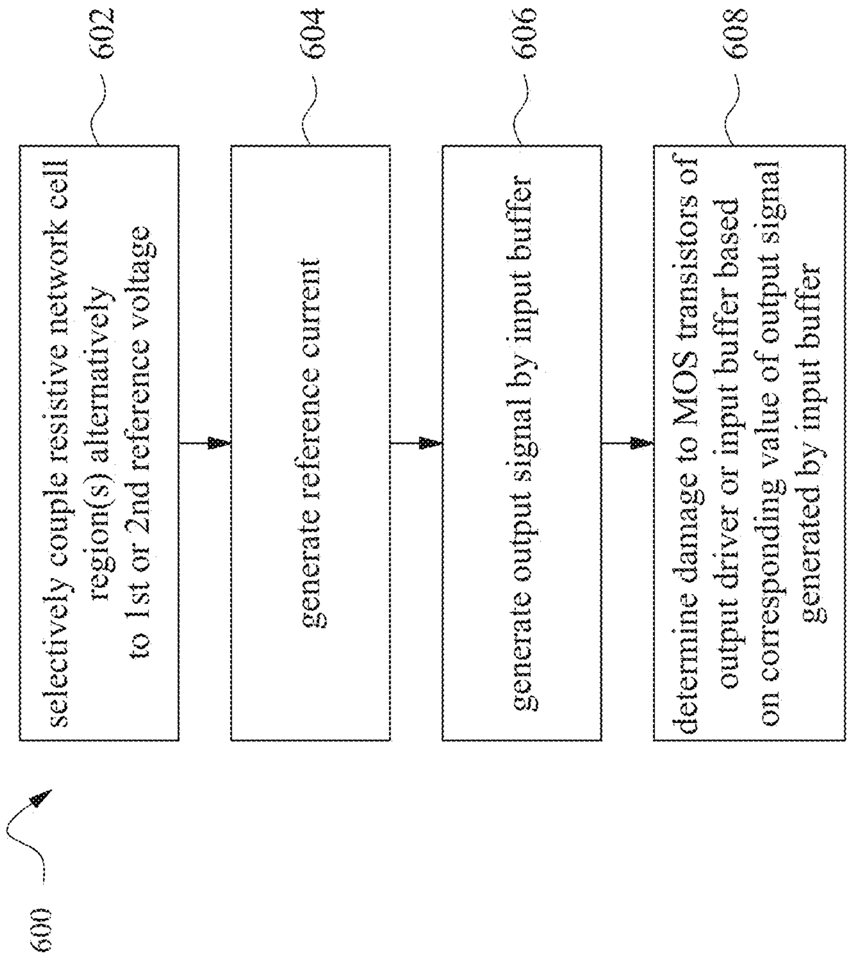
FIGS. 6A-6F are flow diagrams of a corresponding methods of operating a BIST, in accordance with some embodiments.

FIG. 6A is a flowchart 600 of a method of operating a BIST, in accordance with some embodiments.

Examples of BISTs operated according to flowchart 600 include the BISTs of FIGS. 1A-1H, or the like. Such BISTs include an input/output (I/O) circuit (e.g., 108) and one or more resistive-network cell regions (e.g., 118). The I/O circuit includes an output buffer (e.g., 110) and an input buffer (e.g., 112). An output of the output buffer is coupled at an I/O terminal (e.g., node nd103) to an input of the input buffer. The I/O terminal is configured to receive or provide an external I/O signal. One or more resistive-network cell regions (e.g., 118) are arranged to affect (discussed below, also FIGS. 1B-1H) a reference current I_ref that is received at the I/O terminal. Examples of the one or more instances of resistive-network cell region 118 include resistive-network cell regions 218B-218P of corresponding FIGS. 2B-2P, or the like. Example manners of coupling the one or more instances of resistive-network cell region 118 together include abutting arrangements 478A-478G of corresponding FIGS. 4A-4G, or the like.

Flowchart 600 includes blocks 602-608. At block 602, the one or more resistive-network cell regions (e.g., 118) are selectively coupled in an alternative manner to a first reference voltage (e.g., VDD as in FIG. 1C) or a second reference voltage (e.g., VSS as in FIG. 1D). Recalling that the one or more instances of resistive-network cell region 118 are coupled together to represent a resistor, the resistor is (A) coupled to VDD and not to VSS or (B) coupled to VSS and not to VDD.

At block 604, a reference current (e.g., I_ref in FIGS. 2B-2H) is generated. Recalling that the one or more instances of resistive-network cell region 118 are coupled together to represent a resistor, examples of generating the reference current include: coupling the resistor to node nd103 as, e.g., in FIGS. 1B-1D; coupling a current controller (e.g., 122) between the resistor and node nd103 as, e.g., in FIGS. 1E-1F; coupling the current controller between the resistor and node nd103 and additionally coupling a current booster (e.g., 126) to node nd103 as, e.g., in FIGS. 1G-1H. From block 604, flow proceeds to block 606.

At block 606, an output signal (e.g., CSI in FIGS. 2B-2H) is generated by the input buffer (e.g., input buffer 112 in FIGS. 1B-IE). Examples of the generation of CSI are discussed in the contexts, e.g., of FIGS. 1C-1D, or the like. From block 606, flow proceeds to block 608.

At block 608, damage to MOS transistors included in one or more of the output buffer (e.g., 110) or the input buffer (e.g., 112) is determined based on a corresponding value of an output signal (e.g., CSI) generated by the input buffer. Examples of a device which determines damage to MOS transistors (e.g., MOSFETs) include controller 120B of FIGS. 1B-1F, controller 120G of FIGS. 1G-1H, or the like. Examples of the determination of damage to MOS transistors are discussed in the contexts, e.g., of FIGS. 1C-1D, or the like.

Figure 6B:
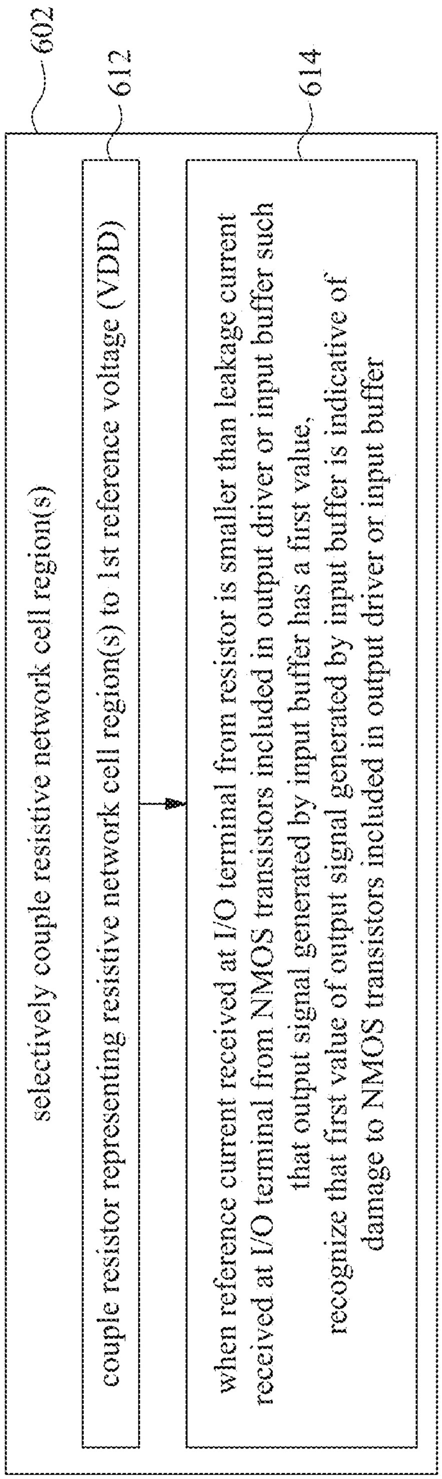
Figure 6C:
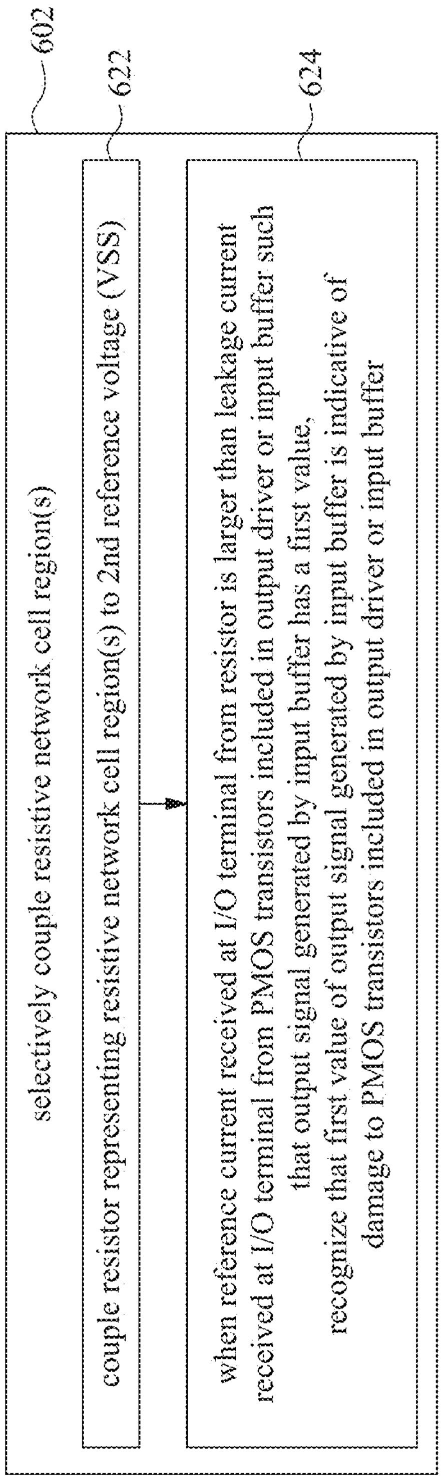

FIGS. 6B-6C are corresponding flowcharts showing block 602 in more detail, in accordance with some embodiments.

In FIG. 6B, the selective coupling of block 602 is shown as including blocks 612-614. At block 612, a resistor representing the one or more instances of the resistive-network cell region is coupled to the first reference voltage. An example of coupling the one or more instances of the resistive-network cell region (e.g., 118) to the first reference voltage (e.g., VDD) is shown in FIG. 1C, or the like. From block 612, flow proceed to block 614.

At block 614, damage to NMOS transistors is determined. More particularly, in block 614, in response to the reference current (e.g., I_ref) received at the I/O terminal (e.g., node nd103) from the resistor being smaller than a leakage current (e.g., I_NLk in FIG. 1C) such that the output signal (e.g., CSI) generated by the input buffer (e.g., 112) has a first predetermined value (e.g., CSI=0), the first predetermined value is indicative of damage to NMOS transistors included in the output driver or the input buffer. In the NMOS soft-failure testing phase of operation, where output signal CSI has the first predetermined value CSI=0, the leakage current (e.g., I_NLk) received at the I/O terminal is sourced at least in part from damaged NMOS transistors included in the output driver (e.g., 110) or the input buffer (e.g., 112) An example of determination as such is discussed in the context of FIG. 1C, or the like.

In FIG. 6C, the selective coupling of block 602 is shown as including blocks 622-624. At block 622, a resistor representing the one or more instances of the resistive-network cell region is coupled to the second reference voltage. An example of coupling the one or more instances of the resistive-network cell region (e.g., 118) to the second reference voltage (e.g., VSS) is shown in FIG. 1D, or the like. From block 622, flow proceed to block 624.

At block 624, damage to PMOS transistors is determined. More particularly, in block 624, in response to the reference current (e.g., I_ref) received at the I/O terminal (e.g., node nd103) from the resistor being smaller than a leakage current (e.g., I_PLk in FIG. 1D) such that the output signal (e.g., CSI) generated by the input buffer has a second predetermined value (e.g., CSI=1), the second predetermined value (e.g., CSI=1) is indicative of damage to PMOS transistors included in the output driver or the input buffer. In the PMOS soft-failure testing phase of operation, where output signal CSI has the second predetermined value CSI=1, the leakage current (e.g., I_NLk) received at the I/O terminal is sourced at least in part to damaged PMOS transistors included in the output driver (e.g., 110) or the input buffer (e.g., 112) An example of determination as such is discussed in the context of FIG. 1D, or the like.

Figure 6D:
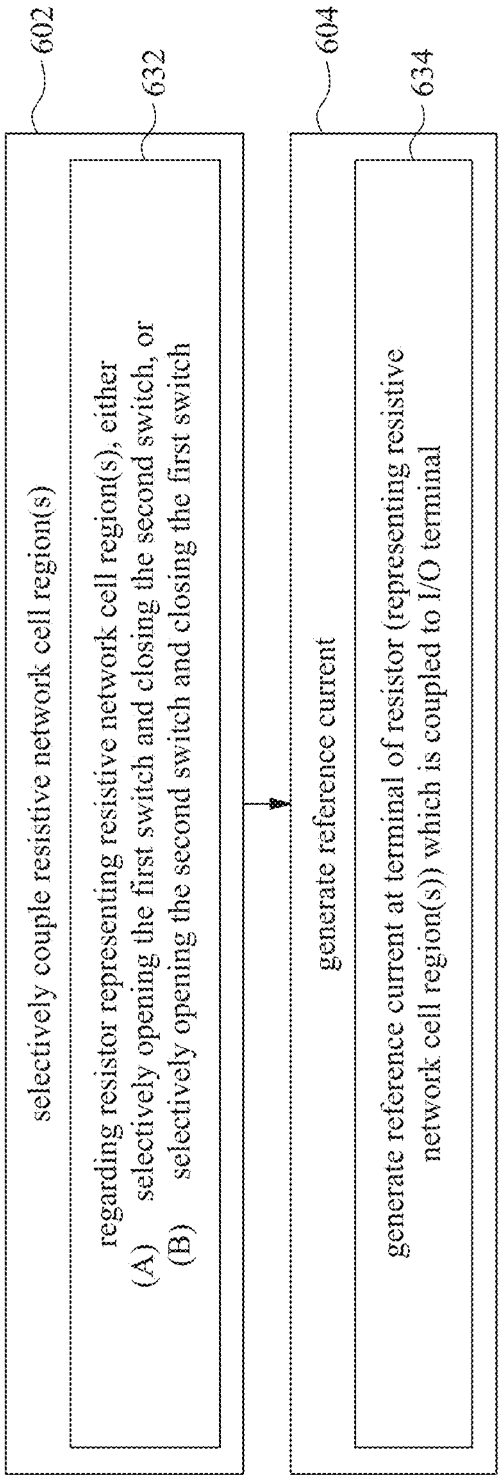

Regarding FIG. 6D, examples of BISTs operated according to the flowchart of FIG. 6D further include a first switch (e.g., sw101) and a second switch (e.g., sw103). The one or more resistive-network cell regions (e.g., 118) are coupled together to represent a resistor (e.g., Rref) having first and second terminals. The first terminal of resistor Rref is coupled to the I/O terminal (e.g., node nd103). The second terminal of resistor Rref is coupled to first terminals of each of switch sw101 and switch sw103. A second terminal of switch sw101 is coupled to the first reference voltage (e.g., VDD). A second terminal of switch sw103 is coupled to the second reference voltage (e.g., VSS).

In FIG. 6D, the selective coupling of block 602 is shown as including a block 632. At block 632, a resistor representing the one or more instances of the resistive-network cell region (e.g., Rref) is selectively coupled either (A) to the first reference voltage (e.g., VDD) by selectively closing the first switch (e.g., sw101) and opening the second switch (e.g., sw103); or (B) to the second reference voltage (e.g., VSS) by selectively opening switch sw101 and closing switch sw103. An example of coupling under circumstance (A) is shown in FIG. 1C, or the like. An example of coupling under circumstance (B) is shown in FIG. 1D, or the like. From block 632, flow exits block 602 and proceeds to block 604.

In FIG. 6D, the reference current generation of block 604 is shown as including a block 634. At block 634, a reference current (e.g., I_ref) is generated at the terminal of the resistor (e.g., Rref) which is coupled to the I/O terminal (e.g., node nd103). Under circumstance (A), reference current I_ref is generated at the first terminal of resistor Rref at least in part by coupling the second terminal of resistor Rref to VDD as shown, e.g., in FIG. 1C. Under circumstance (B), reference current I_ref is generated at the first terminal of resistor Rref at least in part by coupling the second terminal of resistor Rref to VSS as shown, e.g., in FIG. 1D.

Figure 6E:
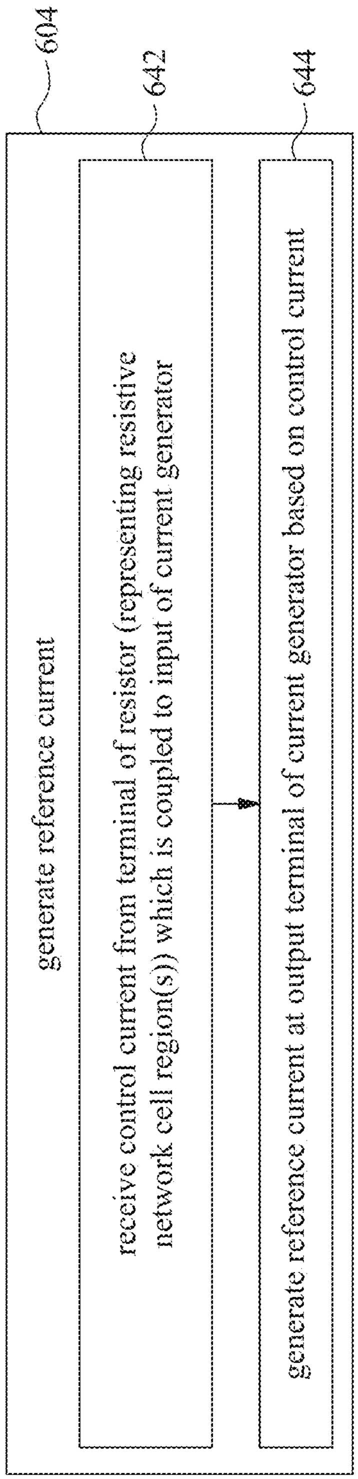

FIG. 6E is a flowchart showing block 604 in more detail, in accordance with some embodiments.

Regarding FIG. 6E, examples of BISTs operated according to the flowchart of FIG. 6E include the features of examples of BISTs discussed above in the context of FIG. 6D, and further include a current generator (e.g., current generator 122 of FIGS. 1E-1F). An output terminal of current generator 122 is coupled to the I/O terminal (e.g., node nd103). The terminal of the resistor (e.g., Rref) that otherwise is coupled to node nd103 (e.g., as in FIGS. 1E-1F) instead is coupled to an input terminal of current generator 122.

In FIG. 6E, the reference current generation of block 604 is shown as including blocks 642-644. At block 642, a control current (e.g., I_ctrl) is received at the input terminal of the current generator (e.g., 122) from the resistor (e.g., resistor Rref). Control current generation as such is shown, e.g., in FIGS. 1E-1F. From block 642, flow proceeds to block 644.

At block 644, the reference current (e.g., I_ref) is generated at the output terminal of the current generator (e.g., 122) based on control current (e.g., I_ctrl). Reference current generation as such is shown, e.g., in FIGS. 1E-1F.

Figure 6F:
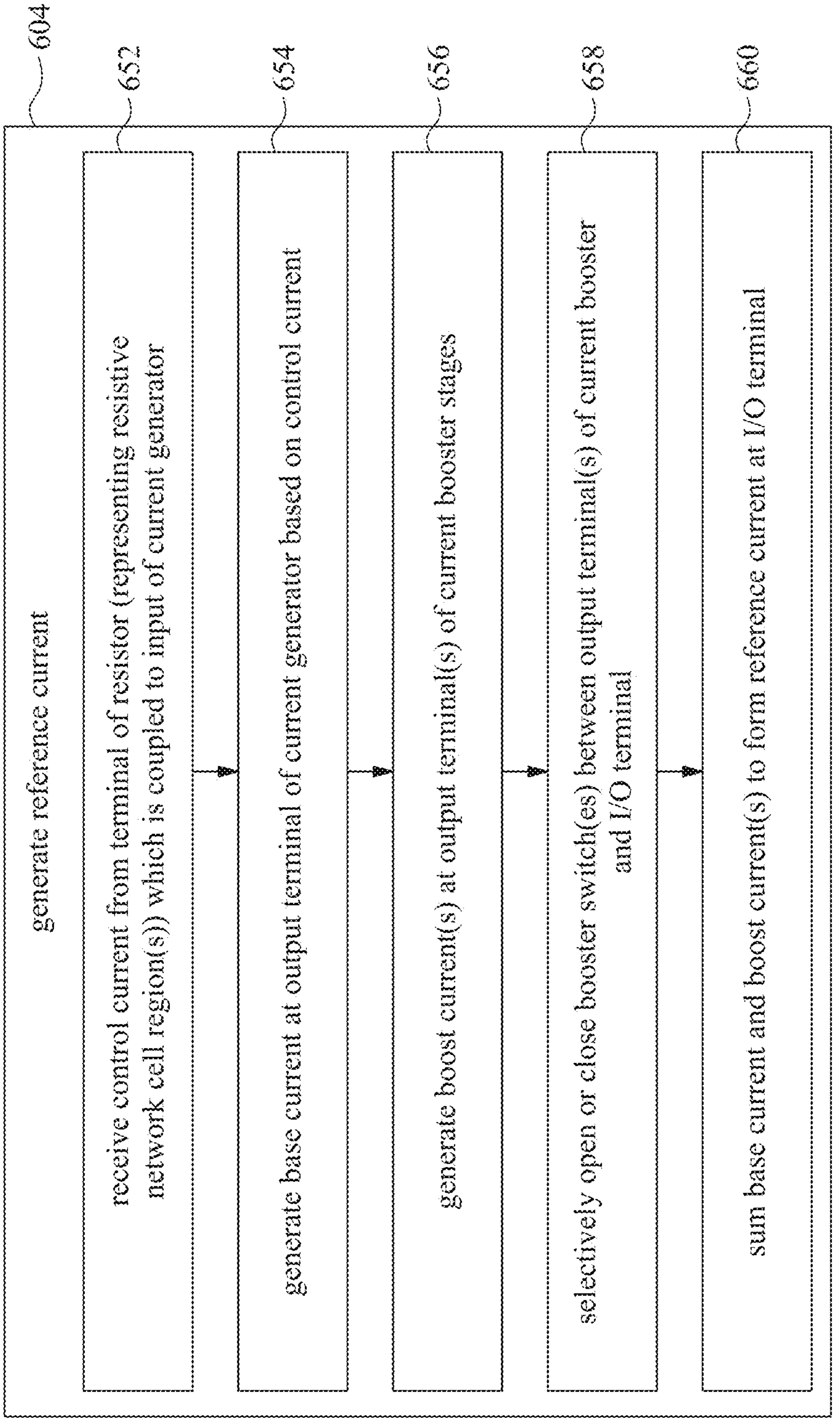

FIG. 6F is a flowchart showing block 604 in more detail, in accordance with some embodiments.

Regarding FIG. 6F, examples of BISTs operated according to the flowchart of FIG. 6F include the features of examples of BISTs discussed above in the context of FIG. 6E, and further include a current booster (e.g., current booster 126 of FIGS. 1G-1H) and a controller 120G instead of a controller 120B. An output terminal of current booster 126 is coupled to the I/O terminal (e.g., node nd103) so as to selectively boost the current at node nd103, i.e., reference current I_ref. Recalling that reference current I_ref at node nd103 is a sum of (1) the output current received from the current generator (e.g., 122) and (2) selectively coupled zero or more ones of the bias currents from current booster 126, the output current from current generator 122 is referred as a base current (e.g., I_base) in the context of FIGS. 1G-1H. As compared to controller 120, in terms of operations, controller 120G additionally generates boosting stage selection (BSS) signals (e.g., g2*y*, g5*y* and g10*y*) that are received by corresponding booster switches (e.g., sw105, sw107 and sw109) in current booster 126.

In FIG. 6F, the reference current generation of block 604 is shown as including blocks 652-660. At block 652, a control current (e.g., I_ctrl) is received at the input terminal of the current generator (e.g., 122) from the resistor (e.g., resistor Rref). Reference current generation as such is shown, e.g., in FIGS. 1E-1F. From block 652, flow proceeds to block 654.

At block 654, a base current (e.g., I_base) is generated at the output terminal of the current generator (e.g., 122) based on the control current (e.g., I_ctrl). Base current generation as such is shown, e.g., in FIGS. 1G-1H. From block 654, flow proceeds to block 656.

At block 656, boost currents (e.g., I_bst(0), I_bst(1), I_bst(2)) are generated at output terminals of corresponding boosting stages (e.g., 128(0), 128(1), and 128(2)) of the current booster (e.g., 126). Boost current generation as such is shown, e.g., in FIG. 1H. From block 656, flow proceeds to block 658.

At block 658, booster switches (e.g., sw105, sw107 and sw109) between the I/O terminal (e.g., node nd103) and the output terminals of corresponding boosting stages (e.g., 128(0), 128(1), and 128(2)) of the current booster (e.g., 126) are selectively opened or closed. Booster switch operation as such is discussed in the context, e.g., of FIG. 1H. From block 658, flow proceeds to block 660.

At block 660, (1) the base current (e.g., I_base) and (2) zero or more ones of the boost currents (e.g., I_bst(0), I_bst(1), I_bst(2)) coupled to the I/O terminal (e.g., node nd103) are summed on the I/O terminal (e.g., node nd103) to generate the reference current (e.g., I_ref). Currents summation as such is discussed in the context, e.g., of FIG. 1H.

Figure 7:
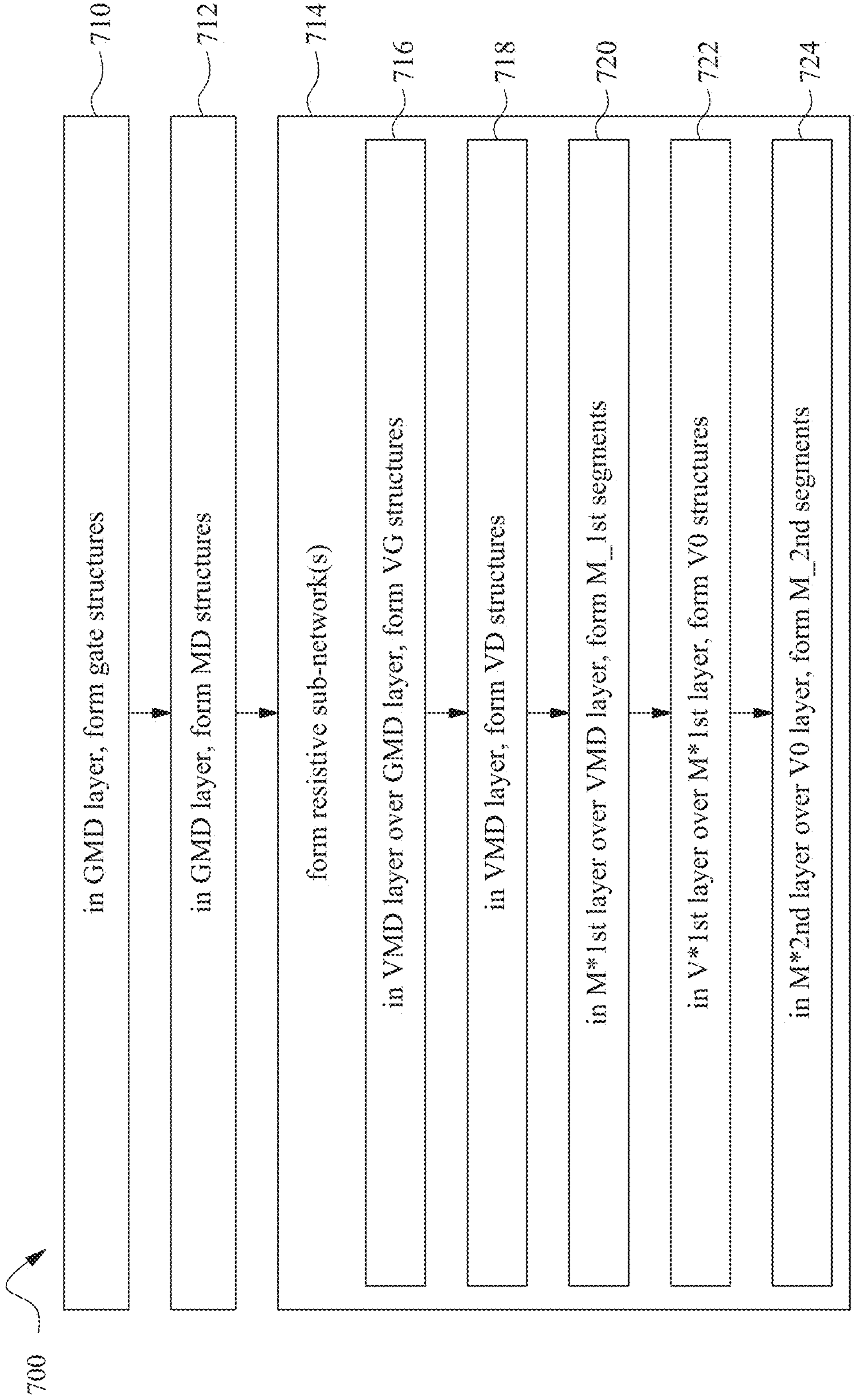
FIG. 7 is a flow diagram of a method of manufacturing a semiconductor device, in accordance with some embodiments.

FIG. 7 is a flowchart 700 of a method of fabricating a resistive-network cell region of a semiconductor device, in accordance with some embodiments.

Flowchart 700 includes blocks 710-722. The method of flowchart 700 is implementable, for example, using IC manufacturing system 900 (FIG. 9, discussed below), in accordance with some embodiments. Examples of a resistive-network cell region which can be manufactured according to the method of flowchart 700 include the semiconductor device of FIG. 1A, semiconductor devices which include the BISTs of FIGS. 1B-1H, semiconductor devices based on the layout diagrams disclosed herein, semiconductor devices based on the cross-sections disclosed herein, or the like.

In FIG. 7, at block 710, gate structures are formed in a GMD layer over corresponding one or more active regions (ARs), examples of the ARs include 256B & 258B of FIG. 2B, 256D & 258D of FIG. 2D, 356D FIGS. 3A-3B, or the like. An example of the GMD layer is GMD layer 375(2) in FIGS. 3A-3B, or the like. Examples of the gate structures includes gate structures 260(1)-260(3) of FIGS. 2B-2C, 260(4)-260(8) of FIGS. 2D-2L, 360(4) of FIGS. 3A-3B, or the like. From block 710, flow proceeds to block 712.

At block 712, metal-to-drain/source (MD) structures are formed in the GMD layer over the substrate and over corresponding S/D regions. As noted above, an example of the GMD layer is GMD layer 375(2) in FIGS. 3A-3B, or the like. Examples of the MD structures include MD structures 262(1)-262(3) of FIGS. 2B-2C, 262(4)-262(8) of FIGS. 2D-2L, 362(4)-364(5) of FIGS. 3A-3B, or the like. From block 712, flow proceeds to block 714.

At block 714, one or more resistive-sub-networks are formed. Examples of resistive-sub-networks include the resistive-sub-networks of FIGS. 2A-2R, 4A-4G, or the like. Block 714 includes blocks 716-724. Within block 714, flow proceeds to block 716.

At block 716, via-to-gate (VG) structures are formed in a VMD layer over corresponding gate structures. An example of the VMD layer is VGD layer 375(3) of FIGS. 3A-3B, or the like. Examples of the VG structure include the instances of VG structure 264 in FIGS. 2B-2L, 364 in FIG. 3A, or the like. From block 716, flow proceeds to block 718.

At block 718, via-to-MD (VD) structures are formed over corresponding MD structures. As noted above, an example of the VMD layer is VGD layer 375(3) of FIGS. 3A-3B, or the like. Examples of the VD structures include the instances of VD structure 266 in FIGS. 2B-2L, 366 in FIG. 3B, or the like. From block 718, flow proceeds to block 720.

At block 720, M*1st conductors are formed in a first layer of metallization (M*1st layer) and aligned to corresponding alpha tracks. At least some portions of the M*1st conductors are formed over corresponding instances of the VG structures. At least some portions of the M*1st conductors are formed over corresponding instances of the VD structures. An example of the M*1st layer is M0 layer 375(4) of FIGS. 3A-3B, or the like. Examples of the tracks include alpha tracks α1-α5 of FIGS. 2B-2L, or the like. Examples of the M*1st conductors include M0 conductors 268(*i*) in FIGS.

2B-2L, where is a variable and an integer, 368(12) in FIG. 3A, 368(4) in FIG. 3B, or the like. From block 720, flow proceeds to block 722.

In some embodiments, results of blocks 716-720 (of block 714) include a first MD-based resistive-sub-network and a first gate-based resistive-sub-network.

The first MD-based resistive-sub-network includes corresponding portions of the M0 conductors and of the MD structures which are coupled in series by corresponding ones of the VD structures. The first gate-based resistive-sub-network includes corresponding portions of the M0 conductors and of the gate structures which are coupled in series by corresponding ones of the VG structures.

An example of the first MD-based resistive-sub-network is MD-based ladder-hook 230(2) of FIGS. 2A-2B, or the like. An example of the first gate-based resistive-sub-network is gate-based ladder-hook 230(3) of FIGS. 2A-2B, or the like.

In some embodiments, results of blocks 716-720 (of block 714) include first and second MD-based resistive-sub-networks and first and second gate-based resistive-sub-networks.

Each of the first and second MD-based resistive-sub-network includes corresponding portions of the M0 conductors and of the MD structures which are coupled in series by corresponding ones of the VD structures. Each of the first and second gate-based resistive-sub-network includes corresponding portions of the M0 conductors and of the gate structures which are coupled in series by corresponding ones of the VG structures.

An example of the first MD-based resistive-sub-network is MD-based ladder-hook 230(2) of FIGS. 2C-2G and 2K-2L, 230(10) of FIG. 2H, 230(12) of FIGS. 2I-2J, or the like.

An example of the second MD-based resistive-sub-network is MD-based ladder-hook 230(4) of FIGS. 2C-2G and 2K-2L, 230(11) of FIG. 2H, 230(13) of FIGS. 2I-2J, or the like.

An example of the first gate-based resistive-sub-network is gate-based ladder-hook 230(3) of FIGS. 2C-2E, 230(6) of FIGS. 2F, 2I-2L, 230(8) of FIGS. 2G-2H, or the like.

An example of the second gate-based resistive-sub-network is gate-based ladder-hook 230(5) of FIGS. 2C-2E, 230(7) of FIGS. 2F, 2I, 2K-2L, 230(9) of FIGS. 2G-2H, 230(14) of FIG. 2J, or the like.

In FIG. 7, and within block 714, flow proceeds to block 722 from block 720. At block 722, via-to-M*1st (VIA*1st) structures are formed in a first layer of interconnection (VIA*1st layer) over corresponding M*1st conductors. An example of the VIA*1st layer is V0 layer 375(5) of FIGS. 3A-3B, or the like. Examples of the VIA*1st structures include the instances of V0 structure 270 in FIGS. 2K-2L, 370 in FIG. 3A, or the like. From block 722, flow proceeds to block 724.

At block 724, M*2nd conductors are formed in a second layer of metallization (M*2nd layer). At least some portions of the M*2nd conductors are formed over corresponding instances of the V0 structures. An example of the M*2nd layer is M1 layer 375(6) of FIGS. 3A-3B, or the like. Examples of the M*2nd conductors include M1 conductors 272(1)-272(2) in FIG. 2*k*, M1 conductor 272(3) in FIG. 2L, 372(1) in FIG. 3A, or the like.

In some embodiments, results of blocks 722-724 (of block 714) include a first resistive-sub-network being coupled in series by a first type of jumper to a second resistive-sub-network.

In some embodiments, the first type of jumper includes an M1 conductor and corresponding instances of the V0 structure. An example of such embodiments includes the jumper of FIG. 2L, which includes M1 conductor 272(3) and corresponding instances of V0 structure 272. In the context of FIG. 2L: the first resistive-sub-network is represented by a first sub-sub resistive-network (e.g., MD-based ladder-hook 230(2) coupled in series to a second sub-sub resistive-network (e.g., gate-based ladder-hook 230(4); and the second resistive-sub-network is represented by a third sub-sub resistive-network (e.g., MD-based ladder-hook 230(7) coupled in series to a fourth sub-sub resistive-network (e.g., gate-based ladder-hook 230(6).

In some embodiments, results of blocks 722-724 (of block 714) include a first resistive-sub-network being coupled in series by a second type of jumper to a second resistive-sub-network.

In some embodiments, the second type of jumper includes an M0 conductor, M1 conductors and corresponding instances of the V0 structure. An example of such embodiments includes the jumper of FIG. 2K, which includes M0 conductor 268(24), M1 conductors 272(1)-272(2) and corresponding instances of V0 structure 272. In the context of FIG. 2K: the first resistive-sub-network is represented by a first sub-sub resistive-network (e.g., MD-based ladder-hook 230(2) coupled in series to a second sub-sub resistive-network (e.g., gate-based ladder-hook 230(4); and the second resistive-sub-network is represented by a third sub-sub resistive-network (e.g., gate-based ladder-hook 230(6) coupled in series to a fourth sub-sub resistive-network (e.g., MD-based ladder-hook 230(7).

Figure 8:
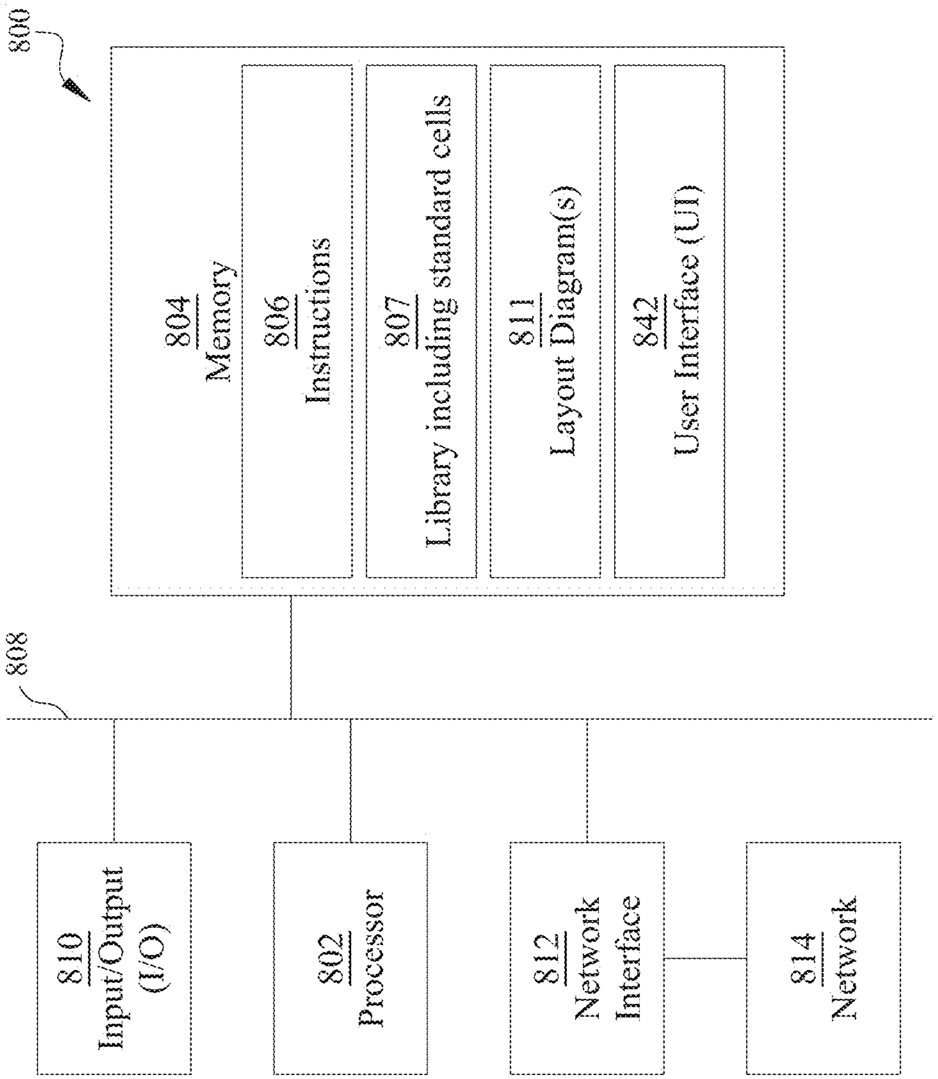
FIG. 8 is a block diagram of an electronic design automation (EDA) system in accordance with some embodiments.

FIG. 8 is a block diagram of an electronic design automation (EDA) system 800 in accordance with some embodiments.

In some embodiments, EDA system 800 includes an automatic placement and routing (APR) system. In some embodiments, EDA system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by processor 802 represents (at least in part) an EDA tool which implements a portion or all of, e.g., the method of FIG. 5 (block 502), methods of generating layout diagrams such as FIGS. 2B-2R, methods of generating layout diagrams corresponding to block diagrams such as FIGS. 1A-1H, or the like, in accordance with one or more embodiments (hereinafter, the noted processes and/or methods). Storage medium 804, amongst other things, stores layout diagrams 811 such as the layout diagrams disclosed herein, other the like.

Processor 802 is electrically coupled to computer-readable storage medium 804 via a bus 808. Processor 802 is further electrically coupled to an I/O interface 810 by a bus 808. A network interface 812 is further electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause system 800 (where such execution represents (at least in part) the EDA tool) to be usable for performing a portion or all of the noted processes and/or methods. In one or more embodiments, storage medium 804 further stores information which facilitates performing a portion or all of the noted processes and/or methods. In one or more embodiments, storage medium 804 stores library 807 of standard cells including such standard cells as disclosed herein. In some embodiments, storage medium 804 stores one or more layout diagrams 811.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 further includes network interface 812 coupled to processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 800.

System 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a user interface (UI) through I/O interface 810. The information is stored in computer-readable medium 804 as UI 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
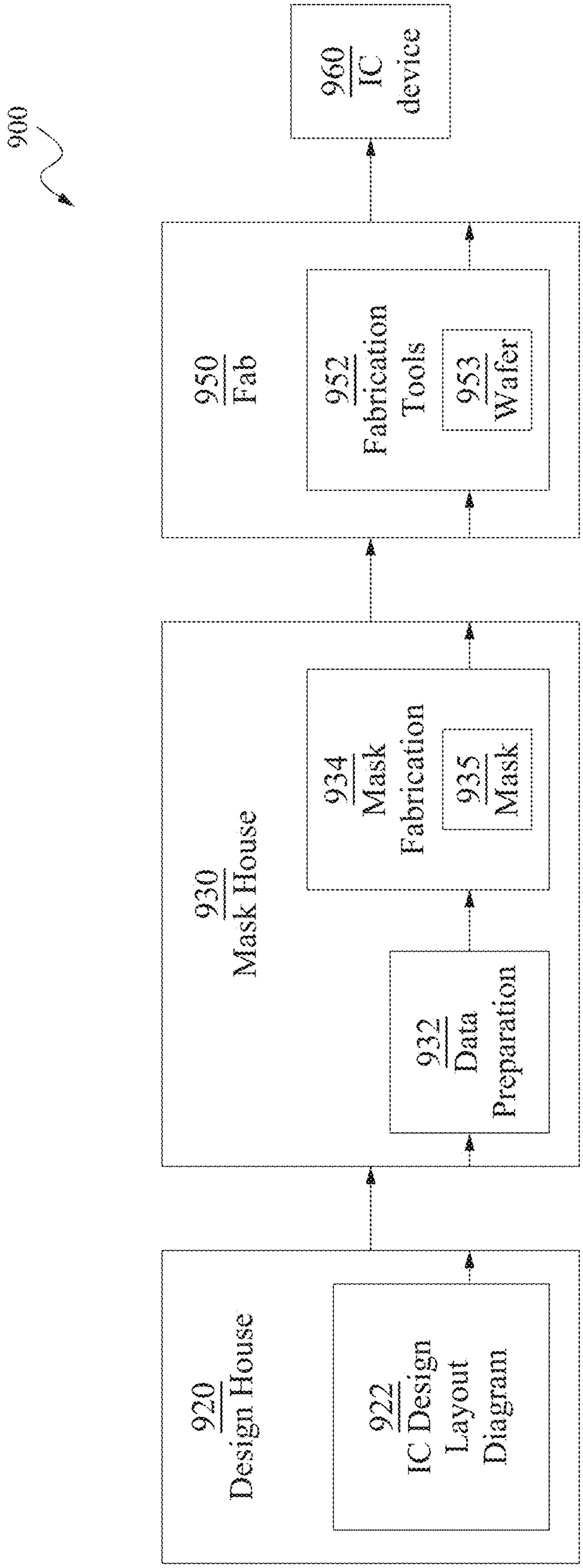
FIG. 9 is a block diagram of an integrated circuit (IC) manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with some embodiments.

Based on the layout diagram generated by block 502 of FIG. 5, the IC manufacturing system 900 implements block 504 of FIG. 5 wherein at least one of (A) one or more semiconductor masks or (B) at least one component in a layer of an inchoate semiconductor integrated circuit is fabricated using manufacturing system 900.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in manufacturing system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Source/drain region(s) may refer to a source or a drain, individually or collectively, dependent upon the context. Design house 920 implements a proper design procedure to form IC design layout 922. The design procedure includes one or more of logic design, physical design or place and route. IC design layout 922 is presented in one or more data files having information of the geometrical patterns. For example, IC design layout 922 is expressed in a GDSII file format or DFII file format.

Mask house 930 includes data preparation 932 and mask fabrication 934. Mask house 930 uses IC design layout 922 to manufacture one or more masks 935 to be used for fabricating the various layers of IC device 960 according to IC design layout 922. Mask house 930 performs mask data preparation 932, where IC design layout 922 is translated into a representative data file ("RDF"). Mask data preparation 932 supplies the RDF to mask fabrication 934. Mask fabrication 934 includes a mask writer. A mask writer converts the RDF to an image on a substrate, such as a mask (reticle) or a semiconductor wafer. The design layout is manipulated by mask data preparation 932 to comply with particular characteristics of the mask writer and/or requirements of IC fab 950. In FIG. 9, mask data preparation 932, mask fabrication 934, and mask 935 are illustrated as separate elements. In some embodiments, mask data preparation 932 and mask fabrication 934 are collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 932 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 934, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout 922 to fabricate a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 922.

The above description of mask data preparation 932 has been simplified for the purposes of clarity. In some embodiments, mask data preparation 932 includes additional features such as a logic operation (LOP) to modify the IC design layout according to manufacturing rules. Additionally, the processes applied to IC design layout 922 during data preparation 932 may be executed in a variety of different orders.

After mask data preparation 932 and during mask fabrication 934, a mask 935 or a group of masks 935 are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 950 is an IC fabrication business that includes one or more manufacturing facilities for the fabrication of a variety of different IC products. In some embodiments, IC fab 950 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 950 uses mask (or masks) 935 fabricated by mask house 930 to fabricate IC device 960 using fabrication tools 952. Thus, IC fab 950 at least indirectly uses IC design layout 922 to fabricate IC device 960. In some embodiments, a semiconductor wafer 953 is fabricated by IC fab 950 using mask (or masks) 935 to form IC device 960. Semiconductor wafer 953 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, a built-in self-tester (BIST) of a semiconductor device including: an input/output (I/O) circuit including an output buffer and an input buffer, an output of the output buffer being coupled at an I/O terminal to an input of the input buffer, the I/O terminal being configured to receive or provide an external I/O signal; one or more resistive-network cell regions arranged to affect a reference current received at the I/O terminal; and a switching arrangement configured to selectively couple the one or more resistive-network cell regions alternatively to a first reference voltage during a first phase or a second reference voltage during a second phase, the switching arrangement being further configured to determine electrostatic discharge (ESD) damage to metal-oxide-semiconductor (MOS) transistors included in the semiconductor device based on (1) phase and (2) an output signal of the input buffer.

In some embodiments, when the switching arrangement couples the one or more resistive-network cell regions to the first reference voltage, and further when a reference current received at the I/O terminal from the one or more resistive-network cell regions is smaller than a leakage current received at the I/O terminal from N-type metal-oxide-semiconductor (NMOS) transistors included in the semiconductor device, the input buffer is configured to generate a signal that is indicative of damage to the NMOS transistors included in the semiconductor device.

In some embodiments, when the switching arrangement couples the one or more resistive-network cell regions to the first reference voltage, and further when a reference current received at the I/O terminal from the one or more resistive-network cell regions is smaller than a leakage current received at the I/O terminal from N-type metal-oxide-semiconductor (NMOS) transistors included in the semiconductor device, the signal generated by the input buffer has a logical zero value.

In some embodiments, when the switching arrangement couples the one or more resistive-network cell regions to the second reference voltage, and further when a reference current received at the I/O terminal from the one or more resistive-network cell regions is larger than a leakage current received at the I/O terminal from P-type metal-oxide-semiconductor (PMOS) transistors included in the semiconductor device, the input buffer is configured to generate a signal that is indicative of damage to the PMOS transistors included in the semiconductor device.

In some embodiments, when the switching arrangement couples the one or more resistive-network cell regions to the second reference voltage, and further when a reference current received at the I/O terminal from the one or more resistive-network cell regions is larger than a leakage current received at the I/O terminal from P-type metal-oxide-semiconductor (PMOS) transistors included in the semiconductor device, the signal generated by the input buffer has a logical zero value.

In some embodiments, the BIST further includes first and second switches, and wherein: the one or more resistive-network cell regions are coupled together to represent a resistor having first and second terminals; the first terminal of the resistor is coupled to the I/O terminal; the second terminal of the resistor is coupled to first terminals of each of the first and second switches; a second terminal of the first switch is coupled to the first reference voltage; a second terminal of the second switch is coupled to the second reference voltage; and the switching arrangement is further configured to (A) selectively open the first switch and close the second switch or (B) selectively open the second switch and close the first switch.

In some embodiments, the BIST further includes first and second switches and a current generator configured to generate the reference current at an output terminal thereof, and wherein: the output terminal of the current generator is coupled to the I/O terminal; the one or more resistive-network cell regions are coupled together to represent a resistor having first and second terminals; the first terminal of the resistor is coupled to an input of the current generator; the input of the current generator is configured to receive a control current from the resistor; and the second terminal of the resistor is coupled to first terminals of each of the first and second switches; a second terminal of the first switch is coupled to the first reference voltage; a second terminal of the second switch is coupled to the second reference voltage; and the switching arrangement is further configured to (A) selectively open the first switch and close the second switch or (B) selectively open the second switch and close the first switch.

In some embodiments, the current generator includes: a beta multiplier circuit configured to receive the control current from the resistor; and a current mirror operatively coupled to the beta multiplier circuit and configured generate the reference current.

In some embodiments, the BIST further includes first and second switches, a current generator configured to generate a base current at an output terminal thereof, and a current booster configured to one or more boost currents correspondingly at one or more output terminals thereof, and wherein: each of the output terminal of the current generator and the one or more output terminals of the current booster is coupled to the I/O terminal; the base current and the one or more boost currents are summed at the I/O terminal to form the reference current; the one or more resistive-network cell regions are coupled together to represent a resistor having first and second terminals; the first terminal of the resistor is coupled to an input of the current generator; the input of the current generator is configured to receive a control current from the resistor; and the second terminal of the resistor is coupled to first terminals of each of the first and second switches; a second terminal of the first switch is coupled to the first reference voltage; a second terminal of the second switch is coupled to the second reference voltage; and the switching arrangement is further configured to (A) selectively open the first switch and close the second switch or (B) selectively open the second switch and close the first switch.

In some embodiments, the current booster includes one or more current boosting stages configured to generate the one or more boost currents correspondingly at one or more output terminals thereof, and one or more booster switches, and wherein: a first terminal of each of the one or more booster switches is coupled to the I/O terminal; the first terminals of the one or more booster switches correspondingly representing the one or more output terminals of the current booster; and second terminals of the one or more booster switches are coupled correspondingly to the output terminals of the one or more current boosting stages; and for each of the one or more booster switches, the switching arrangement is further configured to selectively open or close the booster switch and thereby control which of the one or more boost currents are coupled to the I/O terminal.

In some embodiments, the current generator includes: a beta multiplier circuit configured to receive the control current from the resistor; and a current mirror operatively coupled to the beta multiplier circuit and configured generate the base current.

In some embodiments, a method (of operating a built-in self-tester (BIST) of a semiconductor device) (the BIST including an input/output (I/O) circuit and one or more resistive-network cell regions, the I/O circuit including an output buffer and an input buffer, an output of the output buffer being coupled at an I/O terminal to an input of the input buffer, the I/O terminal being configured to receive or provide an external I/O signal, and one or more resistive-network cell regions arranged to affect a reference current received at the I/O terminal), the method including: selectively coupling the one or more resistive-network cell regions alternatively to a first reference voltage during a first phase or a second reference voltage during a second phase; and determining electrostatic discharge (ESD) damage to metal-oxide-semiconductor (MOS) transistors included in the semiconductor device based on (1) phase and (2) a corresponding value of an output signal generated by the input buffer.

In some embodiments, the selectively coupling includes coupling the one or more resistive-network cell regions to the first reference voltage; and the determining damage includes, when a reference current received at the I/O terminal from the one or more resistive-network cell regions is smaller than a leakage current received at the I/O terminal from N-type MOS (NMOS) transistors included in the semiconductor device such that the output signal generated by the input buffer has a predetermined value, determining that the predetermined value of the output signal generated by the input buffer is indicative of damage to the NMOS transistors included in the semiconductor device.

In some embodiments, when the reference current received at the I/O terminal from the one or more resistive-network cell regions is smaller than a leakage current received at the I/O terminal from N-type MOS (NMOS) transistors included in the semiconductor device, the predetermined value of the output signal generated the input buffer is a logical zero value.

In some embodiments, the selectively coupling includes coupling the one or more resistive-network cell regions to the second reference voltage; and the determining damage includes, when a reference current received at the I/O terminal from the one or more resistive-network cell regions is larger than a leakage current received at the I/O terminal from P-type MOS (PMOS) transistors included in the semiconductor device such that the output signal generated by the input buffer has a predetermined value, determining that the predetermined value of the output signal generated by the input buffer is indicative of damage to the PMOS transistors included in the semiconductor device.

In some embodiments, when the reference current received at the I/O terminal from the one or more resistive-network cell regions is smaller than a leakage current received at the I/O terminal from N-type MOS (NMOS) transistors included in the semiconductor device, the predetermined value of the output signal generated the input buffer is a logical zero value.

In some embodiments, the BIST further includes first and second switches; the one or more resistive-network cell regions are coupled together to represent a resistor having first and second terminals; the first terminal of the resistor is coupled to the I/O terminal; the second terminal of the resistor is coupled to first terminals of each of the first and second switches; a second terminal of the first switch is coupled to the first reference voltage; a second terminal of the second switch is coupled to the second reference voltage; the selectively coupling includes (A) selectively closing the first switch and opening the second switch, or (B) selectively opening the first switch and closing the second switch; and the method further includes generating the reference current at the second terminal of the resistor.

In some embodiments, the BIST further includes first and second switches and a current generator; an output terminal of the current generator is coupled to the I/O terminal; the one or more resistive-network cell regions are coupled together to represent a resistor having first and second terminals; the first terminal of the resistor is coupled to an input terminal of the current generator; the second terminal of the resistor is coupled to first terminals of each of the first and second switches; a second terminal of the first switch is coupled to the first reference voltage; a second terminal of the second switch is coupled to the second reference voltage; the selectively coupling includes (A) selectively opening the first switch and closing the second switch, or (B) selectively opening the second switch and closing the first switch; and the method further includes receiving a control current from the first terminal of the resistor at the input of the current generator, and generating the reference current at the output terminal of the current generator based on the control current.

In some embodiments, the BIST further includes first and second switches, a current generator and a current booster; the current generator is configured to generate a base current at an output terminal thereof; and a current booster is configured to one or more boost currents correspondingly at one or more output terminals thereof; each of the output terminal of the current generator and the one or more output terminals of the current booster is coupled to the I/O terminal; the one or more resistive-network cell regions are coupled together to represent a resistor having first and second terminals; the first terminal of the resistor is coupled to an input of the current generator; the second terminal of the resistor is coupled to first terminals of each of the first and second switches; a second terminal of the first switch is coupled to the first reference voltage; a second terminal of the second switch is coupled to the second reference voltage; the selectively coupling includes (A) selectively opening the first switch and closing the second switch, or (B) selectively opening the second switch and closing the first switch; and the method further includes: receiving a control current from the first terminal of the resistor at the input of the current generator; generating the base current at the output terminal of the current generator based on the control current; and summing the base current and the one or more boost currents at the I/O terminal to form the reference current.

In some embodiments, the current booster includes one or more current boosting stages configured to generate the one or more boost currents correspondingly at one or more output terminals thereof, and one or more booster switches, a first terminal of each of the one or more booster switches is coupled to the I/O terminal, the first terminals of the one or more booster switches correspondingly represent the one or more output terminals of the current booster; and second terminals of the one or more booster switches are coupled correspondingly to the output terminals of the one or more current boosting stages; and the method further includes, for each of the one or more booster switches, selectively opening or closing the booster switch thereby to control which of the one or more boost currents are coupled to the I/O terminal.

In some embodiments, a resistive-network cell region (of a semiconductor device) includes: in a GMD layer, alternating gate structures and metal-to-drain/source (MD) structures extending in a first direction; in a VGD layer over the GMD layer, via-to-gate (VG) structures and via-to-MD (VD) structures over corresponding ones of the gate structures and the MD structures, and relative to the first direction, the VG and VD structures being aligned correspondingly to alpha tracks that extend in a second direction perpendicular to the first direction; in a first layer of metallization (M*1st layer) over the VGD layer, M*1st conductors extending in the second direction, being aligned correspondingly to the alpha tracks, and being over corresponding ones of the VG and VD structures; and a resistive-network cell region including a first MD-based resistive-sub-network that includes corresponding portions of the M*1st conductors and of the MD structures which are coupled in series by corresponding ones of the VD structures, and a first gate-based resistive-sub-network that includes corresponding portions of the M*1st conductors and of the gate structures which are coupled in series by corresponding ones of the VG structures.

In some embodiments, relative to a top or bottom view along a third direction perpendicular to each of the first and second directions, the first MD-based resistive-sub-network is shaped as a ladder-hook (MD-based ladder-hook), and the first gate-based resistive-sub-network is shaped as a ladder-hook (gate-based ladder-hook).

In some embodiments, relative to the second direction, an orientation of the first gate-based ladder-hook is inverted with respect to an orientation of the first MD-based ladder-hook.

In some embodiments, relative to the second direction, the first MD-based ladder-hook has a same orientation as an orientation of the first gate-based ladder-hook.

In some embodiments, relative to the second direction, a distance between adjacent gate structures is one instance of a unit of measure referred to as a contacted poly pitch (CPP); and relative to the second direction, a width of the resistive-network cell region is 3 CPP.

In some embodiments, the resistive-network cell region includes three MD structures; and the first MD-based ladder-hook is free from being coupled to one of the three MD structures by one of the VD structures within resistive-network cell region.

In some embodiments, the resistive-network cell region includes three gate structures; and the first gate-based ladder-hook is free from being coupled to one of the three gate structures by one of the VG structures within resistive-network cell region.

In some embodiments, corresponding ones of the M*1st conductors for which portions thereof are included in the first MD-based ladder-hook are aligned to odd ones of the alpha tracks; and corresponding ones of the M*1st conductors for which portions thereof are included in the first gate-based ladder-hook are aligned to even ones of the alpha tracks.

In some embodiments, corresponding ones of the M*1st conductors for which portions thereof are included in the first MD-based ladder-hook are aligned to first and third ones of the alpha tracks; and corresponding ones of the M*1st conductors for which portions thereof are included in the first gate-based ladder-hook are aligned to second and fourth ones of the alpha tracks.

In some embodiments, regarding a first M*1st conductor for which a portion thereof is included in the first MD-based ladder-hook, the first M*1st conductor is aligned to a corresponding odd one of the alpha tracks; and regarding a second M*1st conductor for which a portion thereof is included in the first MD-based ladder-hook, the second M*1st conductor is aligned to a corresponding even one of the alpha tracks.

In some embodiments, regarding a first M*1st conductor for which a portion thereof is included in the first gate-based ladder-hook, the first M*1st conductor is aligned to a corresponding odd one of the alpha tracks; and regarding a second M*1st conductor for which a portion thereof is included in the first gate-based ladder-hook, the second M*1st conductor is aligned to a corresponding even one of the alpha tracks.

In some embodiments, relative to the first direction, a distance between adjacent alpha tracks is one instance of a unit of measure referred to as a track pitch (TP); and relative to the first direction, a height of the resistive-network cell region is 5 TP such that five alpha tracks are overlapped by the resistive-network cell region.

In some embodiments, for a selected one of the alpha tracks, each of the first MD-based ladder-hook and the first gate-based ladder-hook is free from including an M*1st conductor aligned to the selected alpha track.

In some embodiments, each of the first MD-based ladder-hook and the first gate-based ladder-hook includes a bucket portion and a tail portion; the bucket portion includes first and second sides and a bottom extending between first ends correspondingly of the first and second sides; the tail portion extends from a second end of the first side; the tail portion is represented by a corresponding portion of one of the M*1st conductors; regarding the first MD-based ladder-hook, the first and second sides are represented by corresponding portions of first and second ones of the MD structures; and regarding the first gate-based ladder-hook, the first and second sides are represented by corresponding portions of first and second ones of the gate structures.

In some embodiments, the first and second sides are parallel to each other; the bottom is perpendicular to the first and second sides; and the tail portion is perpendicular to the first side.

In some embodiments, the second side of the bucket portion of the first MD-based ladder-hook overlaps the bottom of the bucket portion of the first gate-based ladder-hook; and the first side of the bucket portion of the first gate-based ladder-hook overlaps the bottom of the bucket portion of the first MD-based ladder-hook.

In some embodiments, the resistive-network cell region further including: a second gate-based ladder-hook that includes corresponding portions of the M*1st conductors and of the gate structures which are coupled in series by corresponding ones of the VG structures; a second MD-based ladder-hook that includes corresponding portions of the M*1st conductors and the MD structures which are coupled in series by corresponding ones of the VD structures; and each of the ladder-hooks and has a head and a toe; the toe of the first MD-based ladder-hook is coupled to the head of the second gate-based ladder-hook by one of the VG structures within the resistive-network cell region; and the toe of the first gate-based ladder-hook is coupled to the head of the second MD-based ladder-hook by one of the VD structures within resistive-network cell region.

In some embodiments, the resistive-network cell region further includes: in a V*1st layer over the M*1st layer, via-to-M*1st (V*1st) structures; and in a second layer of metallization (M*2nd layer) over the VGD layer, M*2nd conductors extending in the first direction, and being over corresponding ones of the V*1st structures; and wherein: the toe of the second gate-based ladder-hook is coupled to the head of the first gate-based ladder-hook by an arrangement including first, second and third M*1st conductors and first and second M*2nd conductors; a first end of the first M*2nd conductor is over a first portion of the first M*1st conductor and coupled thereto by a corresponding one of the V*1st structures; a second portion of the first M*1st conductor is over a portion of a first gate structure at the head of the first gate-based ladder-hook and coupled thereto by a corresponding one of the VG structures; a second end of the first M*2nd conductor is over a first portion of the second M*1st conductor and coupled thereto by a corresponding one of the V*1st structures; a first end of the second M*2nd conductor is over a second portion of the second M*1st conductor and coupled thereto by a corresponding one of the V*1st structures; and a second end of the second M*2nd conductor is over a portion of the third M*1st conductor at the toe of the second gate-based ladder-hook and coupled thereto by a corresponding one of the V*1st structures.

In some embodiments, each of the ladder-hooks includes a bucket portion and a tail portion; the bucket portion includes first and second sides and a bottom extending between first ends correspondingly of the first and second sides; the tail portion extends from a second end of the first side; the tail portion is represented by a corresponding portion of one of the M*1st conductors; regarding the first and second MD-based ladder-hooks, the first and second sides are represented by corresponding portions of first and second ones of the MD structures; and regarding the first and second gate-based ladder-hook, the first and second sides are represented by corresponding portions of first and second ones of the gate structures.

In some embodiments, regarding the first MD-based ladder-hook, and further regarding first and second M*1st conductors for which corresponding portions thereof are included in the first MD-based ladder-hook, In some embodiments, the first M*1st conductor is aligned to a corresponding odd one of the alpha tracks, and In some embodiments, the second M*1st conductor is aligned to a corresponding odd one of the alpha tracks; regarding the first gate-based ladder-hook, and further regarding third and fourth M*1st conductors for which corresponding portions thereof are included in the first gate-based ladder-hook, the third M*1st conductor is aligned to a corresponding odd one of the alpha tracks, and the fourth M*1st conductor is aligned to a corresponding even one of the alpha tracks; at least of (A) or (B) is true; according to (A), regarding the second MD-based ladder-hook, and further regarding a fifth and sixth M*1st conductor for which corresponding portions thereof are included in the second MD-based ladder-hook, the fifth M*1st conductor is aligned to a corresponding odd one of the alpha tracks, and the sixth M*1st conductor is aligned to a corresponding even one of the alpha tracks; and, according to (B), regarding the second gate-based ladder-hook, and further regarding seventh and an eighth M*1st conductor for which corresponding portions thereof are included in the second gate-based ladder-hook, the seventh M*1st conductor is aligned to a corresponding odd one of the alpha tracks, and the eighth M*1st conductor is aligned to a corresponding odd one of the alpha tracks.

In some embodiments, regarding the first MD-based ladder-hook, and further regarding first and second M*1st conductors for which corresponding portions thereof are included in the first MD-based ladder-hook, the first M*1st conductor is aligned to a corresponding even one of the alpha tracks, and the second M*1st conductor is aligned to a corresponding odd one of the alpha tracks; regarding the first gate-based ladder-hook, and further regarding third and fourth M*1st conductors for which corresponding portions thereof are included in the first gate-based ladder-hook, the third M*1st conductor is aligned to a corresponding odd one of the alpha tracks, and the fourth M*1st conductor is aligned to a corresponding even one of the alpha tracks; at least of (A) or (B) is true; according to (A), regarding the second MD-based ladder-hook, and further regarding a fifth and sixth M*1st conductor for which corresponding portions thereof are included in the second MD-based ladder-hook, the fifth M*1st conductor is aligned to a corresponding odd one of the alpha tracks, and the sixth M*1st conductor is aligned to a corresponding even one of the alpha tracks; and, according to (B), regarding the second gate-based ladder-hook, and further regarding seventh and an eighth M*1st conductor for which corresponding portions thereof are included in the second gate-based ladder-hook, the seventh M*1st conductor is aligned to a corresponding even one of the alpha tracks, and the eighth M*1st conductor is aligned to a corresponding odd one of the alpha tracks.

In some embodiments, for a selected one of the alpha tracks, each of the first and second MD-based ladder-hooks and the first and second gate-based ladder-hooks is free from including an M*1st conductor aligned to the selected alpha track.

In some embodiments, regarding the first MD-based ladder-hook, and further regarding first and second M*1st conductors for which corresponding portions thereof are included in the first MD-based ladder-hook, the first M*1st conductor is aligned to a corresponding odd one of the alpha tracks, and the second M*1st conductor is aligned to a corresponding odd one of the alpha tracks; regarding the first gate-based ladder-hook, and further regarding third and fourth M*1st conductors for which corresponding portions thereof are included in the first gate-based ladder-hook, the third M*1st conductor is aligned to a corresponding even one of the alpha tracks, and the fourth M*1st conductor is aligned to a corresponding even one of the alpha tracks; at least of (A) or (B) is true; according to (A), regarding the second MD-based ladder-hook, and further regarding a fifth and sixth M*1st conductor for which corresponding portions thereof are included in the second MD-based ladder-hook, the fifth M*1st conductor is aligned to a corresponding even one of the alpha tracks, and the sixth M*1st conductor is aligned to a corresponding even one of the alpha tracks; and, according to (B), regarding the second gate-based ladder-hook, and further regarding seventh and an eighth M*1st conductor for which corresponding portions thereof are included in the second gate-based ladder-hook, the seventh M*1st conductor is aligned to a corresponding odd one of the alpha tracks, and the eighth M*1st conductor is aligned to a corresponding odd one of the alpha tracks.

In some embodiments, for a selected one of the alpha tracks, each of the first and second MD-based ladder-hooks and the first and second gate-based ladder-hooks is free from including an M*1st conductor aligned to the selected alpha track.

In some embodiments, regarding the first MD-based ladder-hook, and further regarding first and second M*1st conductors for which corresponding portions thereof are included in the first MD-based ladder-hook, the first M*1st conductor is aligned to a corresponding odd one of the alpha tracks, and the second M*1st conductor is aligned to a corresponding odd one of the alpha tracks; regarding the first gate-based ladder-hook, and further regarding third and fourth M*1st conductors for which corresponding portions thereof are included in the first gate-based ladder-hook, the third M*1st conductor is aligned to a corresponding even one of the alpha tracks, and the fourth M*1st conductor is aligned to a corresponding even one of the alpha tracks; regarding the second MD-based ladder-hook, and further regarding a fifth and sixth M*1st conductor for which corresponding portions thereof are included in the second MD-based ladder-hook, the fifth M*1st conductor is aligned to a corresponding even one of the alpha tracks, and the sixth M*1st conductor is aligned to a corresponding odd one of the alpha tracks; and regarding the second gate-based ladder-hook, and further regarding seventh and an eighth M*1st conductor for which corresponding portions thereof are included in the second gate-based ladder-hook, the seventh M*1st conductor is aligned to a corresponding odd one of the alpha tracks, and the eighth M*1st conductor is aligned to a corresponding odd one of the alpha tracks.

In some embodiments, for a selected one of the alpha tracks, three of the first and second MD-based ladder-hooks and the first and second gate-based ladder-hooks are free from including an M*1st conductor aligned to the selected alpha track.

In some embodiments, a method (of forming a resistive-network cell region of a semiconductor device) includes: in a GMD layer over corresponding one or more active regions, forming gate structures extending in a first direction; in the GMD layer, forming metal-to-drain/source (MD) structures extending in the first direction and alternating with the gate structures; forming one or more resistive-sub-networks including: in a VGD layer over the GMD layer, forming via-to-gate (VG) structures over corresponding ones of the gate structures; in the VGD layer over the GMD layer, forming via-to-MD (VD) structures over corresponding ones of the MD structures, and relative to the first direction, the VD and VG structures being aligned correspondingly to alpha tracks that extend in a second direction perpendicular to the first direction; and in a first layer of metallization (M*1st layer) over the VGD layer, forming M*1st conductors extending in the second direction, the M*1st being aligned correspondingly to the alpha tracks, and being over corresponding ones of the VD and VG structures; and the resistive-network cell region including: a first MD-based resistive-sub-network that includes corresponding portions of the M*1st conductors and of the MD structures which are coupled in series by corresponding ones of the VD structures; and a first gate-based resistive-sub-network that includes corresponding portions of the M*1st conductors and of the gate structures which are coupled in series by corresponding ones of the VG structures.

In some embodiments, the method further includes: in a V*1st layer over the M*1st layer, forming via-to-M*1st (V*1st) structures; and in a second layer of metallization (M*2nd layer) over the VGD layer, forming M*2nd conductors extending in the first direction, and being over corresponding ones of the V*1st structures; and wherein: the resistive-network cell region further includes: a second gate-based ladder-hook that includes corresponding portions of the M*1st conductors and of the gate structures which are coupled in series by corresponding ones of the VG structures; a second MD-based ladder-hook that includes corresponding portions of the M*1st conductors and the MD structures which are coupled in series by corresponding ones of the VD structures; and each of the ladder-hooks and has first and second ends; the toe of the first MD-based ladder-hook is coupled to the head of the second gate-based ladder-hook by one of the VG structures within the resistive-network cell region; the toe of the first gate-based ladder-hook is coupled to the head of the second MD-based ladder-hook by one of the VD structures within resistive-network cell region; the toe of the second gate-based ladder-hook is coupled to the head of the first gate-based ladder-hook by an arrangement including first, second and third M*1st conductors and first and second M*2nd conductors; a first end of the first M*2nd conductor is over a first portion of the first M*1st conductor and coupled thereto by a corresponding one of the V*1st structures; a second portion of the first M*1st conductor is over a portion of a first gate structure at the head of the first gate-based ladder-hook and coupled thereto by a corresponding one of the VG structures; a second end of the first M*2nd conductor is over a first portion of the second M*1st conductor and coupled thereto by a corresponding one of the V*1st structures; a first end of the second M*2nd conductor is over a second portion of the second M*1st conductor and coupled thereto by a corresponding one of the V*1st structures; and a second end of the second M*2nd conductor is over a portion of the third M*1st conductor at the toe of the second gate-based ladder-hook and coupled thereto by a corresponding one of the V*1st structures.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A built-in self-tester (BIST) of a semiconductor device comprising:
- an input/output (I/O) circuit including an output buffer and an input buffer, an output of the output buffer being coupled at a I/O terminal to an input of the input buffer, the I/O terminal being configured to receive or provide an external I/O signal;
- one or more resistive-network cell regions arranged to affect a reference current received at the I/O terminal; and
- a switching arrangement configured to selectively couple the one or more resistive-network cell regions alternatively to a first reference voltage during a first phase or a second reference voltage during a second phase, and to determine electrostatic discharge (ESD) damage to N-type metal-oxide-semiconductor (MOS) transistors (NMOS transistors) or P-type MOS (PMOS) transistors included in one or more of the output buffer or the input buffer based on the first or second phase, such that:
  - when the switching arrangement couples the one or more resistive-network cell regions to the first reference voltage or the second reference voltage, and
    - further when the reference current exhibits a predetermined relationship to a leakage current received at the I/O terminal from the NMOS transistors or the PMOS transistors,
    - the input buffer is configured to generate a first signal that is indicative of damage to the NMOS transistors or the PMOS transistors.

2. The BIST of claim 1, wherein:
- when the switching arrangement couples the one or more resistive-network cell regions to the first reference voltage, and
  - further when the reference current is smaller than the leakage current received at the I/O terminal from the NMOS transistors,
    - the input buffer is configured to generate the first signal to be indicative of damage to the NMOS transistors.

3. The BIST of claim 2, wherein:
- when the switching arrangement couples the one or more resistive-network cell regions to the first reference voltage, and
  - further when the reference current is smaller than a leakage current received at the I/O terminal from the NMOS transistors,
    - the first signal has a logical zero value.

4. The BIST of claim 1, wherein:
- when the switching arrangement couples the one or more resistive-network cell regions to the second reference voltage, and
  - further when the reference current is larger than the leakage current received at the I/O terminal from the PMOS transistors,
    - the input buffer is configured to generate the first signal to be indicative of damage to the PMOS transistors.

5. The BIST of claim 4, wherein:
- when the switching arrangement couples the one or more resistive-network cell regions to the second reference voltage, and
  - further when the reference current is larger than a leakage current received at the I/O terminal from the NMOS transistors,
    - the first signal has a logical zero value.

6. The BIST of claim 1, further comprising:
first and second switches; and
a current generator configured to generate the reference current at an output terminal thereof; and
wherein:
the output terminal of the current generator is coupled to the I/O terminal;
the one or more resistive-network cell regions are coupled together to represent a resistor having first and second terminals;
the first terminal of the resistor is coupled to an input terminal of the current generator;
the input terminal of the current generator is configured to receive a control current from the resistor; and
the second terminal of the resistor is coupled to first terminals of each of the first and second switches;
a second terminal of the first switch is coupled to the first reference voltage;
a second terminal of the second switch is coupled to the second reference voltage; and
the switching arrangement is further configured to (A) selectively open the first switch and close the second switch or (B) selectively open the second switch and close the first switch.

7. The BIST of claim 6, wherein the current generator includes:
a beta multiplier circuit configured to receive the control current from the resistor; and
a current mirror operatively coupled to the beta multiplier circuit and configured generate the reference current.

8. The BIST of claim 1, further comprising:
first and second switches;
a current generator configured to generate a base current at an output terminal thereof; and
a current booster configured to one or more boost currents correspondingly at one or more output terminals thereof; and
wherein:
each of the output terminal of the current generator and the one or more output terminals of the current booster is coupled to the I/O terminal;
the base current and the one or more boost currents are summed at the I/O terminal to form the reference current;
the one or more resistive-network cell regions are coupled together to represent a resistor having first and second terminals;
the first terminal of the resistor is coupled to an input terminal of the current generator;
the input terminal of the current generator is configured to receive a control current from the resistor; and
the second terminal of the resistor is coupled to first terminals of each of the first and second switches;
a second terminal of the first switch is coupled to the first reference voltage;
a second terminal of the second switch is coupled to the second reference voltage; and
the switching arrangement is further configured to (A) selectively open the first switch and close the second switch or (B) selectively open the second switch and close the first switch.

9. The BIST of claim 8, wherein the current generator includes:
a beta multiplier circuit configured to receive the control current from the resistor; and
a current mirror operatively coupled to the beta multiplier circuit and configured generate the base current.

10. A method of operating a built-in self-tester (BIST) of a semiconductor device,
the BIST including an input/output (I/O) circuit and one or more resistive-network cell regions,
the I/O circuit including an output buffer and an input buffer, an output of the output buffer being coupled at a I/O terminal to an input of the input buffer, the I/O terminal being configured to receive or provide an external I/O signal, and
the one or more resistive-network cell regions being arranged to affect a reference current received at the I/O terminal, and
the method comprising:
selectively coupling the one or more resistive-network cell regions alternatively to a first reference voltage during a first phase or a second reference voltage during a second phase; and
determining electrostatic discharge (ESD) damage to N-type metal-oxide-semiconductor (MOS) transistors (NMOS transistors) or P-type MOS (PMOS) transistors included in the one or more of the output buffer or the input buffer based on the first or second phase, the determining ESD damage including:
when the one or more resistive-network cell regions is selectively coupled to the first reference voltage or the second reference voltage, and
further when the reference current exhibits a predetermined relationship to a leakage current received at the I/O terminal from the NMOS transistors or the PMOS transistors,
generating, from the input buffer, a first signal that is indicative of damage to the NMOS transistors or the PMOS transistors.

11. The method of claim 10, wherein:
the selectively coupling includes:
coupling the one or more resistive-network cell regions to the first reference voltage; and
the determining ESD damage further includes:
when the reference current is smaller than the leakage current received at the I/O terminal from the NMOS transistors such that the first signal from the input buffer has a predetermined value,
recognizing that the predetermined value of the first signal from the input buffer is indicative of damage to the NMOS transistors.

12. The method of claim 11, wherein:
when the reference current is smaller than a leakage current received at the I/O terminal from the NMOS transistors,
the predetermined value of the first signal is a logical zero value.

13. The method of claim 10, wherein:
the selectively coupling includes:
coupling the one or more resistive-network cell regions to the second reference voltage; and
the determining ESD damage further includes:
when the reference current is larger than the leakage current received at the I/O terminal from the PMOS transistors such that the first signal from the input buffer has a predetermined value,
recognizing that the predetermined value of the first signal from the input buffer is indicative of damage to the PMOS transistors.

14. The method of claim 13, wherein:
when the reference current is smaller than a leakage current received at the I/O terminal from the NMOS transistors,
the predetermined value of the first signal is a logical zero value.

15. The method of claim 10, wherein:
the BIST further includes first and second switches and a current generator;
an output terminal of the current generator is coupled to the I/O terminal;
the one or more resistive-network cell regions are coupled together to represent a resistor having first and second terminals;
the first terminal of the resistor is coupled to an input terminal of the current generator;
the second terminal of the resistor is coupled to first terminals of each of the first and second switches;
a second terminal of the first switch is coupled to the first reference voltage;
a second terminal of the second switch is coupled to the second reference voltage;
the selectively coupling includes:
(A) selectively opening the first switch and closing the second switch; or
(B) selectively opening the second switch and closing the first switch; and
the method further comprises:
receiving a control current from the first terminal of the resistor at the input terminal of the current generator; and
generating the reference current at the output terminal of the current generator based on the control current.

16. The method of claim 10, wherein:
the BIST further includes first and second switches, a current generator and a current booster;
the current generator is configured to generate a base current at an output terminal thereof; and
the current booster is configured to one or more boost currents correspondingly at one or more output terminals thereof; and
each of the output terminal of the current generator and the one or more output terminals of the current booster is coupled to the I/O terminal;
the one or more resistive-network cell regions are coupled together to represent a resistor having first and second terminals;
the first terminal of the resistor is coupled to an input terminal of the current generator;
the second terminal of the resistor is coupled to first terminals of each of the first and second switches;
a second terminal of the first switch is coupled to the first reference voltage;
a second terminal of the second switch is coupled to the second reference voltage;
the selectively coupling includes:
(A) selectively opening the first switch and closing the second switch; or
(B) selectively opening the second switch and closing the first switch; and
the method further comprises:
receiving a control current from the first terminal of the resistor at the input terminal of the current generator;
generating the base current at the output terminal of the current generator based on the control current; and
summing the base current and the one or more boost currents at the I/O terminal to form the reference current.

17. The method of claim 10, wherein:
the BIST further includes first and second switches;
the one or more resistive-network cell regions are coupled together to represent a resistor having first and second terminals;
the first terminal of the resistor is coupled to the I/O terminal;
the second terminal of the resistor is coupled to first terminals of each of the first and second switches;
a second terminal of the first switch is coupled to the first reference voltage;
a second terminal of the second switch is coupled to the second reference voltage;
the selectively coupling includes:
(A) selectively closing the first switch and opening the second switch; or
(B) selectively opening the first switch and closing the second switch; and
the method further comprises:
generating the reference current at the second terminal of the resistor.

18. A built-in self-tester (BIST) of a semiconductor device comprising:
an input/output (I/O) circuit including an output buffer and an input buffer, an output of the output buffer being coupled at a I/O terminal to an input of the input buffer, the I/O terminal being configured to receive or provide an external I/O signal;
one or more resistive-network cell regions coupled together to represent a resistor having first and second terminals, the first terminal being coupled to the I/O terminal, and resistor being arranged to affect a reference current received at the I/O terminal;
a switching arrangement configured to selectively couple the one or more resistive-network cell regions alternatively to a first reference voltage during a first phase or a second reference voltage during a second phase,
the switching arrangement being further configured to determine electrostatic discharge (ESD) damage to metal-oxide-semiconductor (MOS) transistors included in the semiconductor device based on (1) the first or second phase, and
first and second switches; and
wherein:
the second terminal of the resistor is coupled to first terminals of each of the first and second switches;
a second terminal of the first switch is coupled to the first reference voltage;
a second terminal of the second switch is coupled to the second reference voltage; and
the switching arrangement is further configured to (A) selectively open the first switch and close the second switch or (B) selectively open the second switch and close the first switch.

19. The BIST of claim 18, wherein:
when the switching arrangement couples the one or more resistive-network cell regions to the first reference voltage, and
further when the reference current is smaller than a leakage current received at the I/O terminal from N-type MOS (NMOS) transistors included in one or more of the output buffer or the input buffer,
the input buffer is configured to generate a first signal that is indicative of damage to the NMOS transistors included in the semiconductor device.

20. The BIST of claim 18, wherein:
when the switching arrangement couples the one or more resistive-network cell regions to the second reference voltage, and
further when a reference current is larger than a leakage current received at the I/O terminal from P-type MOS (PMOS) transistors included in one or more of the output buffer or the input buffer, the input buffer is configured to generate a first signal that is indicative of damage to the PMOS transistors included in the semiconductor device.

* * * * *